United States Patent
Nomura et al.

(10) Patent No.: US 8,637,860 B2
(45) Date of Patent: Jan. 28, 2014

(54) PHOTOELECTRIC CONVERSION DEVICE, PRODUCTION METHOD THEREOF, PHOTOSENSOR, IMAGING DEVICE AND THEIR DRIVE METHODS

(71) Applicant: FUJIFILM Corporation, Tokyo (JP)

(72) Inventors: Kimiatsu Nomura, Kanagawa (JP); Eiji Fukuzaki, Kanagawa (JP); Tetsuro Mitsui, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/733,256

(22) Filed: Jan. 3, 2013

(65) Prior Publication Data

US 2013/0122276 A1    May 16, 2013

Related U.S. Application Data

(62) Division of application No. 12/877,252, filed on Sep. 8, 2010, now Pat. No. 8,378,339.

(30) Foreign Application Priority Data

Sep. 11, 2009  (JP) .................................. 2009-211138
Mar. 31, 2010  (JP) ................................. 2010-084412

(51) Int. Cl.
*H01L 29/08* (2006.01)
*C07D 209/82* (2006.01)

(52) U.S. Cl.
USPC  257/40; 257/444; 257/E51.026; 257/E51.039; 548/439

(58) Field of Classification Search
USPC .................... 257/40, 444, E51.026, E51.039; 548/439
See application file for complete search history.

(56) References Cited

U.S. PATENT DOCUMENTS

| | | |
|---|---|---|
| 6,649,772 B2 | 11/2003 | Lin et al. |
| 6,689,491 B1 | 2/2004 | Nii et al. |
| 2005/0221124 A1 | 10/2005 | Hwang et al. |
| 2008/0035965 A1 | 2/2008 | Hayashi et al. |
| 2010/0066241 A1 | 3/2010 | Cho et al. |

FOREIGN PATENT DOCUMENTS

| | | |
|---|---|---|
| JP | 3508984 B2 | 3/2004 |
| JP | 2005-239703 A | 9/2005 |
| JP | 2005-290000 A | 10/2005 |
| JP | 2006-056841 A | 3/2006 |
| JP | 2006-131783 A | 5/2006 |
| JP | 2007-115665 A | 5/2007 |
| JP | 2007-123707 A | 5/2007 |
| JP | 2007-137795 A | 6/2007 |
| JP | 2007-169268 A | 7/2007 |
| JP | 2007-180147 A | 7/2007 |
| JP | 2007-308474 A | 11/2007 |
| JP | 2007-314509 A | 12/2007 |
| JP | 2008-72090 A | 3/2008 |

(Continued)

OTHER PUBLICATIONS

Office Action dated Feb. 26, 2013 in Japanese Patent Application No. 2011-068257.

(Continued)

*Primary Examiner* — Minh-Loan T Tran
(74) *Attorney, Agent, or Firm* — Sughrue Mion, PLLC

(57) ABSTRACT

A photoelectric conversion device comprising a transparent electrically conductive film, a photoelectric conversion film and an electrically conductive film in this order, wherein the photoelectric conversion film comprises a photoelectric conversion layer, and an electron blocking layer, wherein the electron blocking layer contains a compound represented by the specific formula.

8 Claims, 2 Drawing Sheets

(56) References Cited

FOREIGN PATENT DOCUMENTS

| | | |
|---|---|---|
| JP | 2008-112984 A | 5/2008 |
| JP | 2010-13444 A | 1/2010 |
| JP | 2010-37312 A | 2/2010 |
| WO | 2004-066685 A1 | 8/2004 |
| WO | 2007/017475 A1 | 2/2007 |
| WO | 2007-077810 A1 | 7/2007 |
| WO | 2008-035571 A1 | 3/2008 |
| WO | 2008-090912 A1 | 7/2008 |

OTHER PUBLICATIONS

Office Action dated Feb. 26, 2013 in Japanese Patent Application No. 2011-068258.

Keiji Noine et al, "Bifluorene compounds containing carbazole and /or diphenylamine groups and their bipolar charge transport properties in organic light emitting devices", Organic Electronics, vol. 11, 2010, pp. 717-723.

European Search Report dated Dec. 6, 2010 in European Application No. 10175753.2.

Q. Zhang, "Blue light-emitting materials based on terfluorenes with carbazole terminal units", Synthetic Metals, vol. 152, 2005, pp. 229-232, XP002606200.

C. McNeill, "Near-Field Scanning Photocurrent Measurements of Polyfluorene Blend Devices: Directly Correlating Morphology with Current Generation", Nano Letters, vol. 4, 2004, pp. 2503-2507. XP002606201.

Communication dated Feb. 1, 2011 in Japanese Patent Application No. 2010-200509.

Communication dated Feb. 1, 2011 in Japanese Patent Application No. 2010-201487.

Office Action dated Feb. 6, 2013 in European Patent Application No. 10 175 753.2.

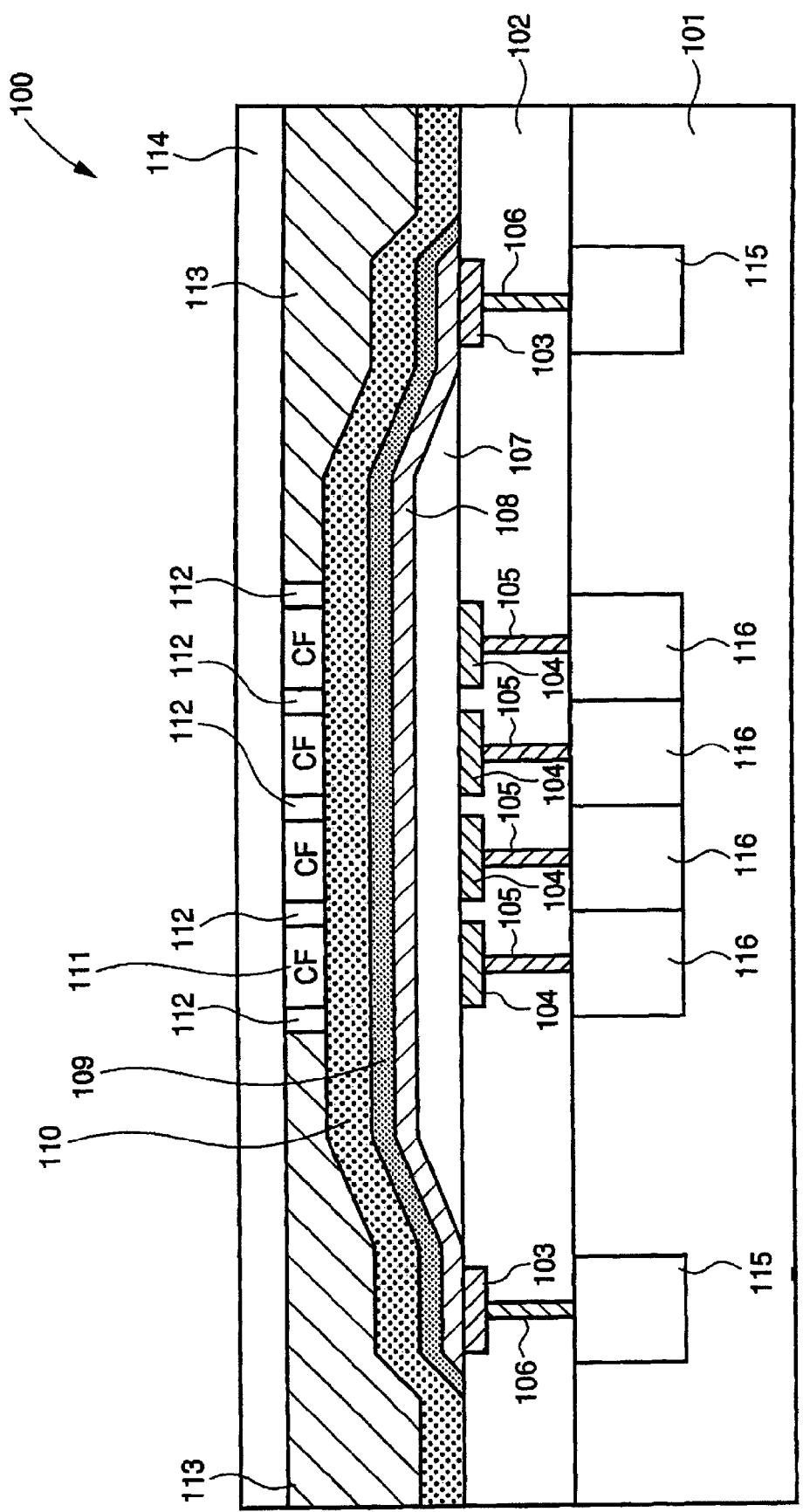

PHOTOELECTRIC CONVERSION DEVICE, PRODUCTION METHOD THEREOF, PHOTOSENSOR, IMAGING DEVICE AND THEIR DRIVE METHODS

BACKGROUND OF THE INVENTION

1. Field of the Invention

The present invention relates to a photoelectric conversion device, a production method thereof, a photosensor, an imaging device and their driving methods.

2. Description of the Related Art

As for the solid-state imaging device, there is widely used a flat light-receiving device where photoelectric conversion sites are two-dimensionally arrayed in a semiconductor to form pixels and a signal generated by photoelectric conversion in each pixel is charge-transferred and read out through a CCD or CMOS circuit. The conventional photoelectric conversion site generally used is a photodiode part formed using PN junction in a semiconductor such as Si.

In recent years, fabrication of a multipixel device is proceeding, and the pixel size and in turn, the area of a photodiode part become small, which brings about problems of reduction in the aperture ratio, reduction in the light collection efficiency and the resulting reduction in the sensitivity. As for the measure to increase the aperture ratio and the like, suggestions are being made on a solid-state imaging device having an organic photoelectric conversion film using an organic material.

In the organic photoelectric conversion film, a technique of introducing a mixed film using a fullerene or a fullerene derivative or a bulk heterojunction structure into the organic photoelectric conversion film so as to bring out high photoelectric conversion efficiency (high exciton dissociation efficiency) is known. For example, Patent Document 1 discloses a photoelectric conversion film containing a fullerene or a fullerene derivative.

The organic photoelectric conversion device used in a solar cell is designed to collect electric power and therefore, an external electric field is not applied, but the organic photoelectric conversion device used as a visible light sensor of a solid-state imaging device needs to maximize the photoelectric conversion efficiency and a voltage is externally applied so as to enhance the photoelectric conversion efficiency or increase the response speed.

When a voltage is externally applied so as to enhance the photoelectric conversion efficiency or increase the response speed, injection of a hole or injection of an electron from an electrode is generated due to an external electric field, and this disadvantageously increases the dark current, which becomes a problem.

Many of materials usually used as an electrode in a photoelectric conversion device have a work function (WF) of around 4.5 eV (for example, ITO) and, for example, in the case of using a fullerene ($C_{60}$) as the material of the photoelectric conversion film, an energy gap between WF of the electrode and LUMO of the fullerene ($C_{60}$) becomes small, as a result, particularly an electron is liable to be injected from the electrode into the photoelectric conversion film and a significant increase of dark current is caused.

As regards the prevention of an increase in the dark current due to an injected current, a technique of providing a charge blocking layer to suppress the injection of an electric charge into the photoelectric conversion layer, thereby efficiently blocking an injected carrier and reducing the dark current, is disclosed (Patent Document 2).

In the case of using the photoelectric conversion device as a solid-state imaging device, a color filter needs to be provided for the formation of a color image and furthermore, when soldering the imaging device to a substrate, the device with the substrate is heated. Accordingly, it is demanded that the reduction in photoelectric conversion efficiency and the increase of dark current are small under the conditions of a temperature not less than 180° C. which is the process temperature in the above, and about 30 minutes. However, in Patent Documents 1 and 2, heat resistance working out to an important factor in practice is not referred to, and a chemical structure having high heat resistance is not sufficiently described.

In Patent Documents 3 to 6, an organic material having a fluorene structure is described, and the organic material is used for an electroluminescence device. The electroluminescence device utilizes luminescence occurring upon application of a voltage to the device, but the photoelectric conversion device when emitted light is reduced in the photoelectric conversion efficiency and therefore, is required to emit substantially no light. Also, the transfer direction of a hole is opposite between the electroluminescence device and the photoelectric conversion device and in turn, the functions required of the material differs.

The photoelectric conversion device outputs signals according to the quantity of light entered, and a constant voltage therefor is applied to the device. As described above, an important function of the electron blocking material in the photoelectric conversion device is suppression of electron injection from the electrode. On the other hand, in the electroluminescence device, the light/dark luminescence is controlled by a voltage, and the above-described function is unnecessary.

In Patent Document 7, an organic material having a fluorene structure is described, and the organic material is used for a dye-sensitized solar cell. However, the characteristics required of a solar cell differ from those required of the photoelectric conversion device aiming at an imaging device element and therefore, unlike the present invention, description regarding dark current and heat resistance is not sufficiently disclosed.

Also, in the case of producing a film by using the compound described in Patent Document 7, generation of a grain boundary by crystallization due to low amorphous property and formation of unevenness on the film surface may be caused, and this material is not suited as a material of a photoelectric conversion device aiming at a photosensor, an imaging device and the like.

[Patent Document 1] JP-A-2007-123707 (the term "JP-A" as used herein means an "unexamined published Japanese patent application")
[Patent Document 2] JP-A-2008-72090
[Patent Document 3] JP-A-2005-290000
[Patent Document 4] Japanese Patent 3,508,984
[Patent Document 5] JP-A-2007-137795
[Patent Document 6] JP-A-2006-131783
[Patent Document 7] JP-A-2007-115665

SUMMARY OF THE INVENTION

In order to realize high photoelectric conversion efficiency and high-speed response, the material for a photoelectric conversion device is required to have not only a blocking ability to the injection of an electric charge from the electrode for reducing the dark current but also high charge transportability enabling an electric charge generated in the photoelectric conversion film to be transported to the electrode. In a photoelectric conversion device using a material lacking in the charge transportability, a photocurrent is not observed. Furthermore, considering the storability and application to a production process including a heating step such as placement of color filter, placement of protective film or soldering of device, the material for a photoelectric conversion device needs to have high heat resistance.

That is, in the case of a photoelectric conversion device material having a diarylamine partial structure utilizing hole transport, the material needs to be designed to satisfy small Ea (electron affinity) value, high hole transportability and high heat resistance, and the configuration is greatly restricted so as to satisfy these requirements.

In addition, molecular design for allowing the position of energy level to take a preferred value must be considered so that the material can be appropriately used in the device configuration.

When a material with a small Ip (ionization potential) value and a material with a large Ea value (for example, fullerene $C_{60}$) are contacted, an electric charge (electron, hole) is generated in LUMO of the material layer having a large Ea value from HOMO of the material layer having a small Ip value within the photoelectric conversion device due to thermal excitation, as a result, a dark current causing noise is increased. The Ip of the electron blocking layer in contact with fullerene $C_{60}$ must be sufficiently large and at the same time, needs to be small enough to receive a hole without barriers from HOMO of the material that transports a hole in the bulk heterojunction layer of fullerene $C_{60}$. That is, the Ip of the electron blocking layer should be designed to a fairly limited value, and a large restriction has to be further added to the material design whose latitude is originally narrow.

The present invention has been made to solve these problems, and an object of the present invention is to provide a photoelectric conversion device capable of functioning as a photoelectric conversion device when applied to a photoelectric conversion device, exhibiting a low dark current and reducing the increase of dark current even when the device is heat-treated, and an imaging device equipped with such a photoelectric conversion device.

An another object of the present invention is to provide a compound which may provide the photoelectric conversion device and a photoelectric conversion material.

As a result of intensive studies, the present inventors have found that the above-described object can be attained by using a compound having a specific structure. That is, the problems above can be solved by the following techniques.

[1] A photoelectric conversion device comprising a transparent electrically conductive film, a photoelectric conversion film and an electrically conductive film in this order, wherein the photoelectric conversion film comprises a photoelectric conversion layer, and an electron blocking layer, wherein the electron blocking layer contains a compound represented by the following formula (Y1):

Formula (Y1)

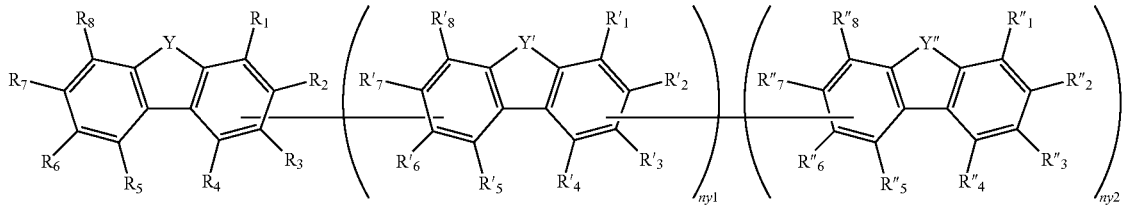

wherein each of $R_1$ to $R_8$, $R'_1$ to $R'_8$, $R''_1$ to $R''_8$ independently represents a hydrogen atom, a halogen atom, an alkyl group, an aryl group, a heterocyclic group, a hydroxyl group, an amino group or a mercapto group, which may further have a substituent; provided that at least one of $R_1$ to $R_8$, $R'_1$ to $R'_8$, $R''_1$ to $R''_8$ represents a substituted amino group containing three or more ring structures; each of Y, Y' and Y'' independently represents a carbon atom, a nitrogen atom, an oxygen atom, a sulfur atom or a silicon atom, which may further have a substituent; ny1 represents an integer of 0 to 2; ny2 represents an integer of 0 or 1.

[2] The photoelectric conversion device according to the above [1], wherein the compound represented by formula (Y1) is a compound represented by the following formula (1):

Formula (1)

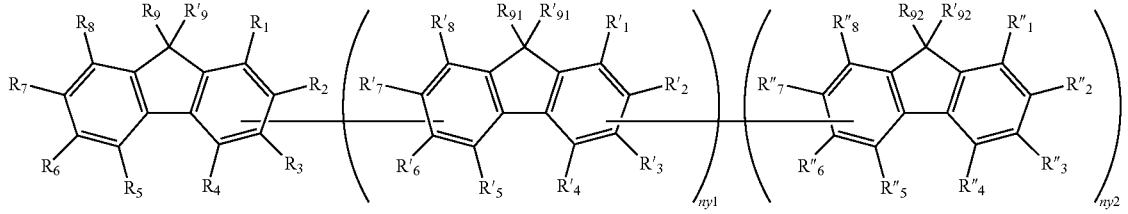

wherein each of $R_1$ to $R_9$, $R'_9$, $R'_1$ to $R'_8$, $R_{91}$, $R'_{91}$, $R''_1$ to $R''_8$, $R_{92}$ and $R'_{92}$ independently represents a hydrogen atom, a halogen atom, an alkyl group, an aryl group, a heterocyclic group, a hydroxyl group, an amino group or a mercapto group, which may further have a substituent; provided that at least one of $R_1$ to $R_8$, $R'_1$ to $R'_8$, $R''_1$ to $R''_8$ represents a substituted amino group containing three or more ring structures; ny1 represents an integer of 0 to 2; ny2 represents an integer of 0 or 1.

[3] The photoelectric conversion device according to the above [1] or [2], wherein the compound represented by formula (Y1) is a compound represented by the following formula (F-1):

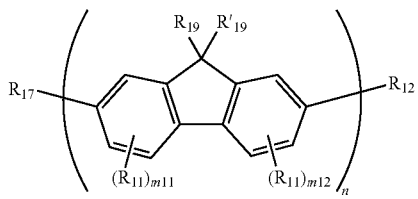

Formula (F-1)

wherein $R_{11}$ represents a halogen atom, an alkyl group, an aryl group, a heterocyclic group, a hydroxyl group, an amino group or a mercapto group, which may further have a substituent; each of $R_{12}$, $R_{17}$ independently represents a hydrogen atom, a halogen atom, an alkyl group, an aryl group, a heterocyclic group, a hydroxyl group, an amino group or a mercapto group, which may further have a substituent; each of $R_{19}$ and $R'_{19}$ independently represents a hydrogen atom, a halogen atom, or an alkyl group, an aryl group, a heterocyclic group, a hydroxyl group, an amino group or a mercapto group, which may further have a substituent; provided that at least one of $R_{12}$ and $R_{17}$ represents a substituted amino group containing three or more ring structures; each of m11 and m12 independently represents an integer of 0 to 3; each $R_{11}$ may be the same as or different from every other $R_{11}$ when a plurality of $R_{11}$'s are present in formula (F-1); and n represents an integer of 1 to 4.

[4] The photoelectric conversion device according to the above [3], wherein, in formula (F-1), $R_{11}$ represents an alkyl group, an aryl group or a heterocyclic group.

[5] The photoelectric conversion device according to the above [3], wherein, in formula (F-1), m11 and m12 represent 0.

[6] The photoelectric conversion device according to any one of the above [3] to [5], wherein, in formula (F-1), each of $R_{19}$ and $R'_{19}$ independently represents a hydrogen atom, an alkyl group or a heterocyclic group.

[7] The photoelectric conversion device according to the above [6], wherein, in formula (F-1), each of $R_{19}$ and $R'_{19}$ independently represents an alkyl group.

[8] The photoelectric conversion device according to any one of the above [1] to [7], wherein said substituted amino group containing three or more ring structures is a group represented by the following formula (A-1):

Formual (A-1)

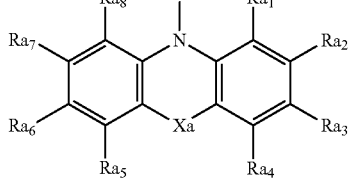

wherein each of $Ra_1$ to $Ra_8$ independently represents a hydrogen atom, a halogen atom, an alkyl group, an aryl group or a heterocyclic group, which may further have a substituent; * represents the bonding position; and Xa represents a single bond, an oxygen atom, a sulfur atom, or an alkylene group, an alkenylene group, a cycloalkylene group, a cycloalkenylene group, an arylene group, a divalent heterocyclic group or an imino group, which may further have a substituent.

[9] The photoelectric conversion device according to the above [8], wherein, in formula (A-1), Xa represents a single bond, an alkylene group, an alkenylene group, an arylene group, a divalent heterocyclic group, an oxygen atom, a sulfur atom or an imino group.

[10] The photoelectric conversion device according to any one of the above [1] to [7], wherein said substituted amino group containing three or more ring structures is a group represented by the following formula (A-2):

—N($R_{B1}$)($R_{B2}$)  Formula (A-2):

wherein each of $R_{B1}$ and $R_{B2}$ independently represents a hydrogen atom, a halogen atom, an alkyl group, an aryl group or a heterocyclic group, which may further have a substituent; provided that at least either $R_{B1}$ or $R_{B2}$ represents an aryl group or a heterocyclic group and the number of rings contained in $R_{B1}$ and $R_{B2}$ is 3 or more in total.

[11] The photoelectric conversion device according to the above [10], wherein at least either $R_{B1}$ or $R_{B2}$ is a group represented by the following formula (b-1):

Formula (b-1)

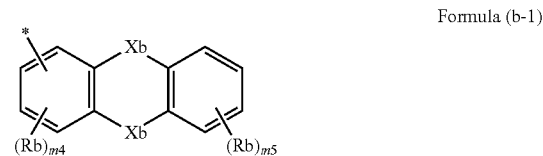

wherein each Rb independently represents a halogen atom, an alkyl group, an aryl group or a heterocyclic group, which may further have a substituent; each Xb independently represents a single bond, an oxygen atom, a sulfur atom, an alkylene group, an alkenylene group, a cycloalkylene group, a cycloalkenylene group, an arylene group, a divalent heterocyclic group or an imino group, which may further have a substituent; each Rb may be the same as or different from every other Rb when a plurality of Rb's are present in formula (b-1); two Xb's may be the same or different; * represents the bonding position; m4 represents an integer of 0 to 3; and m5 represents an integer of 0 to 4.

[12] The photoelectric conversion device according to any one of the above [3] to [11], wherein, in formula (F-1), n represents 2.

[13] The photoelectric conversion device according to any one of the above [1] to [7], and [12], wherein said substituted amino group containing three or more ring structures is a group represented by the following formula (A-3), a group represented by the following formula (A-4) or a group represented by the following formula (A-5):

(A-3)

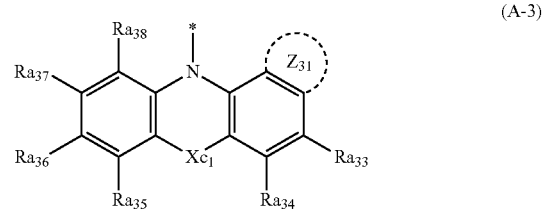

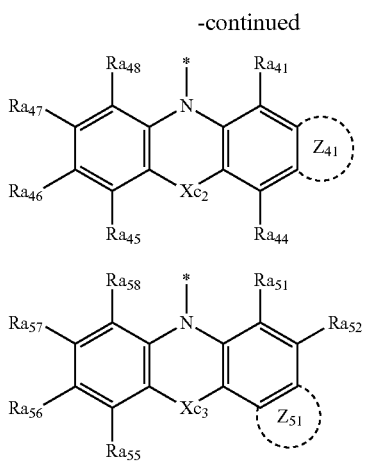

wherein each of $Ra_{33}$ to $Ra_{38}$, $Ra_{41}$, $Ra_{44}$ to $Ra_{48}$, $Ra_{51}$, $Ra_{52}$, and $Ra_{55}$ to $Ra_{58}$ independently represents a hydrogen atom, a halogen atom or an alkyl group, which may further have a substituent; * represents the bonding position; each of $Xc_1$, $Xc_2$ and $Xc_3$ independently represents a single bond, an oxygen atom, a sulfur atom, an alkylene group, a silylene group, an alkenylene group, a cycloalkylene group, a cycloalkenylene group, an arylene group, a divalent heterocyclic group or an imino group, which may further have a substituent; each of $Z_{31}$, $Z_{41}$ and $Z_{51}$ independently represents a cycloalkyl ring, an aromatic hydrocarbon ring or an aromatic heterocyclic ring, which may further have a substituent.

[14] The photoelectric conversion device according to any one of the above [1] to [13], wherein the ionization potential (Ip) of the compound represented by formula (Y1) is 5.8 eV or less.

[15] The photoelectric conversion device according to any one of the above [1] to [14], wherein the ionization potential (Ip) of the compound represented by formula (Y1) is 4.9 eV or more.

[16] The photoelectric conversion device according to any one of the above [1] to [15], wherein the molecular weight of the compound represented by formula (Y1) is from 500 to 2,000.

[17] The photoelectric conversion device according to any one of the above [1] to [16], wherein said photoelectric conversion layer contains an n-type organic semiconductor.

[18] The photoelectric conversion device according to the above [17], wherein said n-type organic semiconductor is a fullerene or a fullerene derivative.

[19] The photoelectric conversion device according to any one of the above [1] to [18], wherein said photoelectric conversion film contains a compound of the following formula (I):

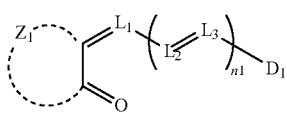

Formula (I)

wherein $Z_1$ represents an atomic group necessary for forming a 5- or 6-membered ring; each of $L_1$, $L_2$ and $L_3$ represents an unsubstituted methine group or a substituted methine group; $D_1$ represents an atomic group; and n1 represents an integer of 0 or more.

[20] The photoelectric conversion device according to any one of the above [1] to [19], wherein an electrically conductive film, an electron blocking layer, a photoelectric conversion layer and a transparent electrically conductive film are stacked in this order.

[21] A method for producing the photoelectric conversion device according to any one of the above [1] to [20], comprising a step of depositing each of said photoelectric conversion layer and said electron blocking layer by vacuum heating deposition.

[22] A photosensor comprising the photoelectric conversion device according to any one of the above [1] to [20].

[23] An imaging device comprising the photoelectric conversion device according to any one of the above [1] to [20].

[24] A method for driving the photoelectric conversion device according to any one of the above [1] to [20], the photosensor according to the above [22], or the imaging device according to the above [23], comprising applying a voltage larger than 0V and less than 100V by assigning the cathode to the electrode in contact with said electron blocking layer and assigning the anode to the other electrode.

[25] A compound represented by the following formula (F-10):

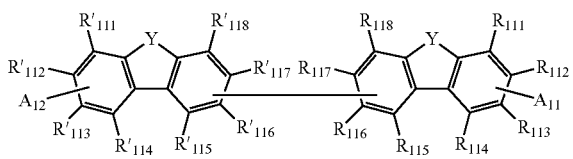

Formula (F-10)

wherein each of $R_{111}$ to $R_{118}$, $R'_{111}$ to $R'_{118}$ independently represents a hydrogen atom, a halogen atom, an alkyl group, an aryl group, a heterocyclic group, a hydroxyl group, an amino group or a mercapto group, which may further have a substituent; any one of $R_{115}$ to $R_{118}$ is linked with any one of $R'_{115}$ to $R'_{118}$ to form a single bond; each of $A_{11}$ and $A_{12}$ independently represents a substituent represented by the following formula (A-1); $A_{11}$ is substituted as any one of $R_{111}$ to $R_{114}$, and $A_{12}$ is substituted as any one of $R'_{111}$ to $R'_{114}$; Y each independently represents a carbon atom, a nitrogen atom, an oxygen atom, a sulfur atom or a silicon atom, which may further have a substituent having a carbon number of 2 or less:

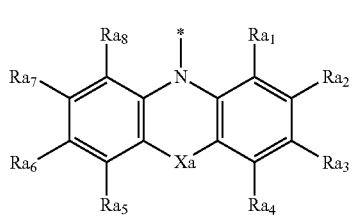

Formula (A-1)

wherein each of $Ra_1$ to $Ra_8$ independently represents a hydrogen atom, a halogen atom, an alkyl group, an aryl group or a heterocyclic group, which may further have a substituent; * represents the bonding position; and Xa represents a single bond, an oxygen atom, a sulfur atom, or an alkylene group, an alkenylene group, a cycloalkylene group, a cycloalkenylene group, an arylene group, a divalent heterocyclic group or an imino group, which may further have a substituent.

[26] An electron blocking material comprising the compound according to the above [25].

[27] A film comprising the compound according to the above [25], wherein the film has a thickness of 1 to 1,000 nm.

According to the present invention, a photoelectric conversion device capable of functioning as a photoelectric conversion device when a compound having a specific structure is applied to a photoelectric conversion device, exhibiting a low dark current and reducing the increase of dark current even when the device is heated, and an imaging device equipped with such a photoelectric conversion device, can be provided.

BRIEF DESCRIPTION OF THE DRAWINGS

FIG. 2 is a schematic cross-sectional view of one pixel portion of an imaging device.

Figure 1A:
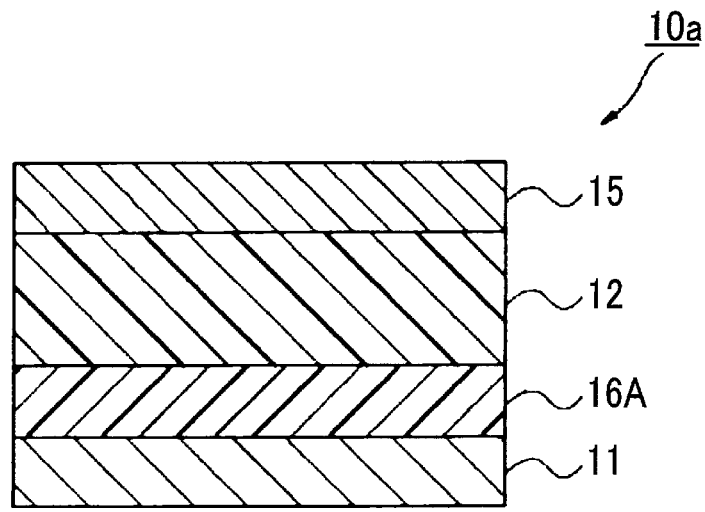
FIG. 1A and FIG. 1B each is a schematic cross-sectional view showing one configuration example of the photoelectric conversion device.

DESCRIPTION OF REFERENCE NUMERALS AND SIGNS 10a, 10b Photoelectric conversion device
11 Lower electrode (electrically conductive film)
12 Photoelectric conversion layer (photoelectric conversion film)
15 Upper electrode (transparent electrically conductive film)
16A Electron blocking layer
16B Hole blocking layer
100 Imaging device
101 Substrate
102 Insulating layer
103 Connection electrode
104 Pixel electrode (lower electrode)
105 Connection part
106 Connection part
107 Photoelectric conversion film
108 Opposite electrode (upper electrode)
109 Buffer layer
110 Passivation layer
111 Color filter (CF)
112 Partition wall
113 Light-shielding layer
114 Protective layer
115 Opposite electrode voltage supply part
116 Read-out circuit

DETAILED DESCRIPTION OF THE INVENTION

[Photoelectric Conversion Device]

The photoelectric conversion device of the present invention is a photoelectric conversion device comprising a transparent electrically conductive film, a photoelectric conversion film and an electrically conductive film in this order, wherein the photoelectric conversion film comprises a photoelectric conversion layer, and an electron blocking layer, wherein the electron blocking layer contains a compound represented by the following formula (Y1):

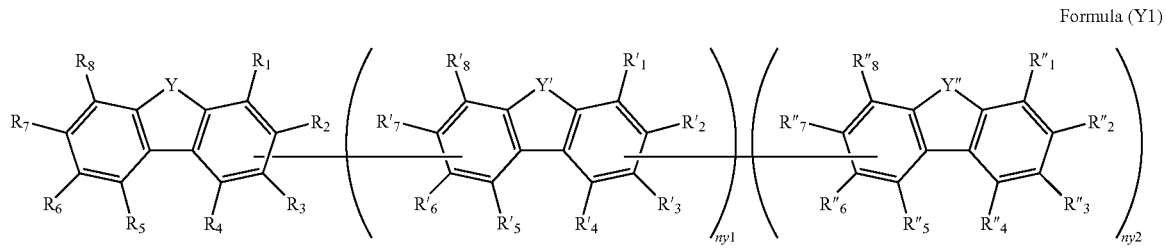

Formula (Y1)

wherein each of $R_1$ to $R_8$, $R'_1$ to $R'_8$, $R''_1$ to $R''_8$ independently represents a hydrogen atom, a halogen atom, an alkyl group, an aryl group, a heterocyclic group, a hydroxyl group, an amino group or a mercapto group, which may further have a substituent; provided that at least one of $R_1$ to $R_8$, $R'_1$ to $R'_8$, $R''_1$ to $R''_8$ represents a substituted amino group containing three or more ring structures; each of Y, Y' and Y'' independently represents a carbon atom, a nitrogen atom, an oxygen atom, a sulfur atom or a silicon atom, which may further have a substituent; ny1 represents an integer of 0 to 2; ny2 represents an integer of 0 or 1.

A preferred embodiment of the photoelectric conversion device of the present invention is described below. The photoelectric conversion device of the present invention may be that wherein the electrically conductive film, the photoelectric conversion layer, the electron blocking layer and the transparent electrically conductive film are stacked in this order, but in a preferred mode, the electrically conductive film, the electron blocking layer, the photoelectric conversion layer and the transparent electrically conductive film are stacked in this order.

FIG. 1 shows a configuration example of the photoelectric conversion device of the present invention.

The photoelectric conversion device 10a shown in FIG. 1A has a configuration where an electron blocking layer 16A formed on a lower electrode 11, a photoelectric conversion layer 12 formed on the electron blocking layer 16A, and a transparent electrically conductive film (hereinafter referred to as an upper electrode) 15 functioning as an upper electrode are stacked in this order on an electrically conductive film (hereinafter referred to as a lower electrode) 11 functioning as a lower electrode.

Figure 1B:
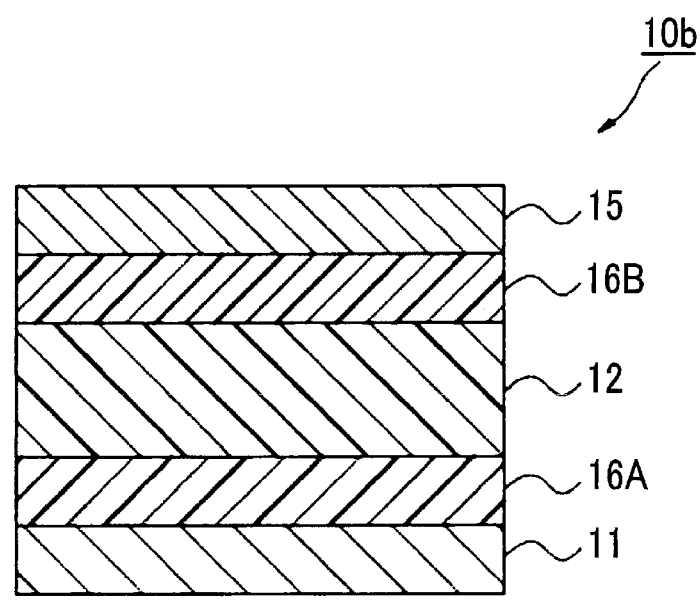

FIG. 1B shows another configuration example of the photoelectric conversion device. The photoelectric conversion device 10b shown in FIG. 1B has a configuration where an electron blocking layer 16A, a photoelectric conversion layer 12, a hole blocking layer 16B and an upper electrode 15 are stacked in this order on a lower electrode 11. Incidentally, in FIG. 1A and FIG. 1B, the order of stacking an electron blocking layer, a photoelectric conversion layer and a hole blocking layer may be reversed according to usage or properties.

The elements constituting the photoelectric conversion device according to this embodiment are described below.

(Electrode)

Each of the electrodes (the upper electrode (transparent electrically conductive film) 15 and the lower electrode (electrically conductive film) 11) is composed of an electrically conductive material. Examples of the electrically conductive material which can be used include a metal, an alloy, a metal oxide, an electroconductive compound, and a mixture thereof.

Light is incident from the upper electrode 15 and therefore, the upper electrode 15 needs to be sufficiently transparent to light that is to be detected. Specific examples thereof include an electrically conductive metal oxide such as tin oxide doped with antimony, fluorine (ATO, FTO) or the like, tin oxide, zinc oxide, indium oxide, indium tin oxide (ITO) and indium zinc oxide (IZO); a metal thin film such as gold, silver, chromium and nickel; a mixture or laminate of such a metal and such an electrically conductive metal oxide; an inorganic electrically conductive substance such as copper iodide and copper sulfide; an organic electrically conductive material such as polyaniline, polythiophene and polypyrrole; and a laminate of such a material and ITO. Among these, an electrically conductive metal oxide is preferred in view of high electrical conductivity, transparency and the like. The upper electrode 15 is deposited on the organic photoelectric conversion layer 12 and therefore, is preferably deposited by a method causing no deterioration of the properties of the organic photoelectric conversion layer 12.

The lower electrode 11 includes, according to usage, a case where transparency is imparted, a case where, conversely, a material capable of reflecting light is used without imparting transparency, and the like. Specific examples thereof include an electrically conductive metal oxide such as tin oxide doped with antimony, fluorine (ATO, FTO) or the like, tin oxide, zinc oxide, indium oxide, indium tin oxide (ITO) and indium zinc oxide (IZO); a metal such as gold, silver, chromium, nickel, titanium, tungsten and aluminum; an electrically conductive compound such as oxide and nitride of the metal above (for example, titanium nitride (TiN)); a mixture or laminate of such a metal and such an electrically conductive metal oxide; an inorganic electrically conductive substance such as copper iodide and copper sulfide; an organic electrically conductive material such as polyaniline, polythiophene and polypyrrole; and a laminate of such a material and ITO or titanium nitride.

The method for forming the electrode is not particularly limited and may be appropriately selected by taking into consideration the aptitude for the electrode material. Specifically, the electrode can be formed, for example, by a wet system such as printing and coating, a physical system such as vacuum deposition. sputtering and ion plating, or a chemical system such as CVD and plasma CVD.

In the case where the material of the electrode is ITO, the electrode can be formed, for example, by an electron beam method, a sputtering method, a resistance heating deposition method, a chemical reaction method (e.g., sol-gel method) or a method of coating a dispersion of indium tin oxide. The film produced using ITO may be further subjected to, for example, a UV-ozone treatment or a plasma treatment. In the case where the material of the electrode is TiN, various methods including a reactive sputtering method are used, and the film formed can be further subjected to a UV-ozone treatment, a plasma treatment or the like.

The upper electrode 15 is preferably produced in a plasma-free state. When the upper electrode 15 is produced in a plasma-free state, the effect of plasma on the substrate can be reduced and good photoelectric conversion properties can be obtained. Here, the plasma-free state means a state where plasma is not generated during deposition of the upper electrode 15, or a state where the distance from a plasma source to the substrate is 2 cm or more, preferably 10 cm or more, more preferably 20 cm or more, and the amount of plasma reaching the substrate is reduced.

Examples of the apparatus generating no plasma during deposition of the upper electrode 15 include an electron beam deposition apparatus (EB deposition apparatus) and a pulsed laser deposition apparatus. As for the EB deposition apparatus or pulsed laser deposition apparatus, the apparatuses described, for example, in Yutaka Sawada (supervisor), *Tomei Doden Maku no Shin Tenkai* (*New Development of Transparent Conductive Film*), CMC (1999), Yutaka Sawada (supervisor), *Tomei Doden Maku no Shin Tenkai II* (*New Development of Transparent Conductive Film II*), CMC (2002), *Tomei Doden Maku no Gijutsu* (*Technology of Transparent Conductive Film*), JSPS, Ohmsha (1999), and references cited therein can be used. In the following, the method of depositing the transparent electrode film by using an EB deposition apparatus is referred to as an EB deposition method, and the method of depositing the transparent electrode film by using a pulsed laser deposition apparatus is referred to as a pulsed laser deposition method.

As for the apparatus capable of realizing a state where the distance from a plasma source to the substrate is 2 cm or more and the amount of plasma reaching the substrate is reduced (hereinafter referred to as a "plasma-free deposition apparatus"), an opposed-target sputtering apparatus, an arc plasma deposition method and the like are considered, and examples of such an apparatuses which can be used include those described in Yutaka Sawada (supervisor), *Tomei Doden Maku no Shin Tenkai* (*New Development of Transparent Conductive Film*), CMC (1999), Yutaka Sawada (supervisor), *Tomei Doden Makuno Shin Tenkai II* (*New Development of Transparent Conductive Film II*), CMC (2002), *Tomei Doden Maku no Gijutsu* (*Technology of Transparent Conductive Film*), JSPS, Ohmsha (1999), and references cited therein.

In the case where the upper electrode 15 is a transparent electrically conductive film such as TCO, a DC short or an increase of leak current sometimes occurs. One of causes thereof is considered because fine cracks introduced into the photoelectric conversion layer 12 are coveraged by a dense film such as TCO to increase the conduction with the first electrode film 11 on the opposite side. Therefore, in the case of an electrode having relatively poor film quality such as Al, the leak current hardly increases. The increase of leak current can be greatly suppressed by controlling the film thickness of the upper electrode 15 with respect to the film thickness (that is, the crack depth) of the photoelectric conversion layer 12. The thickness of the upper electrode 15 is preferably ⅕ or less, more preferably 1/10 or less, of the thickness of the photoelectric conversion layer 12.

Usually, when the thickness of the electrically conductive film is made smaller than a certain range, an abrupt increase of the resistance value is incurred, but in the solid-state imaging device where the photoelectric conversion device according to this embodiment is incorporated, the sheet resistance may be, preferably, from 100 to 10,000 Ω/sq. and the latitude as to in which range the film thickness can be reduced is large. Also, as the thickness of the upper electrode (transparent electrically conductive film) 15 is smaller, the quantity of light absorbed is reduced and the light transmittance is generally increased. The increase of light transmittance brings about an increase of light absorption in the photoelectric conversion layer 12 and an increase of photoelectric conversion performance, and this is very preferred. Considering the suppression of leak current and the increase of resistance value of thin film as well as the increase of transmittance, which are associated with reduction in the film thickness, the thickness of the upper electrode 15 is preferably from 5 to 100 nm, more preferably from 5 to 20 nm.

(Electron Blocking Layer, Hole Blocking Layer)

The electron blocking layer in the photoelectric conversion device in the present invention contains a compound represented by the following formula (Y1). The compound contained in the electron blocking layer (hereinafter sometimes referred to as a "compound for use in the present invention") is a compound having, as a substituent, a substituted amino group containing three or more ring structures.

Also, the compound for use in the present invention may have a substituent, but the substituent is preferably a substituent suitable for vacuum heating deposition and therefore, is preferably not a polymerizable group. The polymerizable group is a substituent containing a non-aromatic double bond, with either one terminal being unsubstituted (a structure of $CH_2=C$), or a substituent containing an alicyclic ether structure, and specific examples thereof include a substituent having, as a partial structure, a styryl group, an acrylate group, a methacrylate group, an acrylamide group, a methacrylamide group, an epoxy group or an oxetane group.

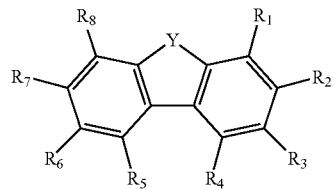

Formula (Y1A)

wherein each of $R_1$ to $R_8$ independently represents a hydrogen atom, a halogen atom, an alkyl group, an aryl group, a heterocyclic group, a hydroxyl group, an amino group or a mercapto group, which may further have a substituent; provided that at least one of $R_1$ to $R_8$ represents a substituted amino group containing three or more ring structures; each Y independently represents a carbon atom, a nitrogen atom, an oxygen atom, a sulfur atom or a silicon atom, which may further have a substituent.

Each Y independently represents a carbon atom, a nitrogen atom, an oxygen atom, a sulfur atom or a silicon atom, which may further have a substituent. That is, Y represents a divalent linking group composed of a carbon atom, a nitrogen atom, an oxygen atom, a sulfur atom or a silicon atom. Examples of the substituent include the later-described substituent W.

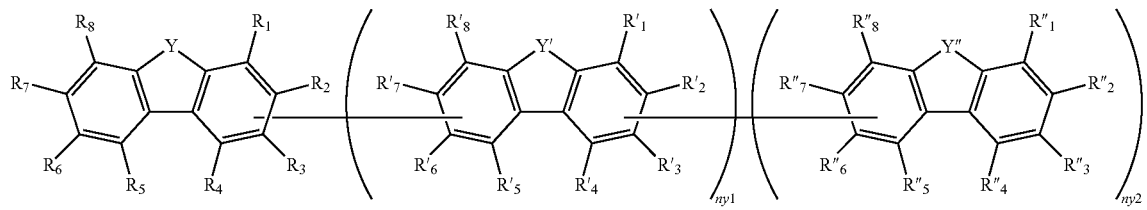

Formula (Y1)

wherein each of $R_1$ to $R_8$, $R'_1$ to $R'_8$, $R''_1$ to $R''_8$ independently represents a hydrogen atom, a halogen atom, an alkyl group, an aryl group, a heterocyclic group, a hydroxyl group, an amino group or a mercapto group, which may further have a substituent; provided that at least one of $R_1$ to $R_8$, $R'_1$ to $R'_8$, $R''_1$ to $R''_8$ represents a substituted amino group containing three or more ring structures; each of Y, Y' and Y'' independently represents a carbon atom, a nitrogen atom, an oxygen atom, a sulfur atom or a silicon atom, which may further have a substituent; ny1 represents an integer of 0 to 2; ny2 represents an integer of 0 or 1.

In the compound represented by formula (Y1), each fluorene unit is bonded by a single bond when ny1 or ny2 is not 0. For example, when ny1 represents 1, any one of $R_1$ to $R_4$ of the left fluorene unit of formula (Y1) is linked with any one of $R'_5$ to $R'_8$ of the central fluorene unit of formula (Y1) to form a single bond. In the case of the others, the same can be applied.

It is preferable that $R_2$ and $R'_7$, $R'_2$, and $R''_7$ are linked respectively or $R_3$ and $R'_6$, $R_3'$ and $R''_6$ are linked respectively. It is more preferable that $R_2$ and $R'_7$, $R'_2$ and $R''_7$ are linked respectively.

The compound represented by formula (Y1) represents a compound represented by the following formula (Y1A) when both ny1 and ny2 represent 0:

Each Y independently preferably represents $—C(R_{21})(R_{22})—$, $—Si(R_{23})(R_{24})—$, $—N(R_{20})—$, an oxygen atom or a sulfur atom, wherein each of $R_{20}$ to $R_{24}$ independently represents a hydrogen atom, a halogen atom, an alkyl group, an aryl group, a heterocyclic group, a hydroxyl group, an amino group or a mercapto group. Y is preferably $—C(R_{21})(R_{22})—$, $—Si(R_{23})(R_{24})—$ or $—N(R_{20})—$, more preferably $—C(R_{21})(R_{22})—$ or $—N(R_{20})—$, still more preferably $—C(R_{21})(R_{22})—$.

In $—C(R_{21})(R_{22})—$, each of $R_{21}$ and $R_{22}$ independently represents a hydrogen atom, a halogen atom, an alkyl group, an aryl group, a heterocyclic group, a hydroxyl group, an amino group or a mercapto group, and each of $R_{21}$ and $R_{22}$ may further have a substituent. Specific examples of the further substituent include the substituent W, and an alkyl group, an aryl group and an alkoxy group are preferred.

Each of $R_{21}$ and $R_{22}$ is preferably a hydrogen atom, an alkyl group which may have a substituent, an aryl group or a heterocyclic group, more preferably a hydrogen atom, an alkyl group having a carbon number of 1 to 18 which may have a substituent, an aryl group having a carbon number of 6 to 18, or a heterocyclic group having a carbon number of 4 to 16, still more preferably a hydrogen atom or an alkyl group having a carbon number of 1 to 18 which may have a substituent, yet still more preferably an alkyl group having a carbon number of 1 to 18.

In —Si($R_{23}$)($R_{24}$)—, each of $R_{23}$ and $R_{24}$ independently represents a hydrogen atom, a halogen atom, an alkyl group, an aryl group, a heterocyclic group, a hydroxyl group, an amino group or a mercapto group, and each of $R_{23}$ and $R_{24}$ may further have a substituent. Specific examples of the further substituent include the substituent W, and an alkyl group, an aryl group and an alkoxy group are preferred.

Each of $R_{23}$ and $R_{24}$ is preferably a hydrogen atom, an alkyl group which may have a substituent, an aryl group or a heterocyclic group, more preferably a hydrogen atom, an alkyl group having a carbon number of 1 to 18 which may have a substituent, an aryl group having a carbon number of 6 to 18, or a heterocyclic group having a carbon number of 4 to 16, still more preferably a hydrogen atom or an alkyl group having a carbon number of 1 to 18 which may have a substituent, yet still more preferably an alkyl group having a carbon number of 1 to 18.

Also, $R_{23}$ and $R_{24}$ may be combined to form a ring, and the ring is preferably an aliphatic hydrocarbon ring, more preferably an aliphatic hydrocarbon ring having a carbon number of 4 to 10.

In —N($R_{20}$)—, $R_{20}$ preferably represents an alkyl group, an aryl group or a heterocyclic group, and $R_{20}$ may further have a substituent. Specific examples of the further substituent include the substituent W, and an alkyl group and an aryl group are preferred.

$R_{20}$ is more preferably a hydrogen atom, an alkyl group having a carbon number of 1 to 18 which may have a substituent, an aryl group having a carbon number of 6 to 18, or a heterocyclic group having a carbon number of 4 to 16, still more preferably a hydrogen atom or an alkyl group having a carbon number of 1 to 18 which may have a substituent, yet still more preferably an alkyl group having a carbon number of 1 to 18.

The compound represented by formula (Y1) is preferably a compound represented by the following formula (1).

The definition and a preferable range of $R_1$ to $R_8$, $R'_1$ to $R'_8$, $R''_1$ to $R''_8$ in formula (Y1) are same as those of $R_1$ to $R_8$, $R'_1$ to $R'_8$, $R''_1$ to $R''_8$ in formula (1).

It is preferable that $R_2$ and $R'_7$, $R'_2$, and $R''_7$ are linked respectively or $R_3$ and $R'_6$, $R_3'$ and $R''_6$ are linked respectively. It is more preferable that $R_2$ and $R'_7$, $R'_2$ and $R''_7$ are linked respectively.

The compound represented by formula (1) represents a compound represented by the following formula (1A) when both ny1 and ny2 represent 0:

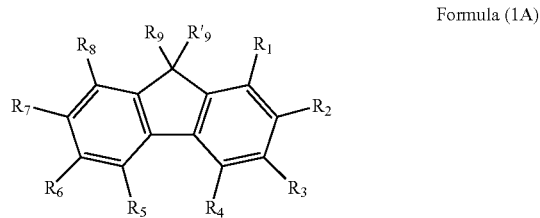

Formula (1A)

wherein each of $R_1$ to $R_9$ and $R'_9$ represents a hydrogen atom, a halogen atom, an alkyl group, an aryl group, a heterocyclic group, a hydroxyl group, an amino group or a mercapto group, which may further have a substituent; provided that at least any one of $R_1$ to $R_9$ and $R'_9$ is a substituted amino group containing three or more ring structures.

In formula (1), each of ny1 and ny2 represents the number of a repeating unit in the parenthesis. ny1 represents an integer of 0 to 2, and is preferably 0 or 1, more preferably 0. ny2 represents an integer of 0 or 1, and is preferably 1. When ny1 and ny2 are within the preferable ranges as above, dark current and heat resistance in the case wherein a devise is constituted become advantage.

In the case where each of $R_1$ to $R_8$ is not a substituted amino group containing three or more ring structures, each independently represents a hydrogen atom, a halogen atom (preferably fluorine atom, chlorine atom, bromine atom or iodine atom), an alkyl group, an aryl group, a heterocyclic group, a hydroxyl group, an amino group or a mercapto group, preferably a hydrogen atom, an alkyl group or an aryl group Formula (1)

wherein each of $R_1$, to $R_9$, $R'_9$, $R'_1$ to $R'_8$, $R_{91}$, $R'_{91}$, $R''_1$ to $R''_8$, $R_{92}$ and $R'_{92}$ independently represents a hydrogen atom, a halogen atom, an alkyl group, an aryl group, a heterocyclic group, a hydroxyl group, an amino group or a mercapto group, which may further have a substituent; provided that at least one of $R_1$ to $R_8$, $R'_1$ to $R'_8$, $R''_1$ to $R''_8$ represents a substituted amino group containing three or more ring structures; ny1 represents an integer of 0 to 2; ny2 represents an integer of 0 or 1.

In the compound represented by formula (1), each fluorene unit is bonded by a single bond when ny1 or ny2 is not 0. For example, when ny1 represents 1, any one of $R_1$ to $R_4$ of the left fluorene unit of formula (Y1) is linked with any one of $R'_5$ to $R'_8$ of the central fluorene unit of formula (Y1) to form a single bond. In the case of the others, the same can be applied.

because a low-polarity substituent is advantageous for the transport of a hole, and more preferably a hydrogen atom because a simple structure is advantageous in view of the cost.

In the case where each of $R_1$ to $R_8$ is not a substituted amino group containing three or more ring structures, the carbon number of each of $R_1$ to $R_8$ is preferably from 0 to 18, more preferably from 0 to 10, still more preferably from 0 to 6.

In the case where each of $R_1$ to $R_8$ represents an alkyl group, the alkyl group is preferably an alkyl group having a carbon number of 1 to 18, more preferably an alkyl group having a carbon number of 1 to 12, still more preferably an alkyl group having a carbon number of 1 to 10, yet still more preferably an alkyl group having a carbon number of 1 to 6, and specifically, the alkyl group is preferably a methyl group, an ethyl group, a propyl group, a butyl group, a hexyl group or a cyclohexyl group.

In the case where each of $R_1$ to $R_8$ represents an aryl group, the aryl group is preferably an aryl group having a carbon number of 6 to 18, more preferably an aryl group having a carbon number of 6 to 14, still more preferably an aryl group having a carbon number of 6 to 10, and specifically, the aryl group is preferably a phenyl group, a naphthyl group or an anthryl group, more preferably a phenyl group or a naphthyl group.

In the case where each of $R_1$ to $R_8$ represents a heterocyclic group, the heterocyclic group is preferably a heterocyclic group having a carbon number of 4 to 16, more preferably a heterocyclic group having a carbon number of 4 to 10, and specifically, the heterocyclic group is preferably a pyridyl group, a pyrimidyl group, a furanyl group or a thienyl group.

In the case where each of $R_1$ to $R_8$ represents an alkyl group, an aryl group, a heterocyclic group, a hydroxyl group, an amino group or a mercapto group, these groups may further have a substituent. Specific examples of the further substituent include the substituent W.

Each of $R_9$ and $R'_9$ independently preferably represents a hydrogen atom, a halogen atom (preferably fluorine atom, chlorine atom, bromine atom or iodine atom), an alkyl group, a heterocyclic group, a hydroxyl group, an amino group or a mercapto group, preferably a hydrogen atom, an alkyl group or a heterocyclic group because a low-polarity substituent is advantageous for the transport of a hole, more preferably a hydrogen atom or an alkyl group, and still more preferably an alkyl group because an alkyl group has no reactive proton and high durability can be expected.

The carbon number of each of $R_9$ and $R'_9$ is preferably from 0 to 18, more preferably from 0 to 10, still more preferably from 0 to 6.

In the case where each of $R_9$ and $R'_9$ represents an alkyl group, the alkyl group is preferably an alkyl group having a carbon number of 1 to 18, more preferably an alkyl group having a carbon number of 1 to 12, still more preferably an alkyl group having a carbon number of 1 to 6, and specifically, the alkyl group is preferably a methyl group, an ethyl group, a propyl group, a butyl group, a hexyl group or a cyclohexyl group.

In the case where each of $R_9$ and $R'_9$ represents an aryl group, the aryl group is preferably an aryl group having a carbon number of 6 to 18, more preferably an aryl group having a carbon number of 6 to 10, and specifically, the aryl group is preferably a phenyl group, a naphthyl group or an anthryl group.

In the case where each of $R_9$ and $R'_9$ represents a heterocyclic group, the heterocyclic group is preferably a heterocyclic group having a carbon number of 4 to 16, more preferably a heterocyclic group having a carbon number of 4 to 10, and specifically, the heterocyclic group is preferably a pyridyl group, a pyrimidyl group, a furanyl group, a furfuryl group or a thienyl group.

In the case where each of $R_9$ and $R'_9$ represents an alkyl group, an aryl group, a heterocyclic group, a hydroxyl group, an amino group or a mercapto group, these groups may further have a substituent. Specific examples of the further substituent include the substituent W.

Furthermore, if possible, adjacent members out of $R_1$ to $R_9$ and $R'_9$ may be combined with each other to form a ring. Examples of the ring include the later-described ring R.

$R'_1$ to $R'_8$, $R''_1$ to $R''_8$ have the same meaning as $R_1$ to $R_8$, and the specific examples and a preferable range thereof are same as those of $R_1$ to $R_8$.

$R_{91}$ and $R'_{91}$, $R_{92}$ and $R'_{92}$ have the same meaning as $R_9$ and $R'_9$, and the specific examples and a preferable range thereof are same as those of $R_9$ and $R'_9$.

In formula (1), for the reason that a device having high heat resistance which is a task of the present invention is obtained, a compound where at least either one of $R''_2$ and $R_7$ is a substituted amino group containing three or more ring structures is preferred, and a compound where $R''_2$ and $R_7$ are a substituted amino group containing three or more ring structures is more preferred.

In formula (1), in the case where ny1 and ny2 represent 0, it is preferable that at least either one of $R_2$ and $R_7$ is a substituted amino group containing three or more ring structures, and it is more preferable that $R_2$ and $R_7$ are a substituted amino group containing three or more ring structures.

In formula (1), the substituted amino group containing three or more ring structures can be bonded to the fluorene structure directly or through another group. The another group is preferably an oxygen atom, a sulfur atom, an alkylene group, an alkenylene group, a cycloalkylene group, a cycloalkenylene group, an arylene group, a divalent heterocyclic group or an imino (—NH—) group, and the alkylene group, the alkenylene group, the cycloalkylene group, the cycloalkenylene group, the arylene group, the divalent heterocyclic group or the imino group may further have a substituent. Specific examples of the further substituent include the substituent W.

The another group is more preferably an alkylene group having a carbon number of 1 to 12, an alkenylene group having a carbon number of 2 to 12, an arylene group having a carbon number of 6 to 14, a heterocyclic group having a carbon number of 4 to 13, an oxygen atom, a sulfur atom, or an imino group containing a hydrocarbon group having a carbon number of 1 to 12 (preferably an aryl group or an alkyl group) (e.g., phenylamino group, methylimino group, tert-butylimino group), still more preferably an alkylene group having a carbon number of 1 to 6 (e.g., methylene group, 1,2-ethylene group, 1,1-dimethylmethylene group), an alkenylene group having a carbon number of 2 (e.g., —CH$_2$=CH$_2$—), or an arylene group having a carbon number of 6 to 10 (e.g., 1,2-phenylene group, 2,3-naphthylene group).

The substituted amino group containing three or more ring structures and being bonded to the fluorene structure directly is more preferable than that which is bonded to the fluorene structure through another group because a simple structure is advantageous in view of the cost.

The substituted amino group containing three or more ring structures is preferably a substituted amino group containing three or more rings in total. Here, when the substituted amino group containing three or more ring structures contains a condensed ring, monocyclic each cyclic component constituting the condensed ring is counted as one ring.

The substituted amino group containing three or more ring structures preferably contains from 3 to 5 rings in total, more preferably 3 or 4 rings in total. The carbon number of the substituted amino group containing three or more ring structures is preferably from 5 to 40, more preferably from 10 to 30.

Also, the substituted amino group containing three or more ring structures is preferably an amino group having, as a substituent, a group containing a structure where three or more rings are formed by the condensation of two aromatic hydrocarbons. The substituted amino group may also be in the form of its nitrogen atom being contained in a part of a ring structure. Specific examples thereof include a carbazole structure, an acridane structure, a dibenzoazepine structure, and their benzo-fused ring derivative structures.

Each of the two aromatic hydrocarbons may is preferably composed of a 6-membered ring. The aromatic hydrocarbon itself may be a condensed ring (e.g., naphthalene).

Specific examples of the substituted amino group containing three or more ring structures include substituted amino groups having, as a substituent, a group of A5 to A7 etc. illustrated later. Also, as in the groups of N1 to N13 illustrated later, the substituted amino group containing three or more ring structures may be in the form where N of the substituted amino group is contained in a part of a ring structure.

The compounds represented by formula (Y1), formula (1) and formula (F-1) for use in the present invention have such a substituted amino group containing three or more ring structures and thanks to a low ability of generating a thermal excitation current, which is characteristic of this structure, and little change of the molecular state at heating, the change in the intermolecular interaction between compounds represented by formula (Y1), formula (1) and formula (F-1) and between the compound and the compound used in the photoelectric conversion layer is reduced, and this is considered to contribute to decreasing the dark current and preventing the dark current from increasing due to heating.

The substituted amino group containing three or more ring structures is not particularly limited in its substitution position but is preferably contained in at least either $R_2$ or $R_7$.

In formula (1), the substituted amino group containing three or more ring structures more specifically includes a group represented by the following formula (A-1), a group represented by the following formula (A-2), a group represented by the following formula (A-3), a group represented by the following formula (A-4) and a group represented by the following formula (A-5):

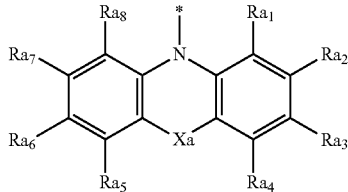

Formula (A-1)

wherein each of $Ra_1$ to $Ra_8$ independently represents a hydrogen atom, a halogen atom, an alkyl group, an aryl group or a heterocyclic group, which may further have a substituent; * represents the bonding position; and Xa represents a single bond, an oxygen atom, a sulfur atom, or an alkylene group, an alkenylene group, a cycloalkylene group, a cycloalkenylene group, an arylene group, a divalent heterocyclic group or an imino group, which may further have a substituent.

In formula (A-1), each of $Ra_1$ to $Ra_8$ independently represents a hydrogen atom, a halogen atom (preferably fluorine atom, chlorine atom, bromine atom or iodine atom), an alkyl group, an aryl group or a heterocyclic group. For the reason that a low-polarity substituent is advantageous for the transport of a hole, each of $Ra_1$ to $Ra_8$ is preferably a hydrogen atom, an alkyl group or an aryl group, and more preferably a hydrogen atom.

In the case where each of $Ra_1$ to $Ra_8$ represents an alkyl group, the alkyl group is preferably an alkyl group having a carbon number of 1 to 18, more preferably an alkyl group having a carbon number of 1 to 12, still more preferably an alkyl group having a carbon number of 1 to 6. Moreover, the alkyl group may be linear, branched or cyclic. Specifically, the alkyl group is preferably a methyl group, an ethyl group, a propyl group, a butyl group, a hexyl group or a cyclohexyl group.

In the case where each of $Ra_1$ to $Ra_8$ represents an aryl group, the aryl group is preferably an aryl group having a carbon number of 6 to 18, more preferably an aryl group having a carbon number of 6 to 14, still more preferably an aryl group having a carbon number of 6 to 10. Specifically, the aryl group is preferably a phenyl group or a naphthyl group.

In the case where each of $Ra_1$ to $Ra_8$ represents a heterocyclic group, the heterocyclic group is preferably a heterocyclic group having a carbon number of 4 to 16, more preferably a heterocyclic group having a carbon number of 4 to 10, and specifically, the heterocyclic group is preferably a pyridyl group, a pyrimidyl group, a furanyl group or a thienyl group.

In the case where each of $Ra_1$ to $Ra_8$ represents an alkyl group, an aryl group or a heterocyclic group, these groups may further have a substituent. Specific examples of the further substituent include the later-described substituent W.

Furthermore, if possible, adjacent members out of $Ra_1$ to $Ra_8$ may be combined with each other to form a ring. Examples of the ring include the later-described ring R. The ring is preferably, for example, a benzene ring, a naphthalene ring, an anthracene ring, a pyridine ring or a pyrimidine ring.

In formula (A-1), Xa indicates a portion forming a condensed ring and represents a single bond, an oxygen atom, a sulfur atom, an alkylene group, an alkenylene group, a cycloalkylene group, a cycloalkenylene group, an arylene group, a divalent heterocyclic group or an imino group. In the case where each of Xa represents an alkylene group, an alkenylene group, a cycloalkylene group, a cycloalkenylene group, an arylene group, a divalent heterocyclic group or an imino group, these groups may further have a substituent. Specific examples of the further substituent include the later-described substituent W Xa is preferably a single bond, an alkylene group having a carbon number of 1 to 12, an alkenylene group having a carbon number of 2 to 12, an arylene group having a carbon number of 6 to 14, a heterocyclic group having a carbon number of 4 to 13, an oxygen atom, a sulfur atom, or an imino group containing a hydrocarbon group having a carbon number of 1 to 12 (preferably an aryl group or an alkyl group) (e.g., phenylimino group, methylimino group, tert-butylimino group), more preferably a single bond, an alkylene group having a carbon number of 1 to 6 (e.g., methylene group, 1,2-ethylene group, 1,1-dimethylmethylene group), an alkenylene group having a carbon number of 2 (e.g., —CH$_2$=CH$_2$—), or an arylene group having a carbon number of 6 to 10 (e.g., 1,2-phenylene group, 2,3-naphthylene group).

Specific examples of the group represented by (A-1) include the groups N1 to N13 illustrated later. Other examples include the groups shown below. However, the present invention is not limited thereto.

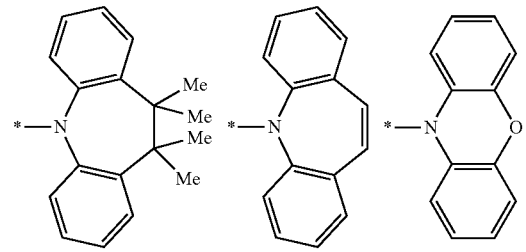

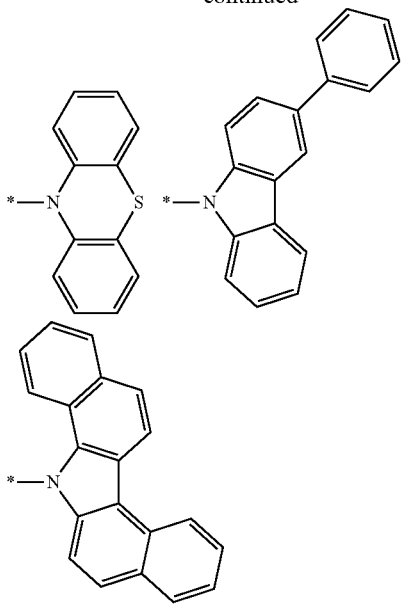

In formula (1), the substituted amino group containing three or more ring structures also includes a group represented by the following formula (A-2):

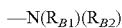  Formula (A-2):

Each of $R_{B1}$ and $R_{B2}$ independently represents a hydrogen atom, a halogen atom, r an alkyl group, an aryl group or a heterocyclic group, provided that at least either $R_{B1}$ or $R_{B2}$ represents an aryl group or a heterocyclic group and the number of rings contained in $R_{B1}$ and $R_{B2}$ is 3 or more in total.

In formula (A-2), each of $R_{B1}$ and $R_{B2}$ is preferably an alkyl group, an aryl group or a heterocyclic group, more preferably an aryl group or a heterocyclic group, still more preferably an aryl group because of its excellent hole transportability.

In the case where each of $R_{B1}$ and $R_{B2}$ represents an alkyl group, the alkyl group is preferably an alkyl group having a carbon number of 1 to 18, more preferably an alkyl group having a carbon number of 1 to 12, and specifically, the alkyl group is preferably a methyl group, an ethyl group, a propyl group or a butyl group.

In the case where each of $R_{B1}$ and $R_{B2}$ represents an aryl group, the aryl group is preferably an aryl group having a carbon number of 6 to 18, more preferably an aryl group having a carbon number of 6 to 14, and specifically, the aryl group is preferably a phenyl group, a naphthyl group, a fluorenyl group, a biphenyl group (more specific examples of these groups include the later-described A1 to A11), an anthryl group or a pyrenyl group.

In the case where each of $R_{B1}$ and $R_{B2}$ represents a heterocyclic group, the heterocyclic group is preferably a heterocyclic group having a carbon number of 4 to 16, more preferably a heterocyclic group having a carbon number of 4 to 10, and specifically, the heterocyclic group is preferably a carbazolyl group, an indolyl group or an imidazolyl group.

In the case where each of $R_{B1}$ and $R_{B2}$ represents an alkyl group, an aryl group or a heterocyclic group, these groups may further have a substituent. Specific examples of the further substituent include the later-described substituent W.

Preferably, at least either $R_{B1}$ or $R_{B2}$ is a group represented by the following formula (b-1), and more preferably, both $R_{B1}$ and $R_{B2}$ are a group represented by the following formula (b-1).

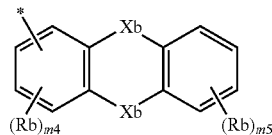  Formula (b-1)

wherein each Rb independently represents a halogen atom, an alkyl group, an aryl group or a heterocyclic group, which groups may further have a substituent; each Xb independently represents a single bond, an oxygen atom, a sulfur atom, an alkylene group, an alkenylene group, a cycloalkylene group, a cycloalkenylene group, an arylene group, a divalent heterocyclic group or an imino group, which groups may further have a substituent; when a plurality of Rb's are present, they may be the same or different; two Xb's may be the same or different; * represents the bonding position; m4 represents an integer of 0 to 3; and m5 represents an integer of 0 to 4.

In the case where Rb represents an alkyl group, an aryl group or a heterocyclic group, these groups may further have a substituent. Specific examples of the further substituent include the later-described substituent W.

Furthermore, if possible, adjacent members out of a plurality of Rb's may be combined with each other to form a ring. Examples of the ring include the later-described ring R. The ring is preferably, for example, a benzene ring, a naphthalene ring.

Rb is preferably a halogen atom, an alkyl group having a carbon number of 1 to 18, an aryl group having a carbon number of 6 to 18, or a heterocyclic group having a carbon number of 4 to 16, more preferably an alkyl group having a carbon number of 1 to 12, or an aryl group having a carbon number of 6 to 14, still more preferably an alkyl group having a carbon number of 1 to 6, or an aryl group having a carbon number of 6 to 10, yet still more preferably an alkyl group having a carbon number of 1 to 6.

It is also preferred that m4 is 0 and m5 is 0.

Xb represents a single bond, an oxygen atom, a sulfur atom, an alkylene group, an alkenylene group, a cycloalkylene group, a cycloalkenylene group, an arylene group, a divalent heterocyclic group or an imino group. Xb is preferably a single bond, an alkylene group having a carbon number of 1 to 12, an alkenylene group having a carbon number of 2 to 12 (e.g., $-CH_2=CH_2-$), an arylene group having a carbon number of 6 to 14 (e.g., 1,2-phenylene group, 2,3-naphthylene group), a heterocyclic group having a carbon number of 4 to 13, an oxygen atom, a sulfur atom, or an imino group containing a hydrocarbon group having a carbon number of 1 to 12 (preferably an aryl group or an alkyl group) (e.g., phenylimino group, methylimino group, tert-butylimino group), still more preferably a single bond, an alkylene group having a carbon number of 1 to 6 (e.g., methylene group, 1,2-ethylene group, 1,1-dimethylmethylene group), an oxygen atom, a sulfur atom, or an imino group having a carbon number of 1 to 6.

In the case where each of Xb represents an alkylene group, an alkenylene group, a cycloalkylene group, a cycloalkenylene group, an arylene group, a divalent heterocyclic group or an imino group, these groups may further have a substituent. Specific examples of the further substituent include the later-described substituent W.

Specific examples of the group represented by formula (b-1) are illustrated below, but the present invention is not limited thereto.

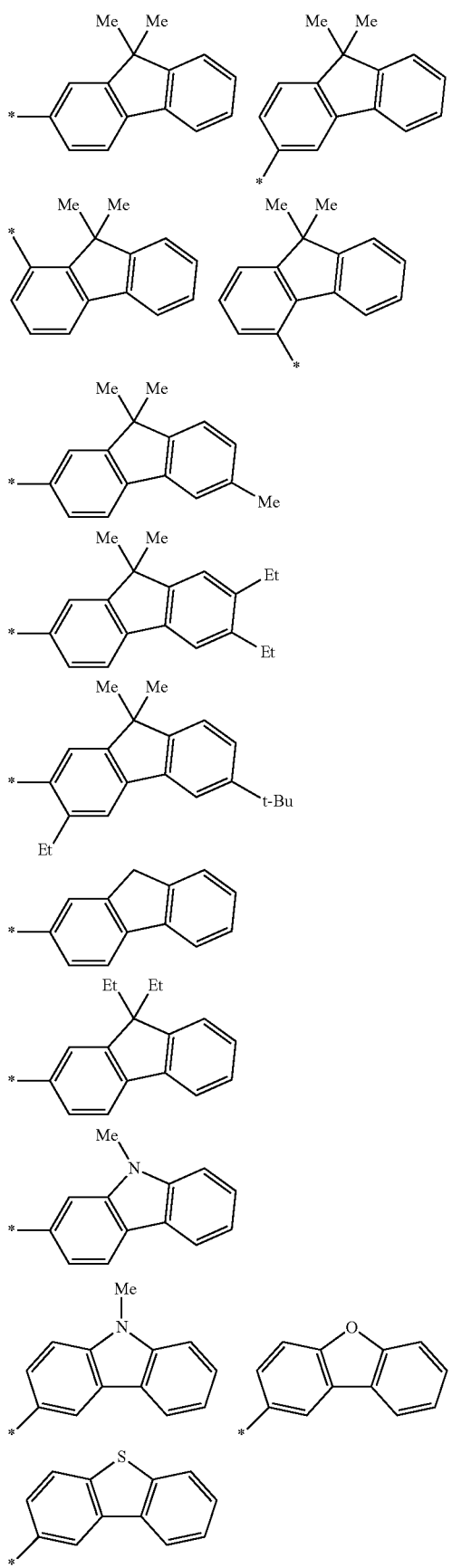
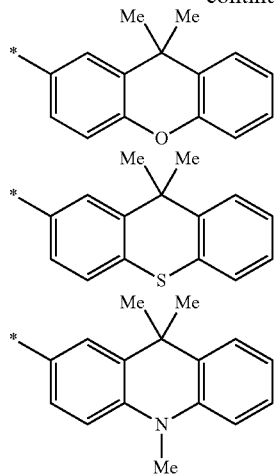

-continued

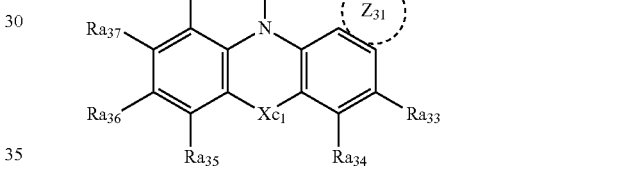
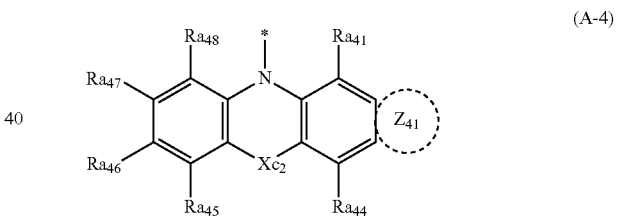
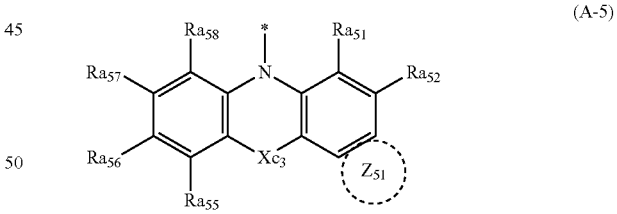

In formula (1), the substituted amino group containing three or more ring structures also includes a group represented by the following formula (A-3), a group represented by the following formula (A-4) or a group represented by the following formula (A-5):

(A-3)

(A-4)

(A-5)

wherein each of $Ra_{33}$ to $Ra_{38}$, $Ra_{41}$, $Ra_{44}$ to $Ra_{48}$, $Ra_{51}$, $Ra_{52}$, and $Ra_{55}$ to $Ra_{58}$ independently represents a hydrogen atom, a halogen atom or an alkyl group, which may further have a substituent; * represents the bonding position; each of $Xc_1$, $Xc_2$ and $Xc_3$ independently represents a single bond, an oxygen atom, a sulfur atom, an alkylene group, a silylene group, an alkenylene group, a cycloalkylene group, a cycloalkenylene group, an arylene group, a divalent heterocyclic group or an imino group, which may further have a substituent; each of $Z_{31}$, $Z_{41}$ and $Z_{51}$ independently represents a cycloalkyl ring, an aromatic hydrocarbon ring or an aromatic heterocyclic ring, which may further have a substituent.

In formulae (A-3) to (A-5), each of $Ra_{33}$ to $Ra_{38}$, $Ra_{41}$, $Ra_{44}$ to $Ra_{48}$, $Ra_{51}$, $Ra_{52}$ and $Ra_{55}$ to $Ra_{58}$ independently represents a hydrogen atom, a halogen atom (preferably fluorine atom, chlorine atom, bromine atom or iodine atom) or an alkyl group and is preferably a hydrogen atom or an alkyl group because a low-polarity substituent is advantageous for the transport of a hole, and is more preferably a hydrogen atom.

In the case where each of $Ra_{33}$ to $Ra_{38}$, $Ra_{41}$, $Ra_{44}$ to $Ra_{48}$, $Ra_{51}$, $Ra_{52}$ and $Ra_{55}$ to $Ra_{58}$ represents an alkyl group, the alkyl group is preferably an alkyl group having a carbon number of 1 to 18, more preferably an alkyl group having a carbon number of 1 to 12, still more preferably an alkyl group having a carbon number of 1 to 6, and specifically, the alkyl group is preferably a methyl group, an ethyl group, a propyl group, a butyl group, a hexyl group or a cyclohexyl group.

In formulae (A-3) to (A-5), adjacent members out of $Ra_{33}$ to $Ra_{38}$, $Ra_{41}$, $Ra_{44}$ to $Ra_{48}$, $Ra_{51}$, $Ra_{52}$ and $Ra_{55}$ to $Ra_{58}$ may be combined with each other to form a ring. Examples of the ring include the later-described ring R. The ring is preferably a benzene ring, a naphthalene ring, an anthracene ring, a pyridine ring, a pyrimidine ring or the like.

Each of $Xc_1$, $Xc_2$ and $Xc_3$ independently represents a single bond, an oxygen atom, a sulfur atom, an alkylene group, a silylene group, an alkenylene group, a cycloalkylene group, a cycloalkenylene group, an arylene group, a divalent heterocyclic group or an imino group. In the case where each of $Xc_1$, $Xc_2$ and $Xc_3$ represents an alkylene group, a silylene group, an alkenylene group, a cycloalkylene group, a cycloalkenylene group, an arylene group, a divalent heterocyclic group or an imino group, these groups may further have a substituent. Examples of the further substituent include the later-described substituent W.

Each of $Xc_1$, $Xc_2$ and $Xc_3$ is preferably a single bond, an alkylene group having a carbon number of 1 to 12, an alkenylene group having a carbon number of 2 to 12, an arylene group having a carbon number of 6 to 14, a heterocyclic group having a carbon number of 4 to 13, an oxygen atom, a sulfur atom or, an imino group (e.g., phenylimino group, methylimino group, tert-butylimino group) having a hydrocarbon group with a carbon number of 1 to 12 (preferably an aryl group or an alkyl group), more preferably a single bond, an alkylene group having a carbon number of 1 to 6 (e.g., methylene group, 1,2-ethylene group, 1,1-dimethylmethylene group), an alkenylene group having a carbon number of 2 (e.g., —CH$_2$=CH$_2$—), or an arylene group having a carbon number of 6 to 10 (e.g., 1,2-phenylene group, 2,3-naphthylene group).

Each of $Z_{31}$, $Z_{41}$ and $Z_{51}$ independently represents a cycloalkyl ring, an aromatic hydrocarbon ring or an aromatic heterocyclic ring. In formulae (A-3) to (A-5), each of $Z_{31}$, $Z_{41}$ and $Z_{51}$ is condensed with a benzene ring. For the reason that high heat resistance of the device and high hole transportability can be expected, each of $Z_{31}$, $Z_{41}$ and $Z_{51}$ is preferably an aromatic heterocyclic ring.

Specific examples of the groups represented by formulae (A-3) to (A-5) are illustrated below, but the present invention is not limited thereto.

Specific examples of the groups represented by formulae (A-1) and (A-3) to (A-5) include, but are not limited to, the groups exemplified below as N1 to N135. Among the groups represented by formulae (A-1) to (A-5), N-1 to N-93 are preferred, N-1 to N-79 are more preferred, N-1 to N-37 are still more preferred, N-1 to N-3, N-12 to N-22 and N-24 to N-35 are yet still more preferred, N-1 to N-3, N-17 to N-22 and N-30 to N-35 are even yet still more preferred, and N-1 to N-3, N-17 to N-19 and N-30 to N-32 are most preferred.

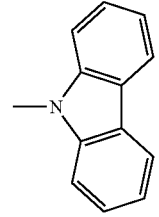

N-1

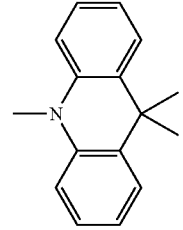

N-2

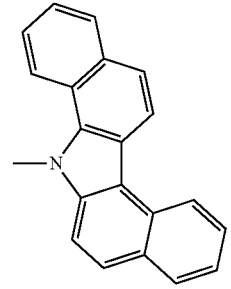

N-3

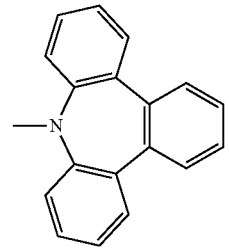

N-4

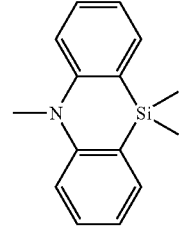

N-5

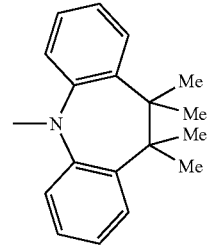

N-6

N-7
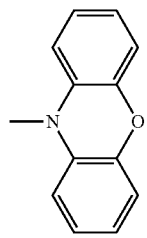
N-8
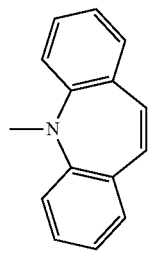
N-9
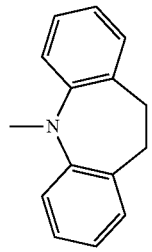
N-10
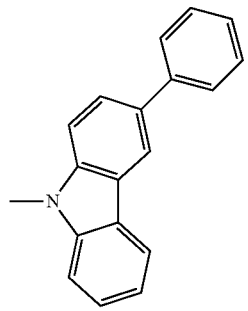
N-11
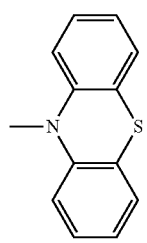
N-12
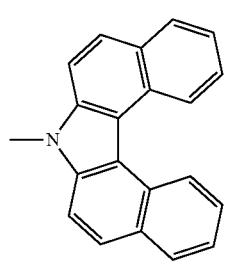
N-13
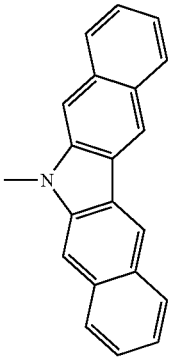
N-14
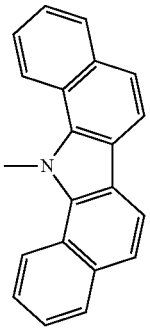
N-15
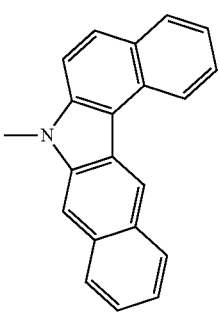
N-16
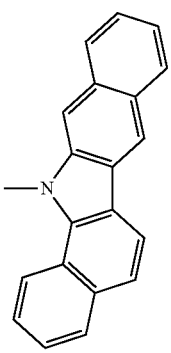
N-17
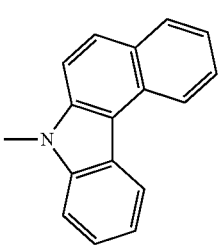

-continued
N-18 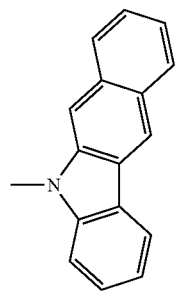
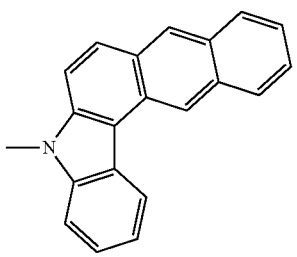 N-23
N-19 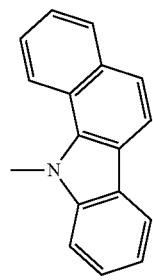
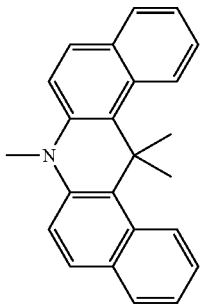 N-24
N-20 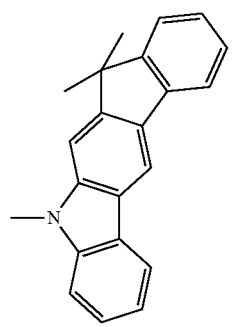
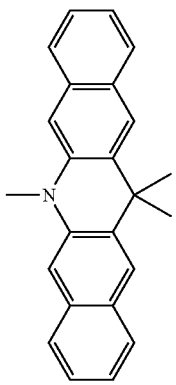 N-25
N-21 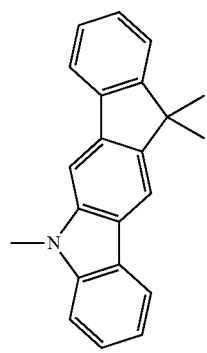
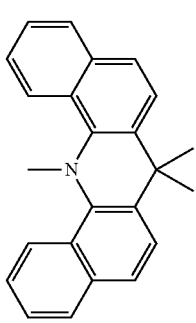 N-26
N-22 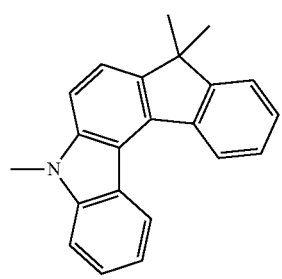
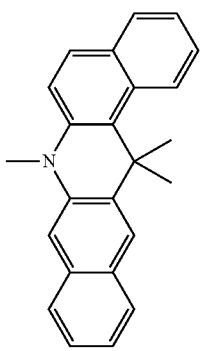 N-27

N-28 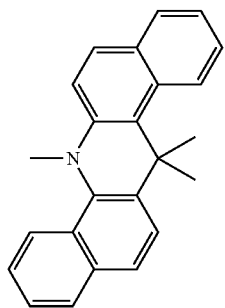
N-29 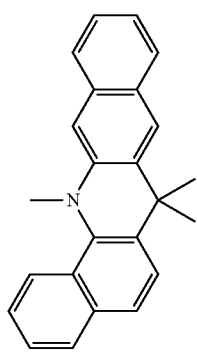
N-30 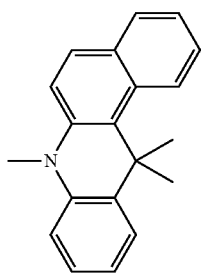
N-31 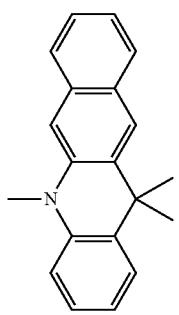
N-32 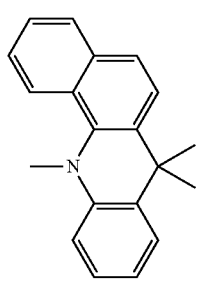
N-33 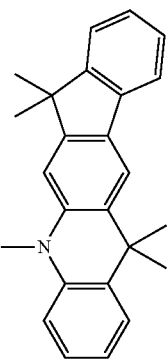
N-34 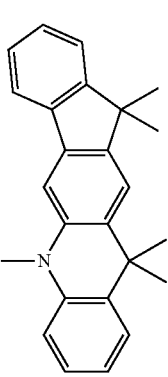
N-35 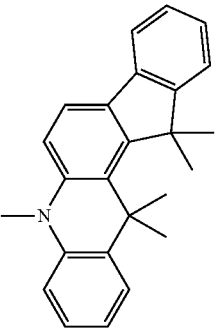
N-36 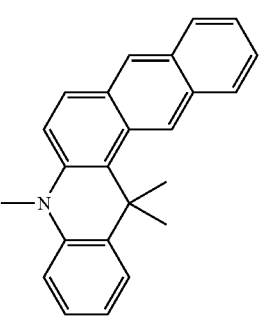
N-37 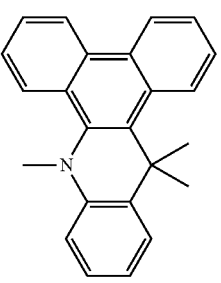

N-38
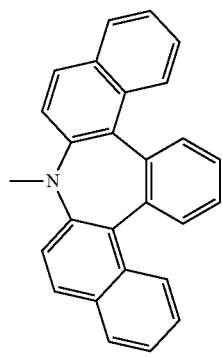
N-39
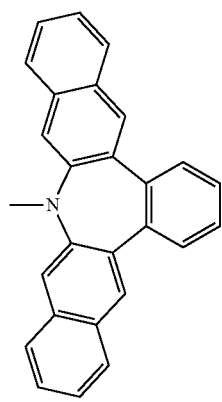
N-40
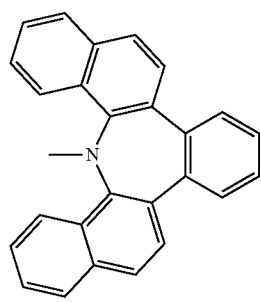
N-41
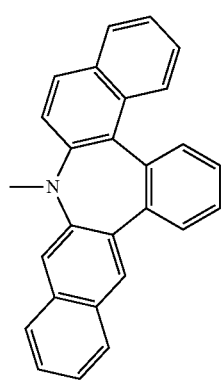
N-42
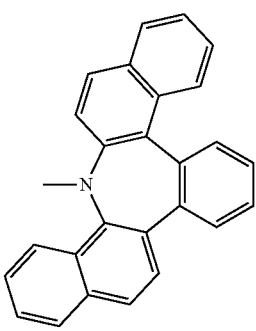
N-43
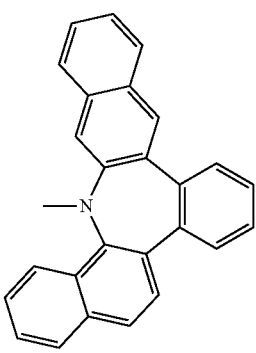
N-44
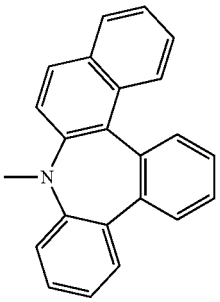
N-45
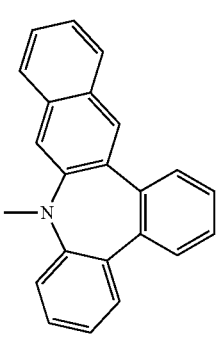
N-46

-continued
N-47
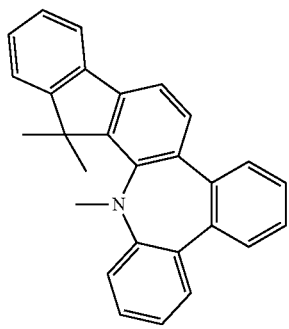
N-48
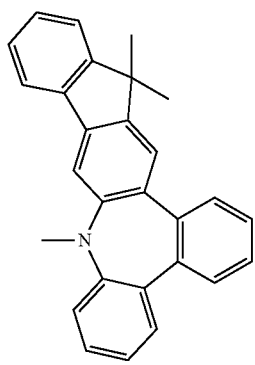
N-49
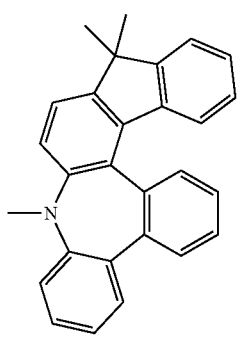
N-50
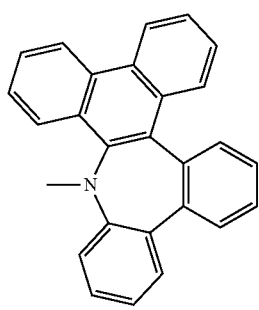
N-51
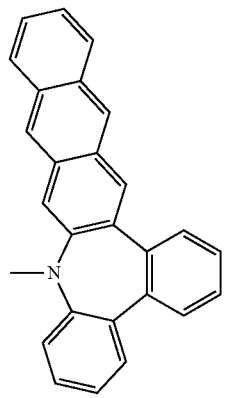
N-52
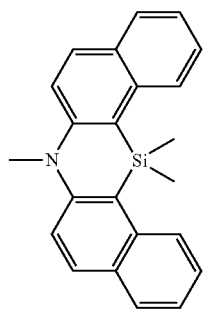
N-53
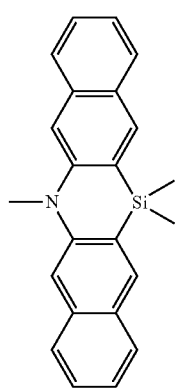
N-54
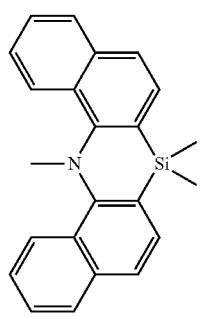

N-55
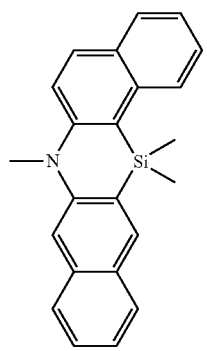
N-56
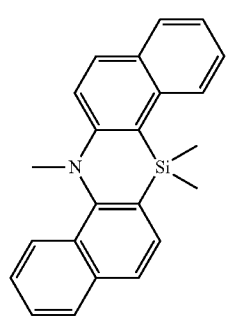
N-57
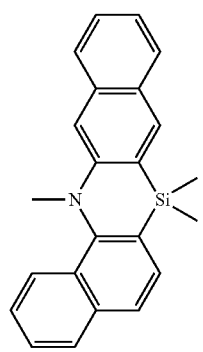
N-58
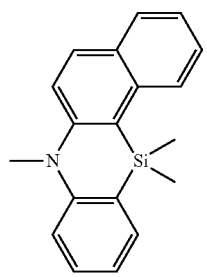
N-59
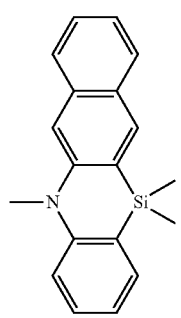
N-60
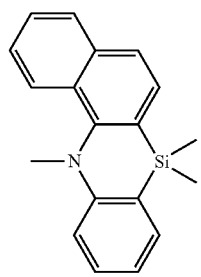
N-61
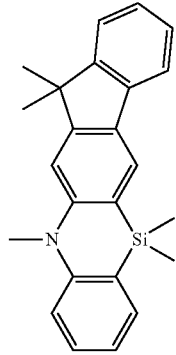
N-62
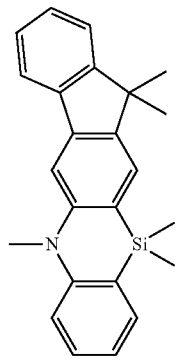
N-63
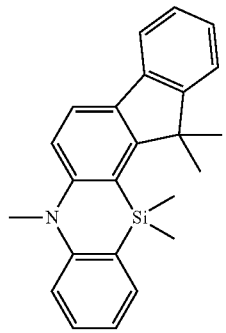
N-64
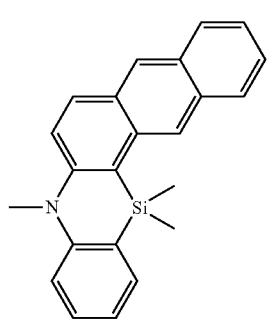

N-65 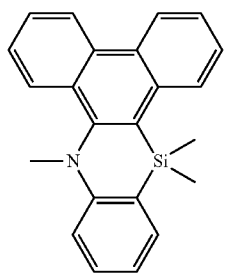
N-66 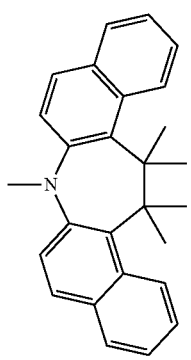
N-67 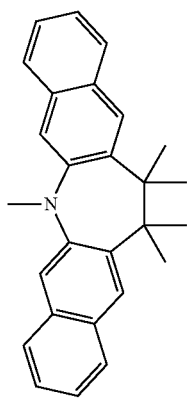
N-68 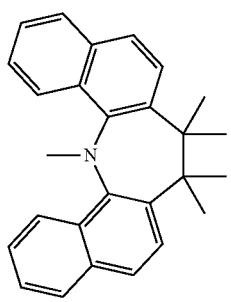
N-69 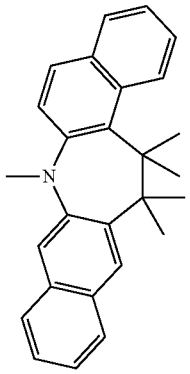
N-70 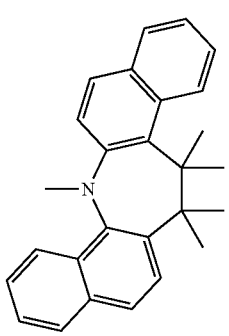
N-71 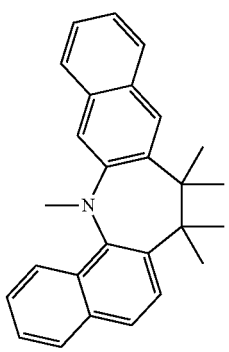
N-72 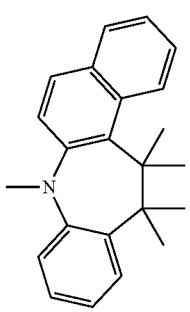

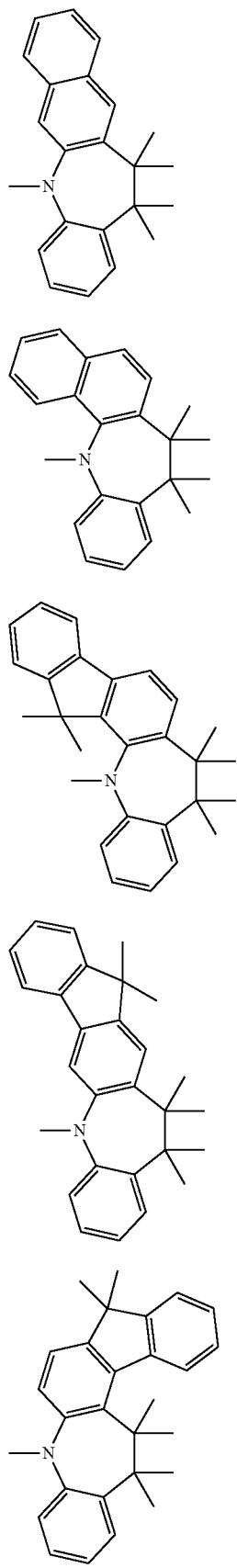
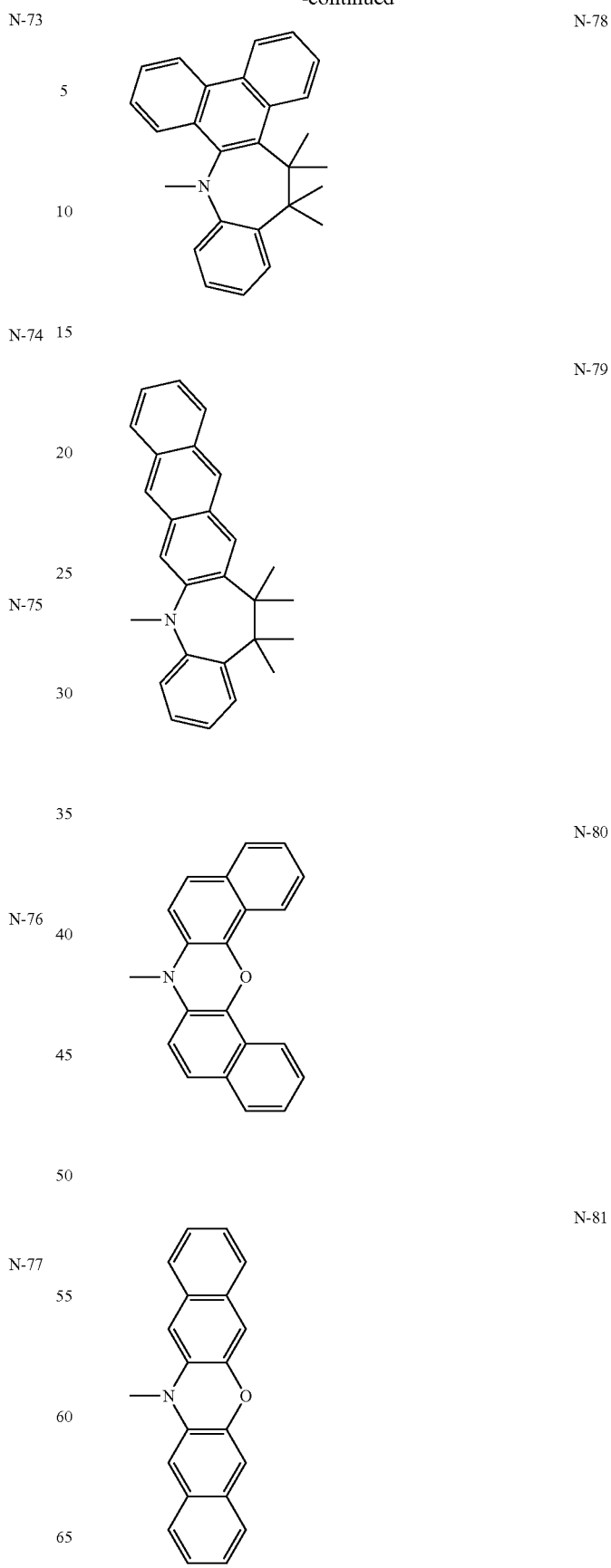

N-82 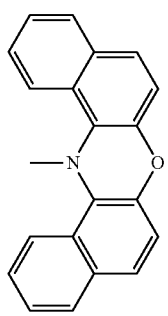
N-83 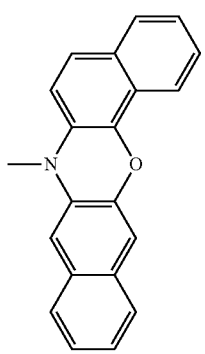
N-84 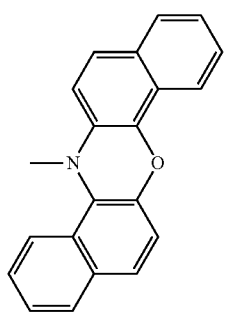
N-85 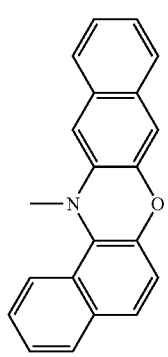
N-86 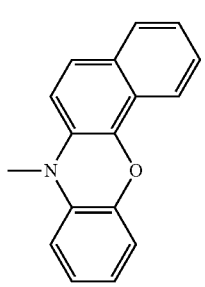
N-87 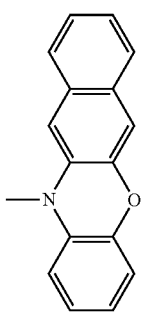
N-88 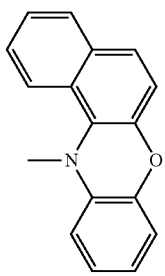
N-89 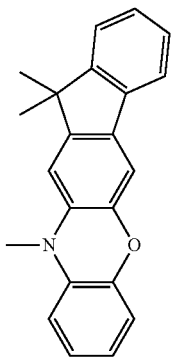
N-90 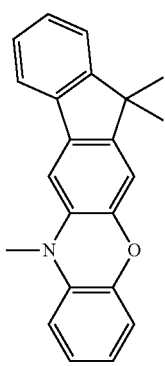
N-91 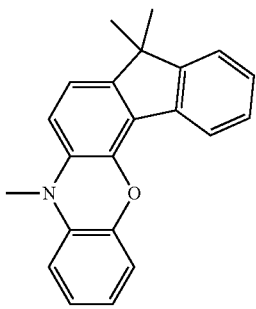

N-92 
N-96 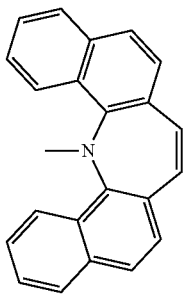
N-93 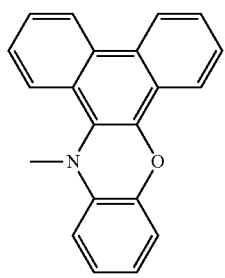
N-97 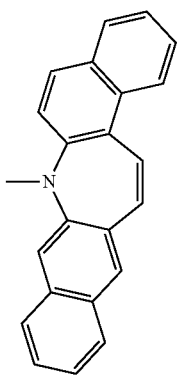
N-94 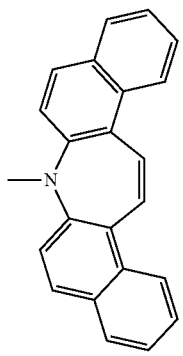
N-98 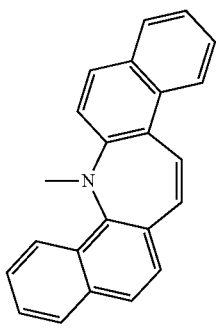
N-95 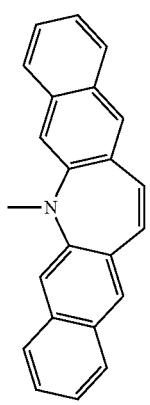
N-99 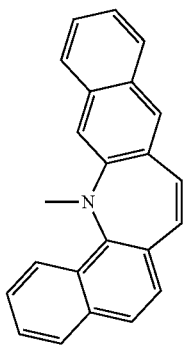

N-100 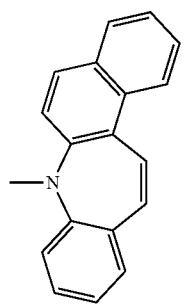
N-101 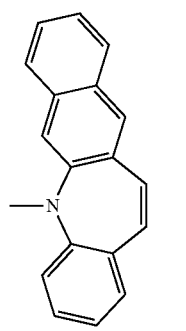
N-102 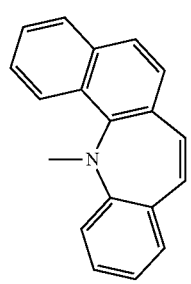
N-103 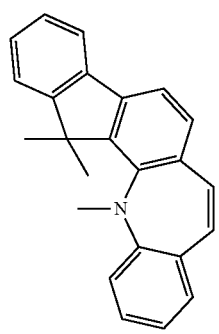
N-104 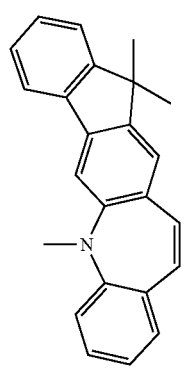
N-105 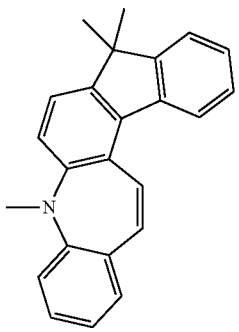
N-106 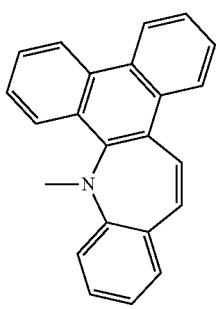
N-107 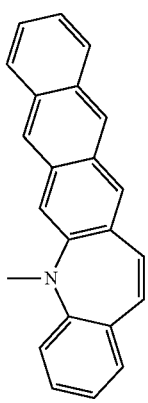
N-108 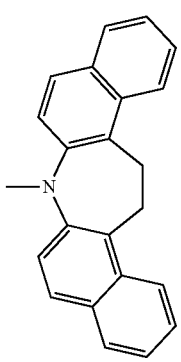

N-109
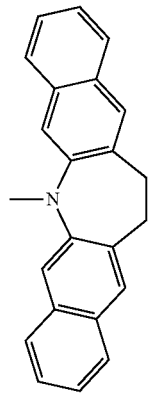
N-110
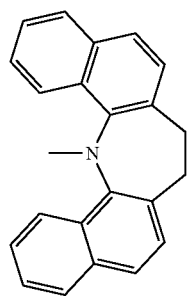
N-111
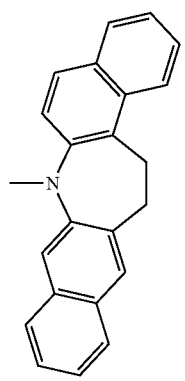
N-112
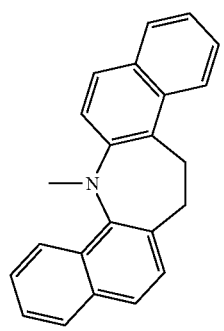
N-113
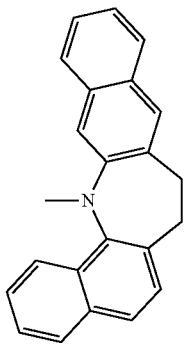
N-114
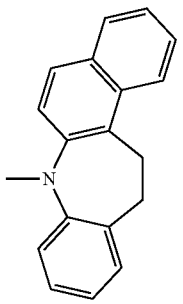
N-115
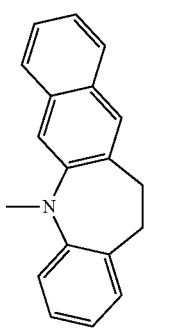
N-116
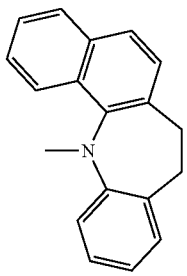
N-117
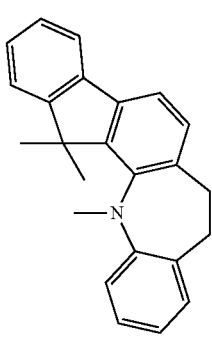

N-118
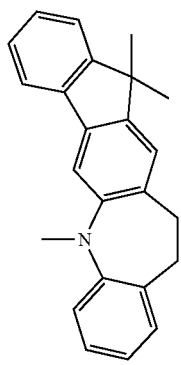
N-119
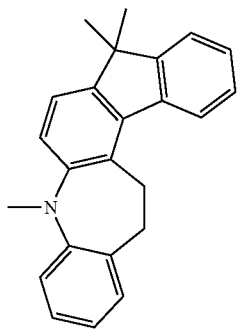
N-120
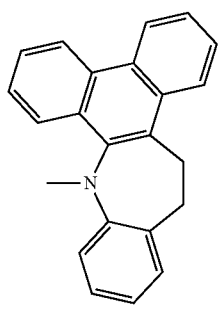
N-121
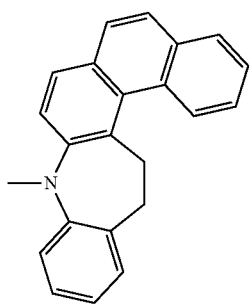
N-122
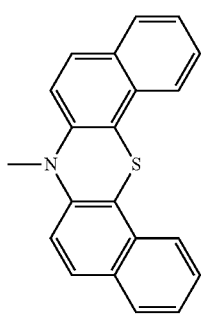
N-123
N-124
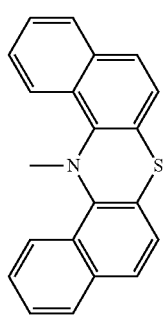
N-125
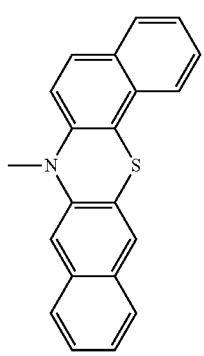
N-126
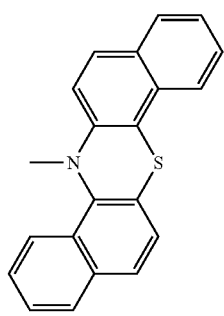

N-127 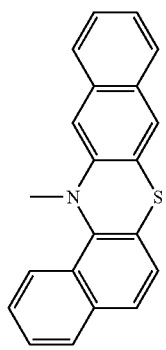
N-128 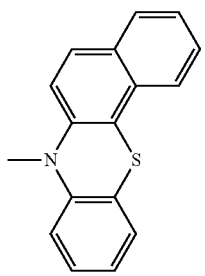
N-129 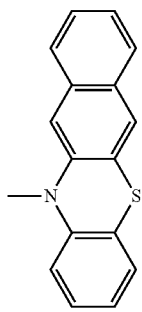
N-130 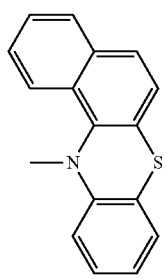
N-131 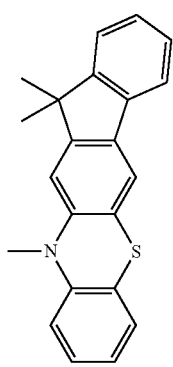
N-132 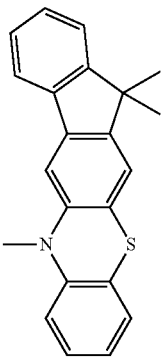
N-133 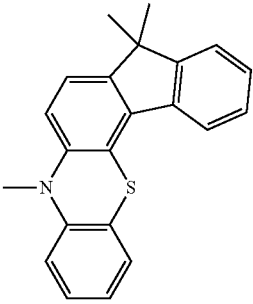
N-134 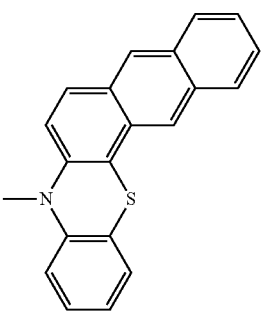
N-135 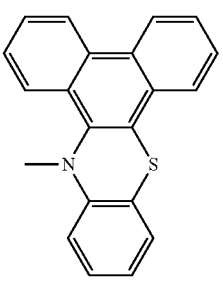
The compound represented by formula (Y1) for use in the present invention is preferably a compound represented by formula (F-1):
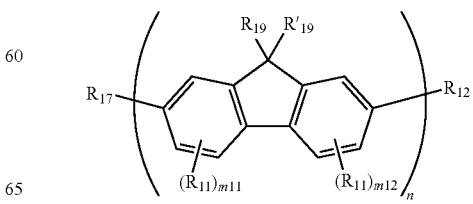
Formula (F-1)

wherein $R_{11}$ represents a halogen atom, an alkyl group, an aryl group, a heterocyclic group, a hydroxyl group, an amino group or a mercapto group, which may further have a substituent; each of $R_{12}$, $R_{17}$ independently represents a hydrogen atom, a halogen atom, an alkyl group, an aryl group, a heterocyclic group, a hydroxyl group, an amino group or a mercapto group, which may further have a substituent; each of $R_{19}$ and $R'_{19}$ independently represents a hydrogen atom, a halogen atom, or an alkyl group, an aryl group, a heterocyclic group, a hydroxyl group, an amino group or a mercapto group, which may further have a substituent; provided that at least one of $R_{12}$ and $R_{17}$ represents a substituted amino group containing three or more ring structures; each of m11 and m12 independently represents an integer of 0 to 3; each $R_{11}$ may be the same as or different from every other $R_{11}$ when a plurality of $R_{11}$'s are present in formula (F-1); and n represents an integer of 1 to 4.

$R_{11}$ has the same meaning as the halogen atom, alkyl group, aryl group, heterocyclic group, hydroxyl group, amino group or mercapto group in $R_1$ to $R_8$ in formula (1), and the preferred ranges are also the same. $R_{11}$ is preferably an alkyl group, an aryl group or a heterocyclic group, more preferably an alkyl group or an aryl group.

Each of $R_{19}$ and $R'_{19}$ has the same meaning as the hydrogen atom, halogen atom, alkyl group, an aryl group, heterocyclic group, hydroxyl group, amino group or mercapto group in $R_9$ to $R'_9$ in formula (1), and their preferred ranges are also the same.

For the reason that a simple structure is advantageous in view of the cost, m1 is preferably from 0 to 2, more preferably 0.

Each of $R_{12}$ and $R_{17}$ is preferably a hydrogen atom, an alkyl group having a carbon number of 1 to 18, an aryl group having a carbon number of 6 to 100, a heterocyclic group having a carbon number of 4 to 16, a substituted amino group having a carbon number of 2 to 80, or a substituted mercapto group having a carbon number of 1 to 18, more preferably a hydrogen atom, an alkyl group having a carbon number of 1 to 12, an aryl group having a carbon number of 6 to 80, or a substituted amino group having a carbon number of 6 to 60, still more preferably a hydrogen atom, an alkyl group having a carbon number of 1 to 6, an aryl group having a carbon number of 6 to 60, or a substituted amino group having a carbon number of 10 to 50.

Also, in the case where each of these members represents a substituted amino group containing three or more ring structures, examples thereof include the groups represented by formulae (A-1) and (A-2).

Specific preferred examples of $R_{12}$ and $R_{17}$ include a hydrogen atom, a methyl group, an ethyl group, a propyl group, a butyl group, a hexyl group, a cyclohexyl group, a phenyl group, a naphthyl group, a fluorenyl group, and the groups set forth in the description of formulae (A-1) and (A-2).

Members $R_{12}$ and $R_{17}$ may be the same or different, but the members are preferably the same, because the synthesis is easy.

In formula (F-1), n indicates the number of repeating units in the parenthesis, and n represents an integer of 1 to 4 and is preferably from 1 to 3, more preferably 1 or 2, still more preferably 2, because dark current and heat resistance in the case wherein a devise is constituted become advantage.

In the case where the fluorene compound for use in the present invention is used in the electron blocking layer, its ionization potential (Ip) must be smaller than Ip of the material assuming hole transport in the photoelectric conversion layer, because a hole needs to be received without barriers from the material assuming hole transport in the photoelectric conversion layer. In particular, when a material having absorption sensitivity in the visible region is selected, for conforming with a larger number of materials, the ionization potential of the fluorene compound for use in the present invention is preferably 5.8 eV or less, more preferably less than 5.5 eV. When Ip is 5.8 eV or less, this produces an effect that no barrier to charge transport is generated and high charge trapping efficiency and high responsivity are brought out.

Also, Ip is preferably 4.9 eV or more, more preferably 5.0 eV or more. Thanks to Ip of 4.9 eV or more, a higher dark current reducing effect can be obtained.

In this connection, Ip of each compound can be measured by ultraviolet photoelectron spectroscopy (UPS) or photoelectron spectrometer in air (for example, AC-2 manufactured by Riken Keiki Co., Ltd.).

Ip of the fluorene compound for use in the present invention can be adjusted to the range above, for example, by changing the substituent bonded to the fluorene structure.

Incidentally, when a material having a structure that strongly interacts with the photoelectric conversion layer containing a material with deep Ea is used, a source charge is readily formed at the interface. For example, as regards the molecule coming into contact with the material having deep Ea, when a material of high planarity is used, π electrons formed in a planar fashion tend to readily interact with the molecular orbital of the material having deep Ea, and an interface allowing for an increase in the source charge is liable to be formed. Accordingly, the fluorene compound for use in the present invention preferably contains no condensed ring structure composed of 5 or more rings. Furthermore, for suppressing the intermolecular interaction, a steric hindrance may be imparted, but an excessively bulky steric hindrance inhibits signal charge transport at the interface. Also from this reason, it is preferred not to contain a condensed ring structure composed of 5 or more rings.

Specific examples of the fluorene compound for use in the present invention are illustrated below, but the present invention is not limited to the following specific examples. Also, in formulae (a) to (h), when the members in each pair of "$R_{12}$ and $R_{17}$", "$R_{22a}$ and $R_{22b}$", "$R_{32}$ and $R_{37}$, and $R'_{32}$ and $R'_{37}$" or the like are not the same, they can make a combination other than the structures illustrated.

Incidentally, the partial structures in the following compound examples are shown below. Also, Me: methyl group, Et: ethyl group, i-Pro: isopropyl group, n-Bu: n-butyl group, t-Bu: tert-butyl group, 2-MeOEt: 2-methoxy-1-ethyl group, Ph: phenyl group, 2-tol: 2-tolyl group, 3-tol: 3-tolyl group, 4-tol: 4-tolyl group, 1-Np: 1-naphthyl group, 2-Np: 2-naphthyl group, 2-An: 2-anthryl group, and 2-Fn: 2-phenanthryl group.

B-1

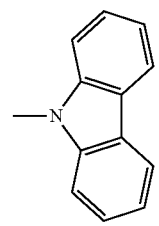

B-2
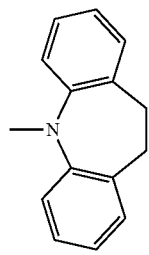
B-3
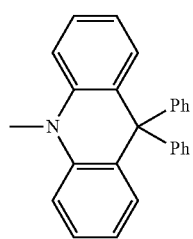
B-4
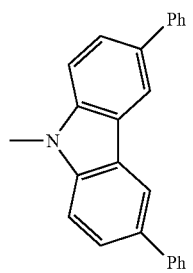
B-8
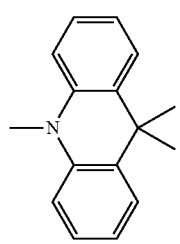
B-14
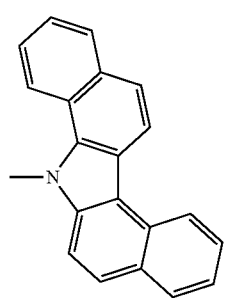
B-17
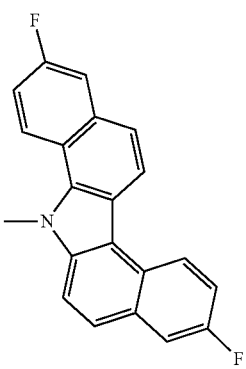
B-18
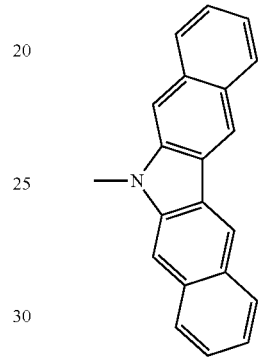
B-20
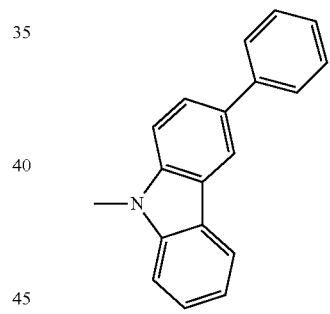
B-21
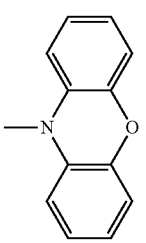
B-26
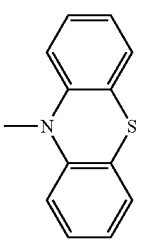

B-27 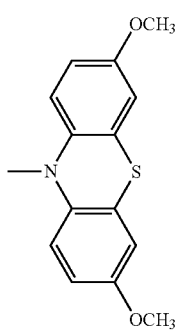
B-29 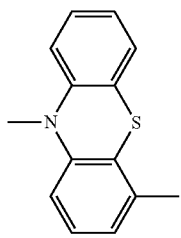
B-31 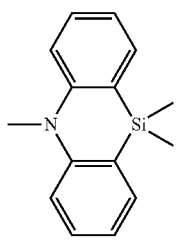
B-42 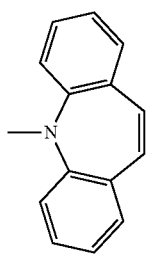
B-47 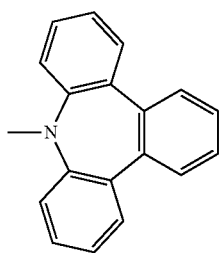
B-61 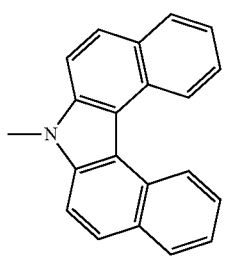
B-62 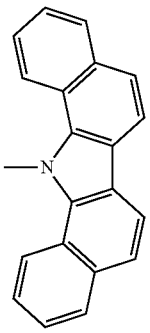
B-63 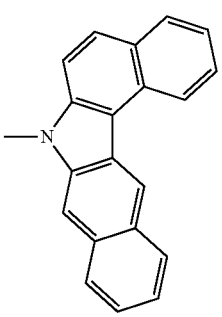
B-65 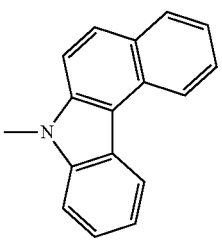
B-67 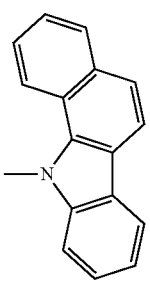
B-69 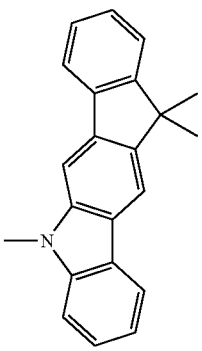

B-71 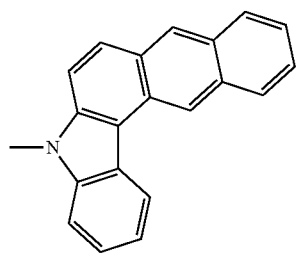
B-72 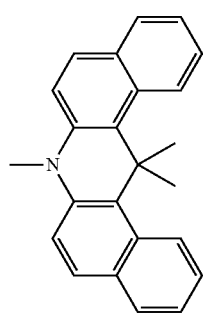
B-73 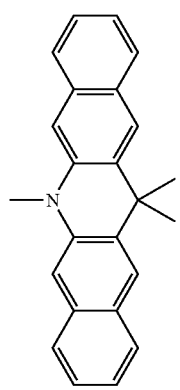
B-74 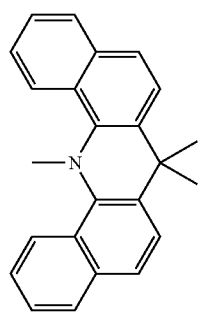
B-75 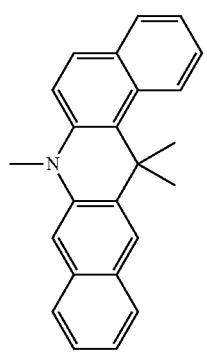
B-76 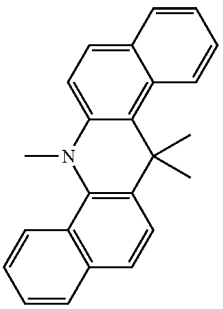
B-78 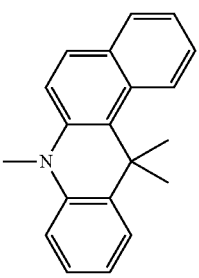
B-80 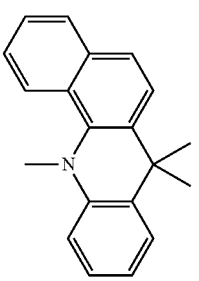
B-81 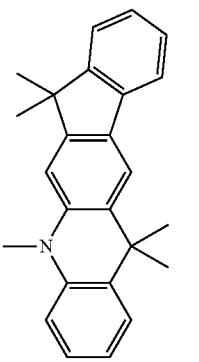
B-83 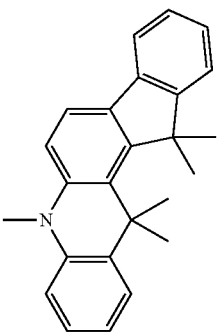

B-84 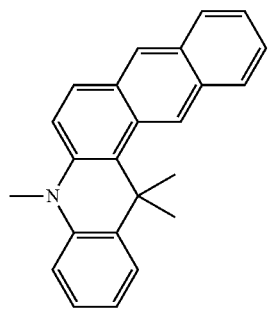
B-85 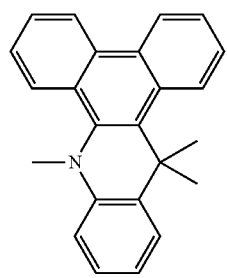
B-86 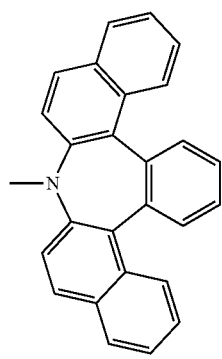
B-87 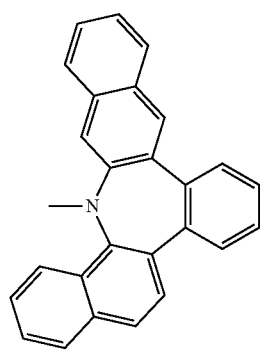
B-88 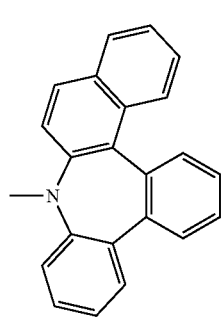
B-91 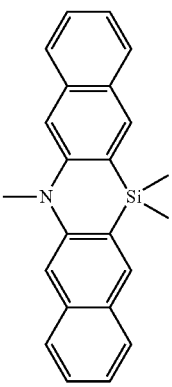
B-92 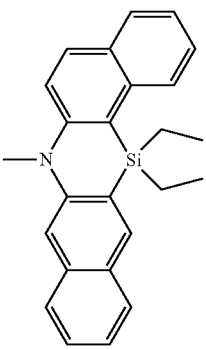
B-93 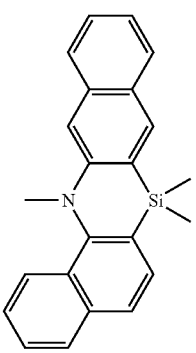
B-94 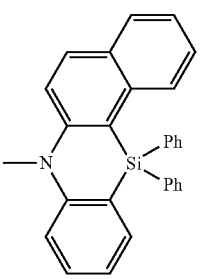

B-96 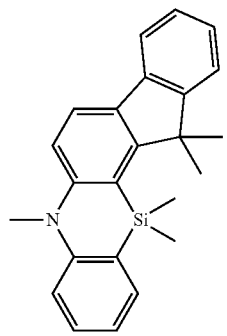
B-100 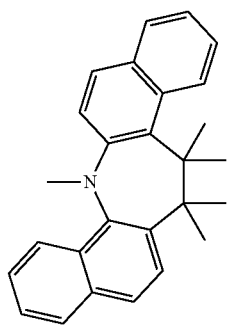
B-97 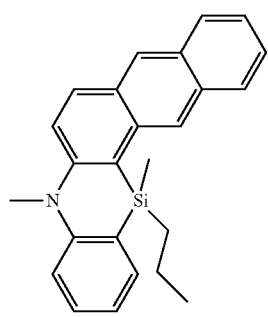
B-101 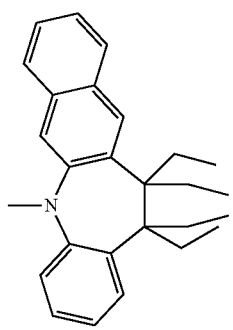
B-98 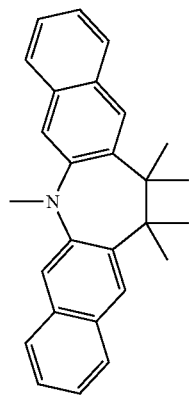
B-103 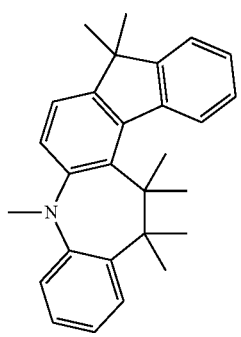
B-99 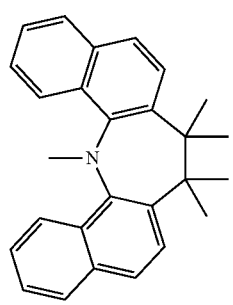
B-105 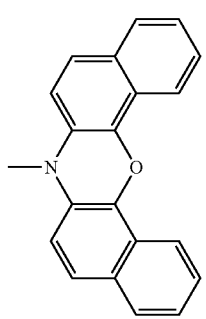

B-106 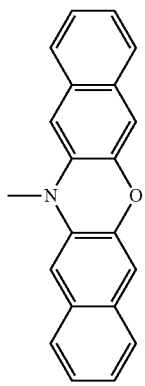
B-112 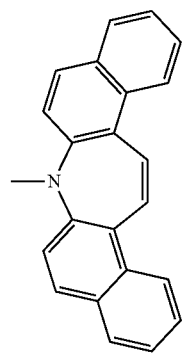
B-107 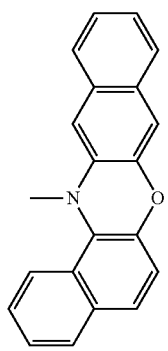
B-113 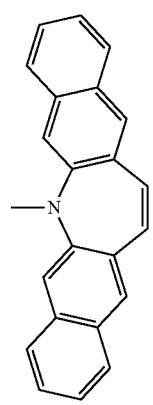
B-109 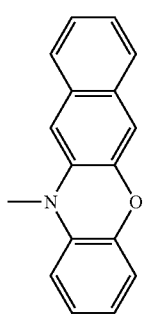
B-114 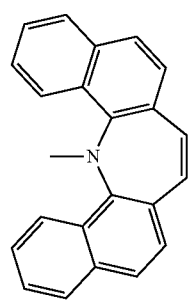
B-110 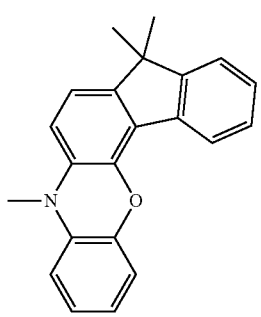
B-116 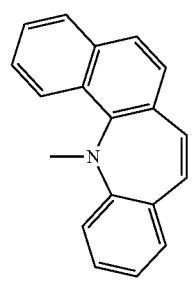

B-117
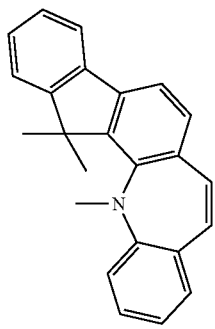
B-119
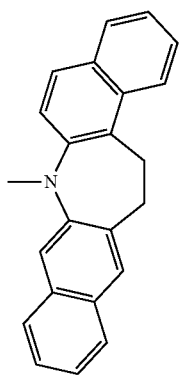
B-120
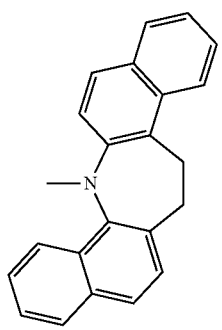
B-121
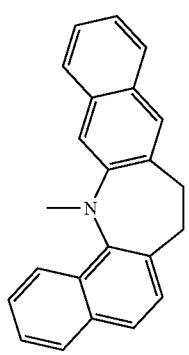
B-123
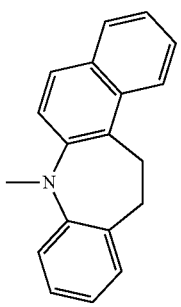
B-125
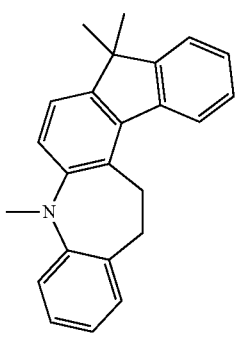
B-126
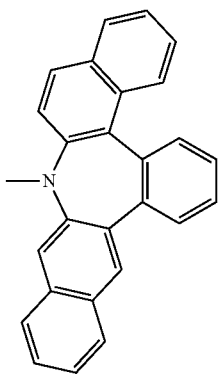
B-128
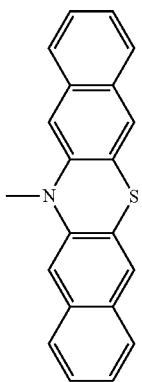

B-129
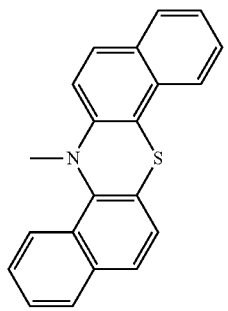
B-130
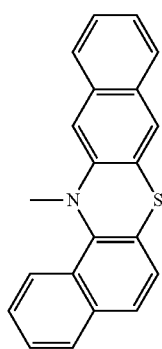
B-132
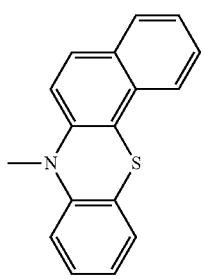
B-134
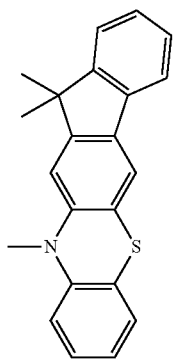
B-135
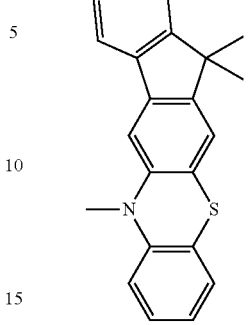
A1
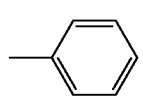
A5
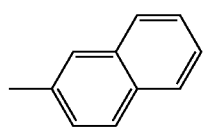
A6
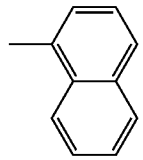
A7
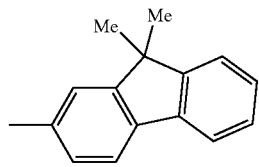
A8
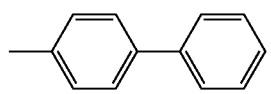
A10
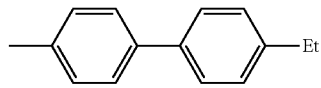
(a)
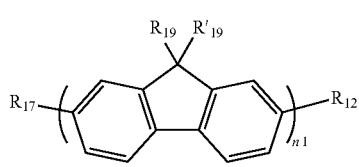
| Compound No. | n1 | $R_{19}$ | $R'_{19}$ | $R_{12}$ | $R_{17}$ |
|---|---|---|---|---|---|
| a-1 | 1 | Me | Me | B-2 | B-2 |
| a-2 | 1 | Me | Me | B-47 | B-47 |
| a-3 | 1 | Me | Me | B-8 | B-8 |
| a-4 | 1 | Me | Me | B-1 | B-1 |
| a-6 | 1 | Me | Me | B-3 | B-3 |
| a-7 | 2 | Me | Me | B-1 | B-1 |

-continued

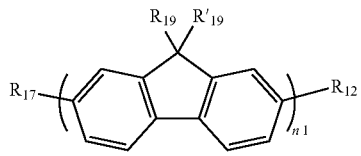

(a)

| Compound No. | n1 | $R_{19}$ | $R'_{19}$ | $R_{12}$ | $R_{17}$ |
|---|---|---|---|---|---|
| a-8 | 2 | Me | Me | B-14 | B-14 |
| a-9 | 2 | Me | Me | B-1 | B-47 |
| a-11 | 1 | Me | Me | B-4 | B-4 |
| a-12 | 1 | H | H | B-47 | B-47 |
| a-13 | 1 | H | Me | B-47 | B-47 |
| a-14 | 1 | Et | Et | B-47 | B-47 |
| a-15 | 1 | n-Bu | n-Bu | B-47 | B-47 |
| a-16 | 1 | Ph | Ph | B-47 | B-47 |
| a-17 | 1 | Me | Ph | B-47 | B-47 |
| a-18 | 1 | i-Pr | i-Pr | B-47 | B-47 |
| a-19 | 1 | 2-MeOEt | 2-MeOEt | B-47 | B-47 |
| a-20 | 2 | Me | Me | B-47 | B-47 |
| a-21 | 3 | Me | Me | B-47 | B-47 |
| a-22 | 4 | Me | Me | B-47 | B-47 |
| a-23 | 1 | Me | Me | H | B-47 |
| a-24 | 1 | Me | Me | Me | B-47 |
| a-25 | 1 | Me | Me | —NPh$_2$ | B-47 |

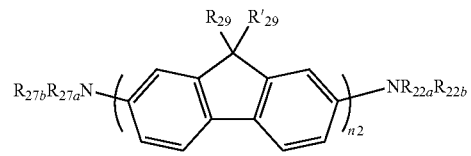

(b)

| Compound No. | n2 | $R_{29}$ | $R'_{29}$ | $R_{22a}, R_{27a}$ | $R_{22b}, R_{27b}$ |
|---|---|---|---|---|---|
| b-1 | 1 | 2-MeOEt | 2-MeOEt | A7 | A7 |
| b-2 | 2 | Me | Me | A7 | A7 |
| b-3 | 3 | Me | Me | A7 | A7 |
| b-4 | 4 | Me | Me | A7 | A7 |
| b-5 | 1 | Me | Me | A5 | A5 |
| b-6 | 1 | Me | Me | A6 | A6 |
| b-7 | 1 | Me | Me | A7 | A7 |
| b-8 | 1 | Me | Me | A8 | A8 |
| b-10 | 1 | Me | Me | A10 | A10 |
| b-12 | 1 | Me | Me | A7 | A1 |
| b-16 | 1 | H | H | A7 | A7 |
| b-17 | 1 | H | Me | A7 | A7 |
| b-18 | 1 | Et | Et | A7 | A7 |
| b-19 | 1 | n-Bu | n-Bu | A7 | A7 |
| b-20 | 1 | Ph | Ph | A7 | A7 |
| b-21 | 1 | Me | Ph | A7 | A7 |
| b-22 | 1 | i-Pr | i-Pr | A7 | A7 |

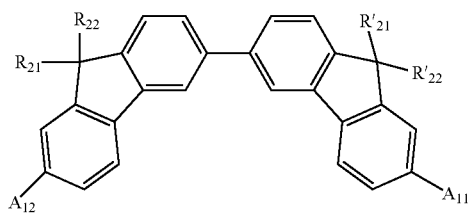

(c)

| Compound No. | $R_{21}$ | $R_{22}$ | $R'_{21}$ | $R'_{22}$ | $A_{11}$ | $A_{12}$ |
|---|---|---|---|---|---|---|
| c-1 | Me | Me | Me | Me | B-1 | B-1 |
| c-4 | Me | Me | Me | Me | B-8 | B-8 |
| c-12 | i-Pr | i-Pr | i-Pr | i-Pr | B-27 | B-27 |
| c-16 | Me | Me | Me | Me | B-63 | B-63 |
| c-17 | Me | Me | Me | Me | B-67 | B-67 |
| c-18 | Me | Me | Me | Me | B-75 | B-75 |
| c-19 | Me | Me | Me | Me | B-78 | B-78 |
| c-20 | Me | Me | Me | Me | B-87 | B-87 |
| c-21 | H | H | H | H | B-91 | B-91 |
| c-22 | H | H | H | Me | B-99 | B-99 |
| c-25 | Ph | Ph | Ph | Ph | B-114 | B-114 |
| c-26 | Me | Me | Me | Ph | B-121 | B-121 |
| c-27 | i-Pr | i-Pr | i-Pr | i-Pr | B-125 | B-125 |
| c-28 | 2-MeOEt | 2-MeOEt | 2-MeOEt | 2-MeOEt | B-129 | B-129 |
| c-29 | Et | Et | Ph | Ph | B-94 | B-94 |
| c-30 | Me | Et | Me | Ph | B-109 | B-109 |

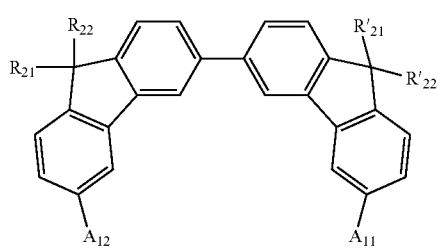

(d)

| Compound No. | $R_{21}$ | $R_{22}$ | $R'_{21}$ | $R'_{22}$ | $A_{11}$ | $A_{12}$ |
|---|---|---|---|---|---|---|
| d-1 | Me | Me | Me | Me | B-1 | B-1 |
| d-4 | Me | Me | Me | Me | B-8 | B-8 |
| d-8 | Et | Et | Et | Et | B-18 | B-18 |
| d-10 | Ph | Ph | Ph | Ph | B-31 | B-31 |
| d-16 | Me | Me | Me | Me | B-61 | B-61 |
| d-18 | Me | Me | Me | Me | B-72 | B-72 |
| d-20 | Me | Me | Me | Me | B-88 | B-88 |
| d-21 | H | H | H | H | B-96 | B-96 |
| d-22 | H | H | H | Me | B-100 | B-100 |
| d-23 | Et | Et | Et | Et | B-117 | B-117 |
| d-24 | n-Bu | n-Bu | n-Bu | n-Bu | B-125 | B-125 |
| d-26 | Me | Me | Me | Ph | B-134 | B-134 |
| d-27 | i-Pr | i-Pr | i-Pr | i-Pr | B-135 | B-135 |
| d-28 | 2-MeOEt | 2-MeOEt | 2-MeOEt | 2-MeOEt | B-14 | B-74 |

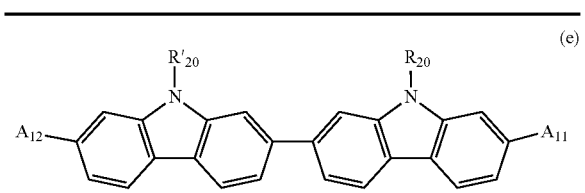

(e)

| Compound No. | $R_{20}$ | $R'_{20}$ | $A_{11}$ | $A_{12}$ |
|---|---|---|---|---|
| e-1 | Ph | Ph | B-1 | B-1 |
| e-4 | Ph | Ph | B-8 | B-8 |
| e-7 | Ph | Ph | B-14 | B-14 |
| e-8 | Ph | Ph | B-20 | B-20 |
| e-9 | Ph | Ph | B-21 | B-21 |
| e-10 | 2-tol | 2-tol | B-1 | B-1 |
| e-13 | 2-Np | 2-Np | B-8 | B-8 |
| e-23 | t-Bu | t-Bu | B-1 | B-1 |
| e-25 | 2-Np | Ph | B-1 | B-8 |
| e-26 | Ph | Ph | B-62 | B-62 |
| e-28 | Ph | Ph | B-73 | B-73 |
| e-31 | Ph | Ph | B-84 | B-84 |
| e-32 | Ph | Ph | B-85 | B-85 |
| e-33 | Ph | Ph | B-86 | B-86 |
| e-35 | 2-tol | 2-tol | B-97 | B-97 |
| e-36 | 3-tol | 3-tol | B-99 | B-99 |
| e-38 | 2-Np | 2-Np | B-109 | B-109 |
| e-40 | 2-An | 2-An | B-112 | B-112 |
| e-41 | 2-Fn | 2-Fn | B-116 | B-116 |
| e-42 | Me | Me | B-123 | B-123 |
| e-43 | i-Pr | i-Pr | B-126 | B-126 |
| e-48 | t-Bu | t-Bu | B-72 | B-17 |

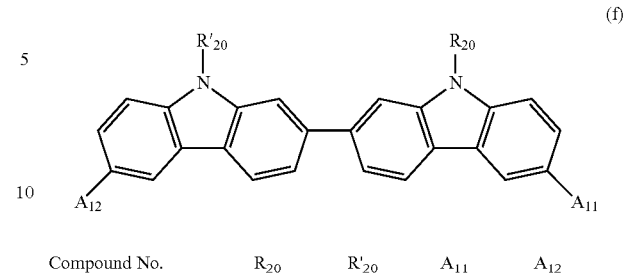

(f)

| Compound No. | $R_{20}$ | $R'_{20}$ | $A_{11}$ | $A_{12}$ |
|---|---|---|---|---|
| f-1 | Ph | Ph | B-1 | B-1 |
| f-4 | Ph | Ph | B-8 | B-8 |
| f-8 | 2-Np | 2-Np | B-8 | B-8 |
| f-11 | 2-Fn | 2-Fn | B-14 | B-14 |
| f-12 | Me | Me | B-21 | B-21 |
| f-13 | i-Pr | i-Pr | B-29 | B-29 |
| f-20 | Ph | Ph | B-63 | B-63 |
| f-22 | Ph | Ph | B-71 | B-71 |
| f-23 | Ph | Ph | B-74 | B-74 |
| f-24 | 2-tol | 2-tol | B-76 | B-76 |
| f-25 | 3-tol | 3-tol | B-80 | B-80 |
| f-26 | 4-tol | 4-tol | B-83 | B-83 |
| f-27 | 2-Np | 2-Np | B-87 | B-87 |
| f-28 | 1-Np | 1-Np | B-93 | B-93 |
| f-29 | 2-An | 2-An | B-97 | B-97 |
| f-30 | 2-Fn | 2-Fn | B-100 | B-100 |
| f-33 | Et | Et | B-113 | B-113 |

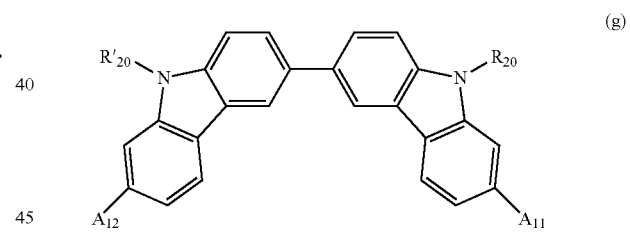

(g)

| Compound No. | $R_{20}$ | $R'_{20}$ | $A_{11}$ | $A_{12}$ |
|---|---|---|---|---|
| g-11 | 3-tol | 3-tol | B-14 | B-14 |
| g-13 | 2-Np | 2-Np | B-8 | B-8 |
| g-16 | 2-Fn | 2-Fn | B-21 | B-21 |
| g-17 | Me | Me | B-26 | B-26 |
| g-18 | i-Pr | i-Pr | B-31 | B-31 |
| g-27 | Ph | Ph | B-67 | B-67 |
| g-28 | Ph | Ph | B-71 | B-71 |
| g-29 | Ph | Ph | B-75 | B-75 |
| g-30 | 2-tol | 2-tol | B-78 | B-78 |
| g-31 | 3-tol | 3-tol | B-81 | B-81 |
| g-32 | 4-tol | 4-tol | B-85 | B-85 |
| g-33 | 2-Np | 2-Np | B-88 | B-88 |
| g-34 | 1-Np | 1-Np | B-91 | B-91 |
| g-36 | 2-Fn | 2-Fn | B-98 | B-98 |
| g-37 | Me | Me | B-101 | B-101 |
| g-39 | Et | Et | B-106 | B-106 |
| g-40 | Ph | 2-tol | B-109 | B-109 |
| g-41 | 3-tol | Ph | B-114 | B-114 |
| g-42 | 2-Fn | Ph | B-116 | B-116 |
| g-43 | t-Bu | t-Bu | B-120 | B-120 |
| g-44 | 2-Np | Ph | B-123 | B-123 |
| g-47 | Ph | 2-tol | B-132 | B-132 |

(h)

| Compound NO. | R₂₀ | R'₂₀ | A₁₁ | A₁₂ |
|---|---|---|---|---|
| h-6 | 3-tol | 3-tol | B-14 | B-14 |
| h-8 | 2-Np | 2-Np | B-8 | B-8 |
| h-11 | 2-Fn | 2-Fn | B-21 | B-21 |
| h-12 | Me | Me | B-26 | B-26 |
| h-13 | i-Pr | i-Pr | B-31 | B-31 |
| h-15 | Ph | 2-tol | B-42 | B-42 |
| h-20 | Ph | Ph | B-65 | B-65 |
| h-23 | Ph | Ph | B-80 | B-80 |
| h-24 | 2-tol | 2-tol | B-86 | B-86 |
| h-26 | 4-tol | 4-tol | B-103 | B-103 |
| h-27 | 2-Np | 2-Np | B-105 | B-105 |
| h-28 | 1-Np | 1-Np | B-107 | B-107 |
| h-30 | 2-Fn | 2-Fn | B-119 | B-119 |
| h-31 | Me | Me | B-125 | B-125 |
| h-34 | Ph | 2-tol | B-42 | B-42 |

(i)

| Compound No. | R₂₃ | R₂₄ | R'₂₃ | R'₂₄ | A₁₁ | A₁₂ |
|---|---|---|---|---|---|---|
| i-1 | Me | Me | Me | Me | B-1 | B-1 |
| i-4 | Me | Me | Me | Me | B-8 | B-8 |
| i-7 | Me | Me | Me | Me | B-14 | B-14 |
| i-9 | Me | Me | Me | Me | B-27 | B-27 |
| i-11 | Me | Me | Me | Me | B-42 | B-42 |
| i-18 | i-Pr | i-Pr | i-Pr | i-Pr | B-17 | B-17 |
| i-23 | Me | Me | Me | Me | B-1 | B-8 |
| i-25 | Me | Et | Me | Ph | B-1 | B-20 |
| i-26 | Me | Me | Me | Me | B-65 | B-65 |
| i-27 | Me | Me | Me | Me | B-67 | B-67 |
| i-28 | Me | Me | Me | Me | B-62 | B-62 |
| i-29 | Me | Me | Me | Me | B-72 | B-72 |
| i-31 | Me | Me | Me | Me | B-84 | B-84 |
| i-32 | Me | Me | Me | Me | B-85 | B-85 |
| i-33 | Me | Me | Me | Me | B-86 | B-86 |
| i-35 | Me | Me | Me | Me | B-94 | B-94 |
| i-36 | Me | Me | Me | Me | B-96 | B-96 |
| i-37 | H | H | H | H | B-103 | B-103 |
| i-39 | Et | Et | Et | Et | B-110 | B-110 |
| i-40 | n-Bu | n-Bu | n-Bu | n-Bu | B-117 | B-117 |
| i-41 | Ph | Ph | Ph | Ph | B-121 | B-121 |
| i-42 | Me | Me | Me | Ph | B-126 | B-126 |
| i-43 | i-Pr | i-Pr | i-Pr | i-Pr | B-129 | B-129 |
| i-44 | 2-MeOEt | 2-MeOEt | 2-MeOEt | 2-MeOEt | B-130 | B-130 |
| i-46 | Et | Et | Ph | Ph | B-134 | B-134 |
| i-48 | Me | Me | Me | Me | B-1 | B-71 |

(j)

| Compound No. | R₂₃ | R₂₄ | R'₂₃ | R'₂₄ | A₁₁ | A₁₂ |
|---|---|---|---|---|---|---|
| j-1 | Me | Me | Me | Me | B-1 | B-1 |
| j-4 | Me | Me | Me | Me | B-8 | B-8 |
| j-7 | Me | Me | Me | Me | B-14 | B-14 |
| j-8 | Me | Me | Me | Me | B-21 | B-21 |
| j-9 | Me | Me | Me | Me | B-31 | B-31 |
| j-11 | Me | Me | Me | Me | B-42 | B-42 |
| j-15 | n-Bu | n-Bu | n-Bu | n-Bu | B-31 | B-31 |
| j-18 | i-Pr | i-Pr | i-Pr | i-Pr | B-18 | B-18 |
| j-26 | Me | Me | Me | Me | B-61 | B-61 |
| j-29 | Me | Me | Me | Me | B-69 | B-69 |
| j-30 | Me | Me | Me | Me | B-71 | B-71 |
| j-31 | Me | Me | Me | Me | B-72 | B-72 |
| j-32 | Me | Me | Me | Me | B-74 | B-74 |
| j-33 | Me | Me | Me | Me | B-76 | B-76 |
| j-34 | Me | Me | Me | Me | B-78 | B-78 |
| j-35 | Me | Me | Me | Me | B-81 | B-81 |
| j-36 | Me | Me | Me | Me | B-84 | B-84 |
| j-37 | H | H | H | H | B-86 | B-86 |
| j-39 | Et | Et | Et | Et | B-93 | B-93 |
| j-40 | n-Bu | n-Bu | n-Bu | n-Bu | B-98 | B-101 |
| j-41 | Ph | Ph | Ph | Ph | B-61 | B-61 |
| j-44 | 2-MeOEt | 2-MeOEt | 2-MeOEt | 2-MeOEt | B-91 | B-91 |
| j-45 | 3-tol | Me | 3-tol | Me | B-99 | B-99 |
| j-48 | Me | Me | Me | Me | B-114 | B-114 |
| j-49 | 2-tol | Me | 2-tol | Me | B-121 | B-121 |
| j-50 | Me | Et | Me | Ph | B-125 | B-125 |

(k)

| Compound No. | R₂₃ | R₂₄ | R'₂₃ | R'₂₄ | A₁₁ | A₁₂ |
|---|---|---|---|---|---|---|
| k-1 | Me | Me | Me | Me | B-1 | B-1 |
| k-4 | Me | Me | Me | Me | B-8 | B-8 |
| k-7 | Me | Me | Me | Me | B-14 | B-14 |
| k-10 | Me | Me | Me | Me | B-29 | B-29 |
| k-12 | H | H | H | H | B-42 | B-42 |
| k-15 | n-Bu | n-Bu | n-Bu | n-Bu | B-31 | B-31 |
| k-18 | i-Pr | i-Pr | i-Pr | i-Pr | B-17 | B-18 |
| k-27 | Me | Me | Me | Me | B-67 | B-67 |
| k-28 | Me | Me | Me | Me | B-71 | B-71 |
| k-29 | Me | Me | Me | Me | B-75 | B-75 |
| k-30 | Me | Me | Me | Me | B-78 | B-78 |
| k-31 | Me | Me | Me | Me | B-81 | B-81 |
| k-32 | Me | Me | Me | Me | B-85 | B-85 |
| k-33 | Me | Me | Me | Me | B-88 | B-88 |

-continued (k)

| Compound No. | R₂₃ | R₂₄ | R'₂₃ | R'₂₄ | A₁₁ | A₁₂ |
|---|---|---|---|---|---|---|
| k-34 | Me | Me | Me | Me | B-91 | B-91 |
| k-36 | Me | Me | Me | Me | B-98 | B-98 |
| k-37 | H | H | H | H | B-101 | B-101 |
| k-39 | Et | Et | Et | Et | B-106 | B-106 |
| k-40 | n-Bu | n-Bu | n-Bu | n-Bu | B-109 | B-109 |
| k-42 | Me | Me | Me | Ph | B-112 | B-112 |
| k-43 | i-Pr | i-Pr | i-Pr | i-Pr | B-116 | B-116 |
| k-44 | 2-MeOEt | 2-MeOEt | 2-MeOEt | 2-MeOEt | B-123 | B-123 |
| k-45 | 3-tol | Me | 3-tol | Me | B-126 | B-126 |
| k-50 | Me | Et | Me | Ph | B-72 | B-17 |

(l)

| Compound No. | R₂₃ | R₂₄ | R'₂₃ | R'₂₄ | A₁₁ | A₁₂ |
|---|---|---|---|---|---|---|
| l-1 | Me | Me | Me | Me | B-1 | B-1 |
| l-4 | Me | Me | Me | Me | B-8 | B-8 |
| l-7 | Me | Me | Me | Me | B-14 | B-14 |
| l-9 | Me | Me | Me | Me | B-27 | B-27 |
| l-11 | Me | Me | Me | Me | B-42 | B-42 |
| l-18 | i-Pr | i-Pr | i-Pr | i-Pr | B-17 | B-17 |
| l-23 | Me | Me | Me | Me | B-1 | B-8 |
| l-25 | Me | Et | Me | Ph | B-1 | B-20 |
| l-26 | Me | Me | Me | Me | B-62 | B-62 |
| l-27 | Me | Me | Me | Me | B-65 | B-65 |
| l-28 | Me | Me | Me | Me | B-73 | B-73 |
| l-30 | Me | Me | Me | Me | B-86 | B-86 |
| l-31 | Me | Me | Me | Me | B-83 | B-83 |
| l-33 | Me | Me | Me | Me | B-93 | B-93 |
| l-34 | Me | Me | Me | Me | B-98 | B-98 |
| l-36 | Me | Me | Me | Me | B-106 | B-106 |
| l-37 | H | H | H | H | B-107 | B-110 |
| l-39 | Et | Et | Et | Et | B-116 | B-119 |
| l-44 | 2-MeOEt | 2-MeOEt | 2-MeOEt | 2-MeOEt | B-1 | B-61 |
| l-45 | 3-tot | Me | 3-tot | Me | B-1 | B-71 |
| l-50 | Me | Et | Me | Ph | B-80 | B-81 |

(m)

| Compound No. | A₁₁ | A₁₂ |
|---|---|---|
| m-1 | B-1 | B-1 |
| m-4 | B-8 | B-8 |
| m-7 | B-14 | B-14 |
| m-10 | B-29 | B-29 |
| m-12 | B-42 | B-42 |
| m-15 | B-31 | B-31 |
| m-18 | B-17 | B-18 |
| g-21 | B-63 | B-63 |
| g-23 | B-71 | B-71 |
| g-24 | B-74 | B-74 |
| g-25 | B-76 | B-76 |
| g-26 | B-80 | B-80 |
| g-27 | B-83 | B-83 |
| g-28 | B-88 | B-88 |
| g-29 | B-96 | B-96 |
| g-30 | B-100 | B-100 |
| g-31 | B-117 | B-117 |
| g-32 | B-125 | B-125 |
| g-34 | B-134 | B-134 |
| g-35 | B-135 | B-135 |
| g-36 | B-14 | B-74 |

(n)

| Compound No. | A₁₁ | A₁₂ |
|---|---|---|
| n-11 | B-14 | B-14 |
| n-13 | B-8 | B-8 |
| n-16 | B-21 | B-21 |
| n-17 | B-26 | B-26 |
| n-18 | B-31 | B-31 |
| n-20 | B-42 | B-42 |
| n-27 | B-67 | B-67 |
| n-28 | B-71 | B-71 |
| n-29 | B-75 | B-75 |
| n-30 | B-78 | B-78 |
| n-31 | B-81 | B-81 |
| n-32 | B-85 | B-85 |
| n-33 | B-88 | B-88 |
| n-34 | B-91 | B-91 |
| n-36 | B-98 | B-98 |
| n-37 | B-101 | B-101 |
| n-39 | B-109 | B-109 |
| n-41 | B-112 | B-112 |
| n-42 | B-116 | B-116 |
| n-43 | B-123 | B-123 |
| n-44 | B-126 | B-126 |
| n-49 | B-72 | B-17 |

(o)

| Compound No. | A₁₁ | A₁₂ |
|---|---|---|
| o-11 | B-14 | B-14 |
| o-13 | B-8 | B-8 |
| o-16 | B-21 | B-21 |
| o-17 | B-26 | B-26 |
| o-18 | B-31 | B-31 |
| o-26 | B-62 | B-62 |
| o-28 | B-73 | B-73 |
| o-31 | B-84 | B-84 |
| o-32 | B-85 | B-85 |
| o-33 | B-86 | B-86 |
| o-34 | B-87 | B-87 |
| o-36 | B-93 | B-93 |
| o-37 | B-98 | B-101 |
| o-39 | B-106 | B-106 |
| o-40 | B-107 | B-110 |
| o-42 | B-116 | B-119 |
| o-47 | B-1 | B-61 |
| o-49 | B-72 | B-75 |
| o-50 | B-67 | B-76 |

(p)

| Compound No. | A₁₁ | A₁₂ |
|---|---|---|
| p-1 | B-1 | B-1 |
| p-4 | B-8 | B-8 |
| p-7 | B-14 | B-14 |
| p-9 | B-27 | B-27 |
| p-11 | B-42 | B-42 |
| p-18 | B-17 | B-17 |
| p-23 | B-1 | B-8 |
| p-25 | B-1 | B-20 |
| p-26 | B-63 | B-63 |
| p-28 | B-71 | B-71 |
| p-29 | B-74 | B-74 |
| p-30 | B-76 | B-76 |
| p-31 | B-80 | B-80 |
| p-32 | B-83 | B-83 |
| p-33 | B-87 | B-87 |
| p-34 | B-93 | B-93 |
| p-36 | B-98 | B-98 |
| p-37 | B-101 | B-101 |
| p-39 | B-106 | B-106 |
| p-40 | B-109 | B-109 |
| p-42 | B-112 | B-112 |
| p-43 | B-116 | B-116 |
| p-44 | B-123 | B-123 |
| p-45 | B-126 | B-126 |
| p-50 | B-72 | B-17 |

(q)

| Compound No. | A₁₁ | A₁₂ |
|---|---|---|
| q-1 | B-1 | B-1 |
| q-4 | B-8 | B-8 |
| q-7 | B-14 | B-14 |
| q-9 | B-27 | B-27 |
| q-11 | B-42 | B-42 |
| q-18 | B-17 | B-17 |
| q-23 | B-1 | B-8 |
| q-25 | B-1 | B-20 |
| q-27 | B-67 | B-67 |
| q-28 | B-71 | B-71 |
| q-29 | B-75 | B-75 |
| q-30 | B-78 | B-78 |
| q-31 | B-81 | B-81 |
| q-32 | B-85 | B-85 |
| q-33 | B-88 | B-88 |
| q-34 | B-91 | B-91 |
| q-36 | B-98 | B-98 |
| q-37 | B-100 | B-100 |
| q-38 | B-101 | B-101 |
| q-41 | B-106 | B-106 |
| q-42 | B-109 | B-109 |
| q-44 | B-113 | B-113 |
| q-45 | B-114 | B-114 |

(r)

| Compound No. | A₁₁ | A₁₂ |
|---|---|---|
| r-1 | B-1 | B-1 |
| r-4 | B-8 | B-8 |
| r-7 | B-14 | B-14 |
| r-8 | B-21 | B-21 |
| r-11 | B-42 | B-42 |
| r-13 | B-47 | B-47 |
| r-18 | B-17 | B-17 |
| r-23 | B-1 | B-8 |
| r-25 | B-1 | B-20 |
| r-27 | B-67 | B-67 |
| r-28 | B-71 | B-71 |
| r-29 | B-75 | B-75 |
| r-30 | B-78 | B-78 |
| r-31 | B-81 | B-81 |
| r-32 | B-85 | B-85 |
| r-33 | B-88 | B-88 |
| r-34 | B-91 | B-91 |
| r-36 | B-98 | B-98 |
| r-37 | B-101 | B-101 |
| r-39 | B-106 | B-106 |
| r-40 | B-109 | B-109 |
| r-42 | B-112 | B-112 |
| r-43 | B-116 | B-116 |
| r-44 | B-123 | B-123 |
| r-45 | B-126 | B-126 |
| r-50 | B-72 | B-17 |

(s)

| Compound No. | A₁₁ | A₁₂ |
|---|---|---|
| s-1 | B-1 | B-1 |
| s-4 | B-8 | B-8 |
| s-12 | B-27 | B-27 |
| s-16 | B-63 | B-63 |
| s-18 | B-71 | B-71 |
| s-19 | B-76 | B-76 |
| s-20 | B-80 | B-80 |
| s-21 | B-83 | B-83 |
| s-22 | B-87 | B-87 |
| s-23 | B-93 | B-93 |
| s-24 | B-94 | B-94 |
| s-25 | B-99 | B-99 |
| s-27 | B-114 | B-114 |
| s-28 | B-121 | B-121 |
| s-29 | B-125 | B-125 |
| s-30 | B-129 | B-129 |

(t)

| Compound No. | A₁₁ | A₁₂ |
|---|---|---|
| t-1 | B-1 | B-1 |
| t-4 | B-8 | B-8 |
| t-7 | B-14 | B-14 |
| t-8 | B-20 | B-20 |
| t-9 | B-21 | B-21 |
| t-10 | B-1 | B-1 |
| t-13 | B-8 | B-8 |
| t-23 | B-1 | B-1 |
| t-25 | B-1 | B-8 |
| t-26 | B-62 | B-62 |
| t-28 | B-73 | B-73 |
| t-31 | B-84 | B-84 |
| t-32 | B-85 | B-85 |
| t-33 | B-86 | B-86 |
| t-35 | B-97 | B-97 |
| t-36 | B-99 | B-99 |
| t-38 | B-109 | B-109 |
| t-40 | B-112 | B-112 |
| t-42 | B-106 | B-106 |
| t-43 | B-109 | B-109 |
| t-45 | B-112 | B-112 |
| t-46 | B-116 | B-116 |
| t-47 | B-123 | B-123 |
| t-48 | B-126 | B-126 |

(u)

| Compound No. | R₂₁ | R₂₂ | R'₂₁ | R'₂₂ | A₁₁ | A₁₂ |
|---|---|---|---|---|---|---|
| u-1 | Me | Me | Me | Me | B-1 | B-1 |
| u-4 | Me | Me | Me | Me | B-8 | B-8 |
| u-7 | H | H | H | Me | B-47 | B-47 |
| u-12 | i-Pr | i-Pr | i-Pr | i-Pr | B-17 | B-17 |
| u-14 | Et | Et | Ph | Ph | B-26 | B-26 |
| u-16 | Me | Me | Me | Me | B-62 | B-62 |
| u-17 | Me | Me | Me | Me | B-65 | B-65 |
| u-18 | Me | Me | Me | Me | B-73 | B-73 |
| u-20 | Me | Me | Me | Me | B-86 | B-86 |
| u-21 | H | H | H | H | B-83 | B-83 |
| u-23 | Et | Et | Et | Et | B-103 | B-103 |
| u-24 | n-Bu | n-Bu | n-Bu | n-Bu | B-113 | B-113 |
| u-26 | Me | Me | Me | Ph | B-126 | B-126 |
| u-27 | i-Pr | i-Pr | i-Pr | i-Pr | B-130 | B-130 |
| u-29 | Et | Et | Ph | Ph | B-92 | B-92 |

Moreover, for a purpose of imparting durability at the time of driving a device, a hydrogen atom of the compound represented by formula (Y1), formula (1) and formula (F-1) may be substituted by a deuterium atom.

The molecular weight of the compound represented by formula (Y1), formula (1) and formula (F-1) for use in the present invention is preferably from 500 to 2,000, more preferably from 500 to 1,500. Thanks to the molecular weight of 500 to 2,000, vapor deposition of the material becomes possible and the heat resistance can be more elevated.

The compound represented by formula (Y1), formula (1) and formula (F-1) for use in the present invention can be synthesized by applying a known method.

The amount used of the compound represented by formula (Y1), formula (1) and formula (F-1) for use in the present invention is preferably from 10 to 300 nm, more preferably from 30 to 150 nm, still more preferably from 50 to 120 nm, in terms of a single layer in a state after film is formed. In the case of using the compound as a layer interposed between the photoelectric conversion layer and the charge blocking layer, the amount used is preferably 100 nm or less, more preferably 50 nm or less, still more preferably 20 nm or less, in terms of a single layer.

Each of the compounds represented by formulae (Y1), (1) and (F-1) according to the present invention for use in the film formation preferably has a purity of 95% or more, more preferably 97% or more, still more preferably 99% or more. This material purity can be determined from a chromatogram obtained by monitoring the absorbance at 254 nm by a high-performance liquid chromatography. Impurities contained include an intermediate mingled at the synthesis, a by-product and a decomposition product due to oxidation, reduction, hydrolysis and the like of the objective compound.

The amount of the heavy element impurity contained in each of the compounds represented by formulae (Y1), (1) and (F-1) according to the present invention for use in the film formation is preferably 7,000 ppm or less, more preferably 100 ppm or less, still more preferably 10 ppm or less. The impurity content can be determined using a high-frequency inductively coupled plasma mass spectrometer. The heavy element impurity as used herein indicates elements belonging to the third or higher period of the periodic table, such as magnesium iron, copper, palladium nickel, sodium potassium, cesium, chlorine, bromine and iodine, but excludes the elements contained in the compounds represented by formulae (Y1), (1) and (F-1). Such a heavy element impurity may be contained as a substituent of an ionic compound or an organic compound. These impurities can be removed by recrystallization or the like operation but are preferably removed by sublimation purification.

Also, the present invention refers to a compound represented by the following formula (F-10):

Formula (F-10)

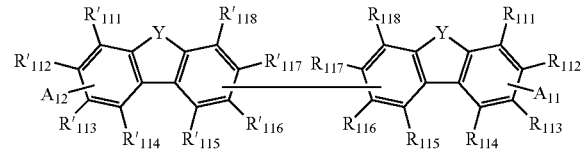

wherein each of $R_{111}$ to $R_{118}$, $R'_{111}$ to $R'_{118}$ independently represents a hydrogen atom, a halogen atom, an alkyl group, an aryl group, a heterocyclic group, a hydroxyl group, an amino group or a mercapto group, which may further have a substituent; any one of $R_{115}$ to $R_{118}$ is linked with any one of $R'_{115}$ to $R'_{118}$ to form a single bond; each of $A_{11}$ and $A_{12}$ independently represents a substituent represented by the following formula (A-1); $A_{11}$ is substituted as any one of $R_{111}$ to $R_{114}$, and $A_{12}$ is substituted as any one of $R'_{111}$ to $R'_{114}$; Y each independently represents a carbon atom, a nitrogen atom, an oxygen atom, a sulfur atom or a silicon atom, which may further have a substituent; when these groups have a substituent, the carbon number of the further substituent is preferably 2:

Formula (A-1)

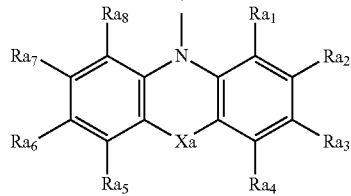

wherein each of $Ra_1$ to $Ra_8$ independently represents a hydrogen atom, a halogen atom, an alkyl group, an aryl group or a heterocyclic group, which may further have a substituent; * represents the bonding position; and Xa represents a single bond, an oxygen atom, a sulfur atom, or an alkylene group, an alkenylene group, a cycloalkylene group, a cycloalkenylene group, an arylene group, a divalent heterocyclic group or an imino group, which may further have a substituent.

Moreover, the present invention refers to a photoelectric conversion material containing the compound represented by formula (F-10), or a film.

In the case where the photoelectric conversion device of the present invention has a hole blocking layer as in the embodiment shown in FIG. 1B, an electron-accepting material is preferably used as the material for forming the hole blocking layer. Examples of the electron-accepting material which can be used include an oxadiazole derivative such as 1,3-bis(4-tert-butylphenyl-1,3,4-oxadiazolyl)phenylene (OXD-7); an anthraquinodimethane derivative; a diphenylquinone derivative; bathocuproine, bathophenanthroline and their derivatives; a triazole compound; a tris(8-hydroxyquinolinato)aluminum complex; a bis(4-methyl-8-quinolinato)aluminum complex; a distyrylarylene derivative; and a silole compound. Also, a material having satisfactory electron transportability can be used even if it is not an electron-accepting organic material. A porphyrin-based compound, a styryl-based compound such as DCM (4-dicyanomethylene-2-methyl-6-(4-(dimethylaminostyryl))-4H-pyrane), and a 4H-pyrane-based compound can be used.

Specifically, the compounds described in JP-A-2008-72090 (Patent Document 2) are preferred.

The electron blocking layer and hole blocking layer can be formed by vapor deposition. The vapor deposition may be either physical vapor deposition (PVD) or chemical vapor deposition (CVD), but physical vapor deposition such as vacuum deposition is preferred. In the case of depositing the film by vacuum deposition, the production conditions such as vacuum degree and deposition temperature can be set according to conventional methods.

As for the conditions in the vacuum deposition, the degree of vacuum (pressure in the apparatus) is preferably $1\times10^{-2}$ Pa or less, more preferably $1\times10^{-3}$ Pa or less, still more preferably $1\times10^{-4}$ Pa or less. The decomposition of a material can be more suppressed under higher vacuum. The temperature of the crucible working out to a vapor deposition source is preferably from 200 to 500° C., more preferably from 300 to 400° C. A higher temperature yields a higher film forming rate and a higher productivity, and a lower temperature enables more suppressing the decomposition of a material.

The thickness of the electron blocking layer and hole blocking layer is preferably from 10 to 300 nm, more preferably from 30 to 150 nm, still more preferably from 50 to 100 nm. With a thickness of 10 nm or more, a suitable dark current-reducing effect is obtained, and with a thickness of 300 nm or less, a suitable photoelectric conversion efficiency is obtained. Incidentally, a plurality of layers may be formed for the charge blocking layer.

(Photoelectric Conversion Layer)

The organic material constituting the photoelectric conversion layer 12 preferably contains at least either one of a p-type organic semiconductor and an n-type organic semiconductor.

The p-type organic semiconductor (compound) is a donor-type organic semiconductor (compound) and indicates an organic compound having a property of readily donating an electron, mainly typified by a hole-transporting organic compound. More specifically, this is an organic compound having a smaller ionization potential when two organic materials are used in contact. Accordingly, the donor-type organic compound may be any organic compound as long as it is an organic compound having an electron donating property. Examples of the compound which can be used include a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, a merocyanine compound, an oxonol compound, a polyamine compound, an indole compound, a pyrrole compound, a pyrazole compound, a polyarylene compound, a fused aromatic carbocyclic compound (e.g., naphthalene derivative, anthracene derivative, phenanthrene derivative, tetracene derivative, pyrene derivative, perylene derivative, fluoranthene derivative), and a metal complex having a nitrogen-containing heterocyclic compound as a ligand. The donor-type organic semiconductor is not limited to these compounds and, as described above, any organic compound having an ionization potential smaller than that of the organic compound used as an n-type (acceptor) compound may be used as the donor-type organic semiconductor.

The material used for the photoelectric conversion layer needs to absorb light and therefore, is preferably a dye. A dye having an absorption maximum wavelength of 400 to 700 nm is preferred and in view of high sensitivity, a dye having an absorption maximum wavelength of 500 to 600 nm is preferred. Because of necessity to absorb light, the molar extinction coefficient of the material is preferably 10,000 cm$^{-1}$ (mol/L)$^{-1}$ or more, more preferably 30,000 cm$^{-1}$ (mol/L)$^{-1}$ or more, still more preferably 50,000 cm$^{-1}$ (mol/L)$^{-1}$ or more. These absorption characteristics can be determined using a visible light absorption spectrophotometer after preparing a dilute chloroform solution.

The p-type organic semiconductor is preferably a compound represented by the following formula (I):

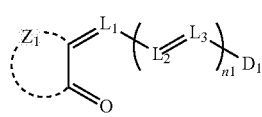

Formula (I)

wherein $Z_1$ represents an atomic group necessary for forming a 5- or 6-membered ring, each of $L_1$, $L_2$ and $L_3$ represents an unsubstituted methine group or a substituted methine group, $D_1$ represents an atomic group, and n1 represents an integer of 0 or more.

$Z_1$ represents an atomic group necessary for forming a 5- or 6-membered ring. The ring formed is preferably a ring usually used as an acidic nucleus in merocyanine dyes, and specific examples thereof include the followings:
(a) a 1,3-dicarbonyl nucleus: such as 1,3-indanedione nucleus, 1,3-cyclohexanedione, 5,5-dimethyl-1,3-cyclohexanedione and 1,3-dioxane-4,6-dione,
(b) a pyrazolinone nucleus: such as 1-phenyl-2-pyrazolin-5-one, 3-methyl-1-phenyl-2-pyrazolin-5-one and 1-(2-benzothiazoyl)-3-methyl-2-pyrazolin-5-one,
(c) an isoxazolinone nucleus: such as 3-phenyl-2-isoxazolin-5-one and 3-methyl-2-isoxazolin-5-one,
(d) an oxyindole nucleus: such as 1-alkyl-2,3-dihydro-2-oxyindole,
(e) a 2,4,6-triketohexahydropyrimidine nucleus: such as barbituric acid, 2-thiobarbituric acid and their derivatives; examples of the derivative include a 1-alkyl form such as 1-methyl and 1-ethyl, a 1,3-dialkyl form such as 1,3-dimethyl, 1,3-diethyl and 1,3-dibutyl, a 1,3-diaryl form such as 1,3-diphenyl, 1,3-di(p-chlorophenyl) and 1,3-di(p-ethoxycarbonylphenyl), a 1-alkyl-1-aryl form such as 1-ethyl-3-phenyl, and a 1,3-diheterocyclic substitution form such as 1,3-di(2-pyridyl),
(f) a 2-thio-2,4-thiazolidinedione nucleus: such as rhodanine and its derivatives; examples of the derivative include a 3-alkylrhodanine such as 3-methylrhodanine, 3-ethylrhodanine and 3-allylrhodanine, a 3-arylrhodanine such as 3-phenylrhodanine, and a 3-heterocyclic ring-substituted rhodanine such as 3-(2-pyridyl)rhodanine,
(g) a 2-thio-2,4-oxazolidinedione (2-thio-2,4-(3H,5H)-oxazoledione) nucleus: such as 3-ethyl-2-thio-2,4-oxazolidinedione,
(h) a thianaphthenone nucleus: such as 3(2H)-thianaphthenone-1,1-dioxide,
(i) a 2-thio-2,5-thiazolidinedione nucleus: such as 3-ethyl-2-thio-2,5-thiazolidinedione,
(j) a 2,4-thiazolidinedione nucleus: such as 2,4-thiazolidinedione, 3-ethyl-2,4-thiazolidinedione and 3-phenyl-2,4-thiazolidinedione,
(k) a thiazolin-4-one nucleus: such as 4-thiazolinone and 2-ethyl-4-thiazolinone,
(l) a 2,4-imidazolidinedione (hydantoin) nucleus: such as 2,4-imidazolidinedione and 3-ethyl-2,4-imidazolidinedione,
(m) a 2-thio-2,4-imidazolidinedione (2-thiohydantoin) nucleus: such as 2-thio-2,4-imidazolidinedione and 3-ethyl-2-thio-2,4-imidazolidinedione,
(n) an imidazolin-5-one nucleus: such as 2-propylmercapto-2-imidazolin-5-one,
(o) a 3,5-pyrazolidinedione nucleus: such as 1,2-diphenyl-3,5-pyrazolidinedione and 1,2-dimethyl-3,5-pyrazolidinedione,
(p) a benzothiophen-3-one nucleus: such as benzothiophen-3-one, oxobenzothiophen-3-one and dioxobenzothiophen-3-one, and
(q) an indanone nucleus: such as 1-indanone, 3-phenyl-1-indanone, 3-methyl-1-indanone, 3,3-diphenyl-1-indanone and 3,3-dimethyl-1-indanone.

The ring formed by $Z_1$ is preferably a 1,3-dicarbonyl nucleus, a pyrazolinone nucleus, a 2,4,6-triketohexahydropyrimidine nucleus (including a thioketone form, e.g., barbituric acid nucleus, 2-thiobarbituric acid nucleus), a 2-thio-2,4-thiazolidinedione nucleus, a 2-thio-2,4-oxazolidinedione nucleus, a 2-thio-2,5-thiazolidinedione nucleus, a 2,4-thiazolidinedione nucleus, a 2,4-imidazolidinedione nucleus, a 2-thio-2,4-imidazolidinedione nucleus, a 2-imidazolin-5-one nucleus, a 3,5-pyrazolidinedione nucleus, a benzothiophen-3-one nucleus or an indanone nucleus, more preferably a 1,3-dicarbonyl nucleus, a 2,4,6-triketohexahydropyrimidine nucleus (including a thioketone form, e.g., barbituric acid nucleus, 2-thiobarbituric acid nucleus), a 3,5-pyrazolidinedione nucleus, a benzothiophen-3-one nucleus or an indanone nucleus, still more preferably a 1,3-dicarbonyl nucleus or a 2,4,6-triketohexahydropyrimidine nucleus (including a thioketone form, e.g., barbituric acid nucleus, 2-thiobarbituric acid nucleus), yet still more preferably a 1,3-indanedione nucleus, a barbituric acid nucleus, a 2-thiobarbituric acid nucleus or a derivative thereof.

The ring formed by $Z_1$ is preferably a ring represented by the following formula:

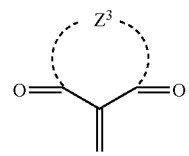

$Z^3$ represents an atomic group necessary for forming a 5- or 6-membered ring. $Z^3$ can be selected from the above-described rings formed by $Z_1$ and is preferably a 1,3-dicarbonyl nucleus or a 2,4,6-triketohexahydropyrimidine nucleus (including a thioketone form), more preferably a 1,3-indanedione nucleus, a barbituric acid nucleus, a 2-thiobarbituric acid nucleus or a derivative thereof.

It has been found that by controlling the interaction between acceptor parts, high hole transportability can be brought out when depositing the film by vapor co-deposition with $C_{60}$. The interaction can be controlled by the structure of the acceptor part and introduction of a substituent working out to a steric hindrance. In the barbituric acid nucleus and 2-thiobarbituric acid nucleus, both two hydrogens at two N-positions are preferably substituted for by a substituent, whereby the intermolecular interaction can be controlled. Examples of the substituent include the later-described substituent W, and the substituent is preferably an alkyl group, more preferably a methyl group, an ethyl group, a propyl group or a butyl group.

In the case where the ring formed by $Z_1$ is a 1,3-indanedione nucleus, a group represented by formula (IV) or a group represented by formula (V) is preferred.

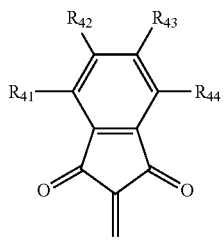

Formula (IV)

wherein each of $R_{41}$ to $R_{44}$ independently represents a hydrogen atom or a substituent.

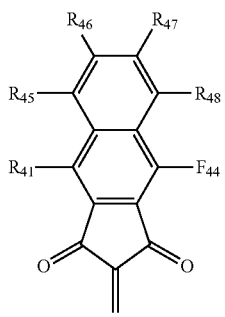

Formula (V)

wherein each of $R_{41}$, $R_{44}$ and $R_{45}$ to $R_{48}$ independently represents a hydrogen atom or a substituent.

In the case of a group represented by formula (IV), each of $R_{41}$ to $R_{44}$ independently represents a hydrogen atom or a substituent. As to the substituent, for example, those described as the substituent W may be applied. Adjacent members out of $R_{41}$ to $R_{44}$ may combine to form a ring, and it is preferred that $R_{42}$ and $R_{43}$ combine together to form a ring (for example, a benzene ring, a pyridine ring or a pyrazine ring). Preferably, all of $R_{41}$ to $R_{44}$ are a hydrogen atom.

The group represented by formula (IV) is preferably a group represented by formula (V).

In the case of a group represented by formula (V), each of $R_{41}$, $R_{44}$ and $R_{45}$ to $R_{48}$ independently represents a hydrogen atom or a substituent. As to the substituent, for example, those described as the substituent W may be applied. It is preferred that all of $R_{41}$, $R_{44}$ and $R_{45}$ to $R_{48}$ are a hydrogen atom.

In the case where the ring formed by $Z_1$ is a 2,4,6-triketo-hexahydropyrimidine nucleus (including a thioketone form), a group represented by formula (VI) is preferred.

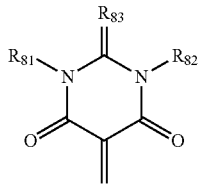

Formula (VI)

wherein each of $R_{81}$ and $R_{82}$ independently represents a hydrogen atom or a substituent, and $R_{83}$ represents an oxygen atom, a sulfur atom or a substituent.

In the case of a group represented by formula (VI), each of $R_{81}$ and $R_{82}$ independently represents a hydrogen atom or a substituent. As to the substituent, for example, those described as the substituent W may be applied. Each of $R_{81}$ and $R_{82}$ is independently, preferably an alkyl group, an aryl group or a heterocyclic group (e.g., 2-pyridyl), more preferably an alkyl group having a carbon number of 1 to 6 (e.g., methyl, ethyl, n-propyl, tert-butyl).

$R_{83}$ represents an oxygen atom, a sulfur atom or a substituent, but $R_{83}$ preferably represents an oxygen atom or a sulfur atom. The substituent is preferably a substituent with the bonding part being a nitrogen atom or a carbon atom. In the case of a nitrogen atom, the substituent is preferably an alkyl group (having a carbon number of 1 to 12) or an aryl group (having a carbon number of 6 to 12), and specific examples thereof include a methylamino group, an ethylamino group, a butylamino group, a hexylamino group, a phenylamino group and a naphthylamino group. In the case of a carbon atom, it may be sufficient if at least one electron-withdrawing group is further substituted. The electron-withdrawing group includes a carbonyl group, a cyano group, a sulfoxide group, a sulfonyl group and a phosphoryl group and preferably further has a substituent. Examples of this substituent include the substituent W. $R_{83}$ preferably forms a 5- or 6-membered ring containing the carbon atom, and specific examples thereof include those having the following structures.

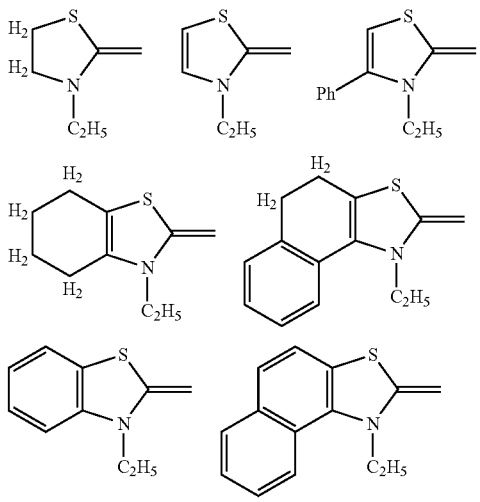

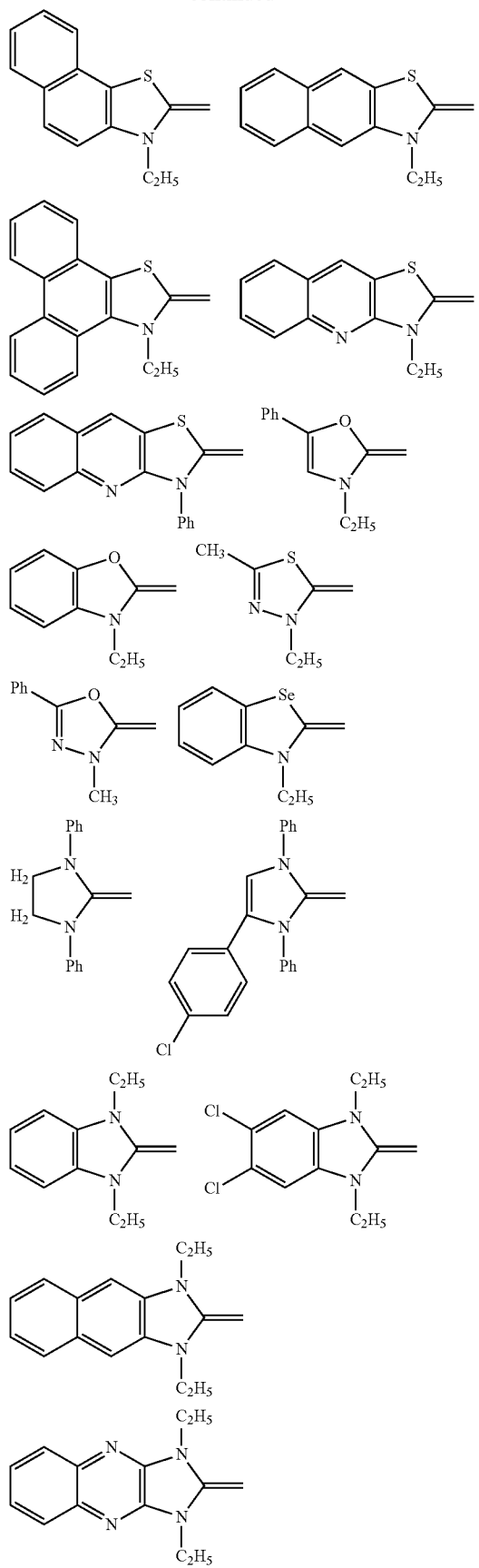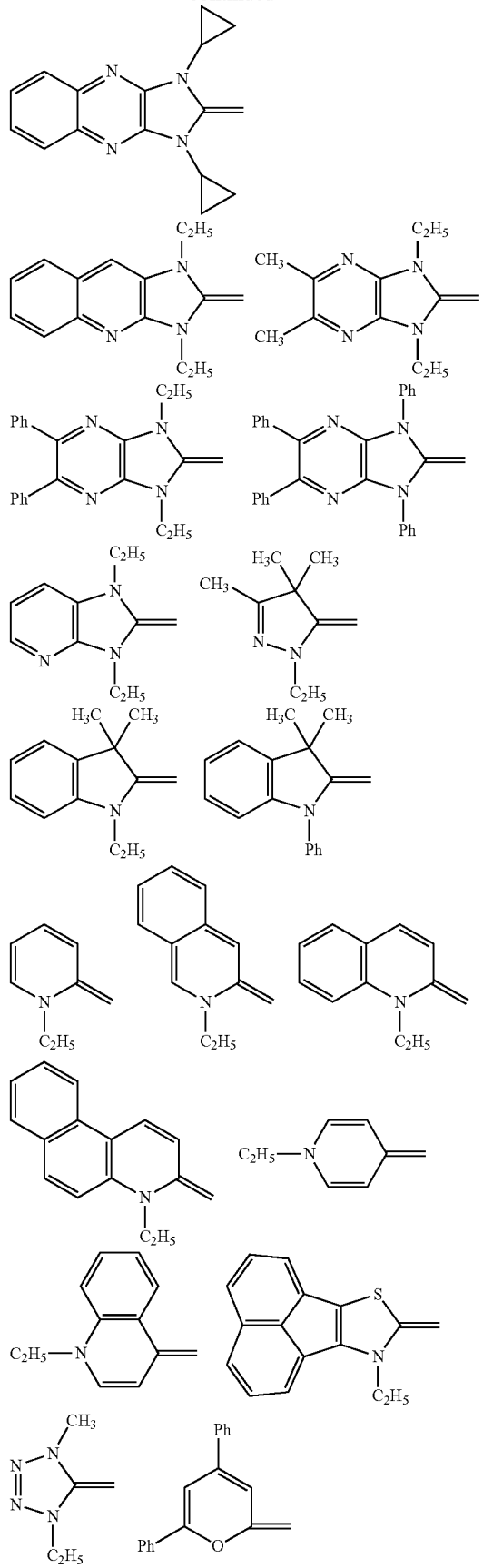

-continued

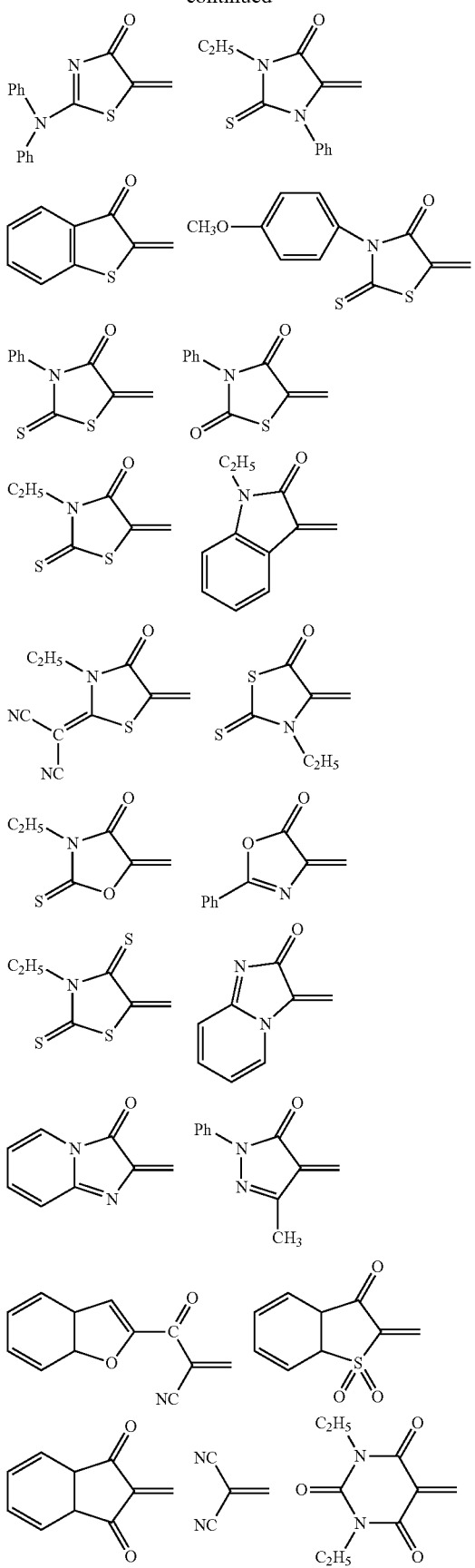

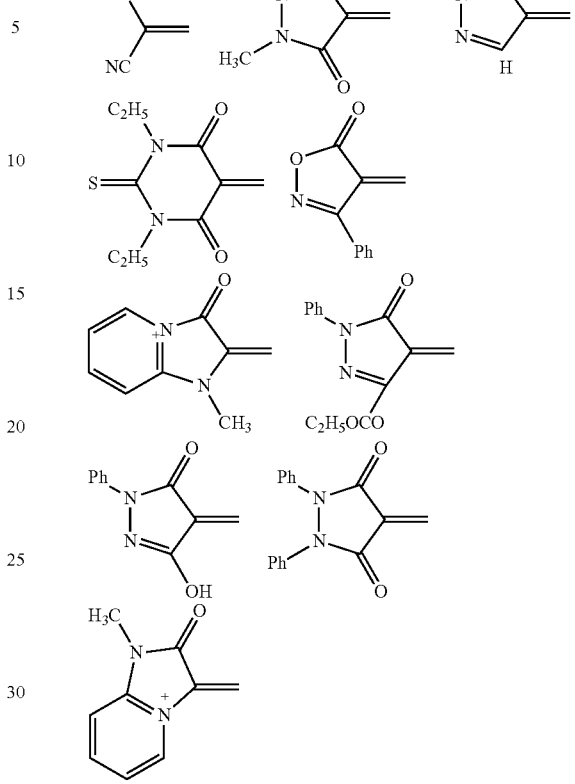

In the groups above, Ph indicates a phenyl group.

Each of $L_1$, $L_2$ and $L_3$ independently represents an unsubstituted methine group or a substituted methine group. Substituted methine groups may combine together to form a ring (for example, a 6-membered ring such as benzene ring). Examples of the substituent of the substituted methine group include the substituent W, and it is preferred that all of $L_1$, $L_2$ and $L_3$ are an unsubstituted methine group.

n1 represents an integer of 0 or more, preferably represents an integer of 0 to 3, and is more preferably 0. When n1 becomes large, the absorption wavelength region is allowed to reside on a long wavelength side, but the thermal decomposition temperature becomes low. From the standpoint of having appropriate absorption in the visible region and suppressing thermal decomposition at the vapor deposition of film, n1 is preferably 0.

$D_1$ represents an atomic group. $D_1$ is preferably a group containing —$NR^a(R^b)$, and it is more preferred that $D_1$ represents an —$NR^a(R^b)$-substituted aryl group (preferably a phenyl or naphthyl group which may be substituted). Each of $R^a$ and $R^b$ independently represents a hydrogen atom or a substituent, and examples of the substituent represented by $R^a$ and $R^b$ include the substituent W, but the substituent is preferably an aliphatic hydrocarbon group (preferably an alkyl or alkenyl group which may be substituted), an aryl group (preferably a phenyl group which may be substituted) or a heterocyclic group. The heterocyclic group is preferably a 5-membered ring such as furan, thiophene, pyrrole and oxadiazole.

In the case where each of $R^a$ and $R^b$ is a substituent (preferably an alkyl group or an alkenyl group), the substituent may form a ring (preferably a 6-membered ring) by combining with a hydrogen atom or a substituent in the aromatic ring (preferably benzene ring) structure of the —NR$^a$(R$^b$)-substituted aryl group. In this case, D$_1$ is preferably represented by formula (VIII), (IX) or (X) described later.

The substituents R$^a$ and R$^b$ may combine together to form a ring (preferably a 5- or 6-membered ring, more preferably a 6-membered ring), or each of R$^a$ and R$^b$ may combine with a substituent in L (which indicates any one of L$_1$, L$_2$ and L$_3$) to form a ring (preferably a 5- or 6-membered ring, more preferably a 6-membered ring).

D$_1$ is preferably an aryl group (preferably a phenyl group) substituted with an amino group at the para-position. In this case, D$_1$ is preferably represented by the following formula (II). The amino group may be substituted. Examples of the substituent of the amino group include the substituent W, but the substituent is preferably an aliphatic hydrocarbon group (preferably an alkyl group which may be substituted), an aryl group (preferably a phenyl group which may be substituted) or a heterocyclic group. The amino group is preferably an amino group substituted with two aryl groups, a so-called diaryl group-substituted amino group. In this case, D$_1$ is preferably represented by the following formula (III). The substituent (preferably an alkyl or alkenyl group which may be substituted) of the amino group may combine with a hydrogen atom or a substituent in the aromatic ring (preferably benzene ring) structure of the aryl group to form a ring (preferably a 6-membered ring).

with each other to form a ring. n3 represents an integer of 0 to 3 and is preferably an integer of 0 to 2, more preferably 0 or 1.

In the case where each of R$^a$ and R$^b$ is an aliphatic hydrocarbon group, an aryl group or a heterocyclic group, the substituent is preferably an alkyl group, an alkenyl group, an aryl group, an alkoxy group, an aryloxy group, an acyl group, an alkoxycarbonyl group, an aryloxycarbonyl group, an acylamino group, a sulfonylamino group, a sulfonyl group, a silyl group or an aromatic heterocyclic group, more preferably an alkyl group, an alkenyl group, an aryl group, an alkoxy group, an aryloxy group, a silyl group or an aromatic heterocyclic group, still more preferably an alkyl group, an aryl group, an alkoxy group, an aryloxy group, a silyl group or an aromatic heterocyclic group. As for specific examples, those described as the substituent W may be applied.

Each of R$^a$ and R$^b$ is preferably an alkyl group, an aryl group or an aromatic heterocyclic group. Each of R$^a$ and R$^b$ is more preferably an alkyl group, an alkylene group forming a ring by combining with L, or an aryl group, still more preferably an alkyl group having a carbon number of 1 to 8, an alkylene group forming a 5- or 6-membered ring by combining with L, or a substituted or unsubstituted phenyl group, yet still more preferably an alkyl group having a carbon number of 1 to 8, or a substituted or unsubstituted phenyl group.

It is also preferred that D$_1$ is represented by the following formula (VII).

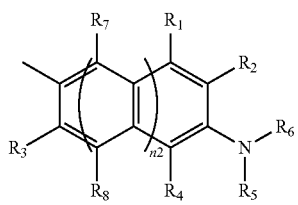

Formual (II)

wherein each of R$_1$ to R$_8$ independently represents a substituent and out of these substituents, two substituents positioned at mutual ortho-positions with respect to the benzene ring may be combined together to form a ring. n2 represents an integer of 0 to 3 and is preferably an integer of 0 to 2, more preferably 0 or 1.

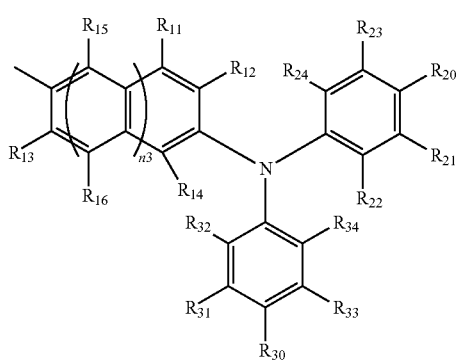

Formula (III)

wherein each of R$_{11}$ to R$_{16}$, R$_{20}$ to R$_{24}$ and R$_{30}$ to R$_{34}$ independently represents a hydrogen atom or a substituent and out of these substituents, two substituents at mutual ortho-positions with respect to the benzene ring may combine

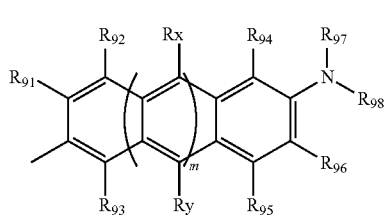

Formula (VII)

wherein each of R$_{91}$ to R$_{98}$ independently represents a hydrogen atom or a substituent; m represents an integer of 0 or more, and m is preferably 0 or 1; each of Rx and Ry independently represents a hydrogen atom or a substituent and when m is an integer of 2 or more, Rx's or Ry's bonded to respective 6-membered rings may be different substituents; R$_{91}$ and R$_{92}$, R$_{92}$ and Rx, Rx and R$_{94}$, R$_{94}$ and R$_{97}$, R$_{93}$ and Ry, Ry and R$_{95}$, R$_{95}$ and R$_{96}$, or R$_{97}$ and R$_{98}$ may independently combine together to form a ring; and the bonding part to L$_3$ (when n is 0, to L$_1$) may be the position of R$_{91}$, R$_{92}$ or R$_{93}$ and in this case, the substituent or hydrogen atom corresponding to R$_{91}$, R$_{92}$ or R$_{93}$ may be bonded to the site denoted as the bonding part to L$_3$ in formula (VII) and adjacent R's may combine together to form a ring. The expression "adjacent R's may combine together to form a ring" as used herein indicates that, for example, in the case where R$_{91}$ is the bonding part to L$_3$ (when n is 0, to L$_1$), assuming that R$_{90}$ is bonded to the bonding part of formula (VII), R$_{90}$ and R$_{93}$ may combine to form a ring; in the case where R$_{92}$ is the bonding part to L$_3$ (when n is 0, to L$_1$), assuming that R$_{90}$ is bonded to the bonding part of formula (VII), R$_{90}$ and R$_{91}$, or R$_{90}$ and R$_{93}$ may combine together to form a ring; and in the case where R$_{93}$ is the bonding part to L$_3$ (when n is 0, to L$_1$), assuming that R$_{90}$ is bonded to the bonding part of formula (VII), R$_{90}$ and R$_{91}$, or R$_{91}$ and R$_{92}$ may combine together to form a ring.

The ring above is preferably a benzene ring.

Examples of the substituents R$_{91}$ to R$_{98}$, Rx and Ry include the substituent W.

All of $R_{91}$ to $R_{96}$ are preferably a hydrogen atom, and both Rx and Ry are preferably a hydrogen atom. It is preferred that $R_{91}$ to $R_{96}$ are a hydrogen atom and at the same time, Rx and Ry are a hydrogen atom.

Each of $R_{97}$ and $R_{98}$ is independently, preferably a phenyl group which may be substituted, and examples of the substituent include the substituent W, but an unsubstituted phenyl group is preferred.

m represents an integer of 0 or more and is preferably 0 or 1.

It is also preferred that $D_1$ is a group represented by formula (VIII), (IX) or (X).

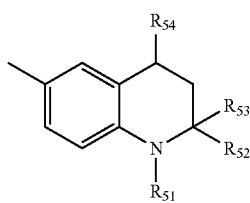

Formula (VIII)

wherein each of $R_{51}$ to $R_{54}$ independently represents hydrogen or a substituent. Examples of the substituent include the substituent W. $R_{52}$ and $R_{53}$, or $R_{51}$ and $R_{52}$ may combine together to form a ring.

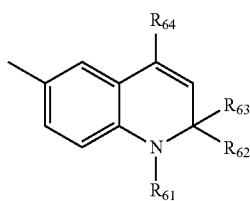

Formula (IX)

wherein each of $R_{61}$ to $R_{64}$ independently represents hydrogen or a substituent. Examples of the substituent include the substituent W. $R_{62}$ and $R_{63}$, or $R_{61}$ and $R_{62}$ may be combined together to form a ring.

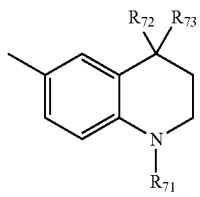

Formula (X)

wherein each of $R_{71}$ to $R_{73}$ independently represents hydrogen or a substituent. Examples of the substituent include the substituent W. $R_{72}$ and $R_{73}$ may be combined together to form a ring.

$D_1$ is more preferably a group represented by formula (II) or (III).

In formula (II), each of $R_1$ to $R_6$ independently represents a hydrogen atom or a substituent, and $R_1$ and $R_2$, $R_3$ and $R_4$, $R_5$ and $R_6$, $R_2$ and $R_5$, or $R_4$ and $R_6$ may combine together to form a ring.

Examples of the substituent in $R_1$ to $R_4$ include the substituent W. It is preferred that $R_1$ to $R_4$ are a hydrogen atom or that $R_2$ and $R_5$, or $R_4$ and $R_6$ form a 5-membered ring, and more preferably, all of $R_1$ to $R_4$ are a hydrogen atom.

Examples of the substituent in $R_5$ and $R_6$ include the substituent W. Among the substituents, a substituted or unsubstituted aryl group is preferred. The substituent of the substituted aryl is preferably an alkyl group (e.g., methyl, ethyl) or an aryl group (e.g., phenyl, naphthylene, phenanthryl, anthryl). Each of $R_5$ and $R_6$ is preferably a phenyl group, an alkyl-substituted phenyl group, a phenyl-substituted phenyl group, a naphthylene group, a phenanthryl group, an anthryl group, or a fluorenyl group (preferably 9,9'-dimethyl-2-fluorenyl group).

In formula (III), each of $R_{11}$ to $R_{14}$, $R_{20}$ to $R_{24}$ and $R_{30}$ to $R_{34}$ independently represents a hydrogen atom or a substituent. Also, respective members out of $R_{11}$ to $R_{14}$, $R_{20}$ to $R_{24}$ and $R_{30}$ to $R_{34}$ may combine together to form a ring. Examples of the ring formation include a case where $R_{11}$ and $R_{12}$, or $R_{13}$ and $R_{14}$ combine to form a benzene ring, a case where two adjacent members out of $R_{20}$ to $R_{24}$ ($R_{24}$ and $R_{23}$, $R_{23}$ and $R_{20}$, $R_{20}$ and $R_{21}$, or $R_{21}$ and $R_{22}$) combine to form a benzene ring, a case where two adjacent members out of $R_{30}$ to $R_{34}$ ($R_{34}$ and $R_{33}$, $R_{33}$ and $R_{30}$, $R_{30}$ and $R_{31}$, or $R_{31}$ and $R_{32}$) combine to form a benzene ring, and a case where $R_{22}$ and $R_{34}$ combine to form a 5-membered ring together with the N atom.

Examples of the substituent represented by $R_{11}$ to $R_{14}$, $R_{20}$ to $R_{24}$ and $R_{30}$ to $R_{34}$ include the substituent W. The substituent is preferably an alkyl group (e.g., methyl, ethyl) or an aryl group (e.g., phenyl, naphthyl), and such a group may further substituted with a substituent W (preferably an aryl group). Above all, a case where $R_{20}$ and $R_{30}$ are a substituent is preferred, and a case where at the same time, the others $R_{11}$ to $R_{14}$, $R_{21}$ to $R_{24}$ and $R_{31}$ to $R_{34}$ are a hydrogen atom is more preferred.

The compound represented by formula (I) is preferably a compound represented by the following formula (pI).

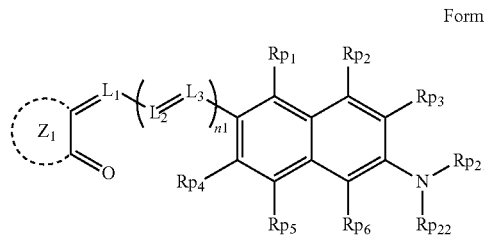

Formula (pI)

wherein $Z_1$ represents a ring containing two carbon atoms, which is a fused ring containing a 5-membered ring, a 6-membered ring or at least either a 5-membered ring or a 6-membered ring; each of $L_1$, $L_2$ and $L_3$ independently represents an unsubstituted methine group or a substituted methine group; $n_1$ represents an integer of 0 or more; each of $Rp_1$, $Rp_2$, $Rp_3$, $Rp_4$, $Rp_5$ and $Rp_6$ independently represents a hydrogen atom or a substituent, $Rp_1$ and $Rp_2$, $Rp_2$ and $Rp_3$, $Rp_4$ and $Rp_5$, or $Rp_5$ and $Rp_6$ may be combined with each other to form a ring; and each of $Rp_{21}$ and $Rp_{22}$ independently represents a substituted aryl group, an unsubstituted aryl group, a substituted heteroaryl group or an unsubstituted heteroaryl group.

A compound in which, as described above, a naphthylene group is disposed for the linking part of donor part (the moiety of —$NRp_{21}Rp_{22}$)/acceptor part (the moiety bonded to the naphthylene group through $L_1$ to $L_3$) is used as a photoelectric conversion material together with fullerenes, whereby a photoelectric conversion device having excellent heat resistance and high responsivity can be obtained. It is considered that thanks to a naphthylene group disposed for the linking part of donor part/acceptor part, interaction with fullerenes is enhanced and the response speed is improved. Also, the compound above has sufficient sensitivity.

In formula (pI), each of $L_1$, $L_2$ and $L_3$ independently represents an unsubstituted methine group or a substituted methine group, Substituents of the substituted methine group may combine with each other to form a ring. Examples of the ring include a 6-membered ring (e.g., benzene ring). Examples of the substituent of the substituted methine group include the later-described substituent W. It is preferred that all of $L_1$, $L_2$ and $L_3$ are an unsubstituted methine group.

$n_1$ represents an integer of 0 or more, preferably represents an integer of 0 to 3, and is still more preferably 0. When $n_1$ becomes large, the absorption wavelength region is allowed to reside on a long wavelength side, but the thermal decomposition temperature becomes low. From the standpoint of having appropriate absorption in the visible region and suppressing thermal decomposition at the vapor deposition, $n_1$ is preferably 0.

Each of $Rp_1$ to $Rp_6$ independently represents a hydrogen atom or a substituent. In the case where each of $Rp_1$ to $Rp_6$ represents a substituent, examples of the substituent represented by $Rp_1$ to $Rp_6$ include the later-described substituent W, especially, a halogen atom, an alkyl group, an aryl group, a heterocyclic group, a hydroxyl group, a nitro group, an alkoxy group, an aryloxy group, a heterocyclic oxy group, an amino group, an alkylthio group, an arylthio group, an alkenyl group, a cyano group or a heterocyclic thio group are preferable.

Each of $Rp_1$ to $Rp_6$ is independently, preferably a hydrogen atom, a halogen atom, an alkyl group, an aryl group, a heterocyclic group, a hydroxyl group, a nitro group, an alkoxy group, an aryloxy group, a heterocyclic oxy group, an amino group, an alkylthio group, an arylthio group, an alkenyl group, a cyano group or a heterocyclic thio group, more preferably a hydrogen atom, an alkyl group, an aryl group or a heterocyclic group, more preferably a hydrogen atom, an alkyl group having a carbon number of 1 to 20, an aryl group having a carbon number of 6 to 20, or a heterocyclic group having a carbon number of 4 to 16, still more preferably a hydrogen atom, an alkyl group having a carbon number of 1 to 12, or an aryl group having a carbon number of 6 to 14, yet still more preferably a hydrogen atom, an alkyl group having a carbon number of 1 to 6, or an aryl group having a carbon number of 6 to 10, even yet still more preferably a hydrogen atom. In the case of an alkyl group, the aryl group may be branched. Also, when each of $Rp_1$ to $Rp_6$ is a substituent, the substituent may have a further substituent. Examples of the further substituent include the later-described substituent W.

Specific preferred examples of $Rp_1$ to $Rp_6$ include a hydrogen atom, a methyl group, an ethyl group, a propyl group, a butyl group, a hexyl group, a cyclohexyl group, a phenyl group and a naphthyl group.

$Rp_1$ and $Rp_2$, $Rp_2$ and $Rp_3$, $Rp_4$ and $Rp_5$, or $Rp_5$ and $Rp_6$ may be combined with each other to form a ring. Examples of the ring include the later-described ring R. The ring is preferably a benzene ring, a naphthalene ring, an anthracene ring, a pyridine ring, a pyrimidine ring or the like.

Each of $Rp_{21}$ and $Rp_{22}$ independently represents a substituted aryl group, an unsubstituted aryl group, a substituted heteroaryl group or an unsubstituted heteroaryl group. It is preferable that both $Rp_{21}$ and $Rp_{22}$ are not an unsubstituted phenyl group at the same time.

The aryl group represented by $Rp_{21}$ and $Rp_{22}$ is preferably an aryl group having a carbon number of 6 to 30, more preferably an aryl group having a carbon number of 6 to 20, and specific examples of the aryl group include a phenyl group, a naphthyl group, a biphenyl group, a terphenyl group, an anthryl group and a fluorenyl group.

The substituent of the substituted aryl group in $Rp_{21}$ and $Rp_{22}$ is preferably an alkyl group (e.g., methyl group, ethyl group, tert-butyl group), an alkoxy group (e.g., methoxy group, ethoxy group, isopropoxy group), an aryl group (e.g., phenyl group, naphthyl group, phenanthryl group, anthryl group), or a heteroaryl group (e.g., thienyl group, furanyl group, pyridyl group, carbazolyl group).

The aryl group or substituted aryl group represented by $Rp_{21}$ and $Rp_{22}$ is preferably a phenyl group, a substituted phenyl group, a biphenyl group, a naphthyl group, a phenanthryl group, an anthryl group, a fluorenyl group, or a substituted fluorenyl group (preferably 9,9'-dimethyl-2-fluorenyl group).

In the case where each of $Rp_{21}$ and $Rp_{22}$ is a heteroaryl group, the heteroaryl group is preferably a heteroaryl group composed of a 5-, 6- or 7-membered ring or a condensed ring thereof. Examples of the heteroatom contained in the heteroaryl group include an oxygen atom, a sulfur atom and a nitrogen atom. Specific examples of the ring constituting the heteroaryl group include a furan ring, a thiophene ring, a pyrrole ring, a pyrroline ring, a pyrrolidine ring, an oxazole ring, an isoxazole ring, a thiazole ring, an isothiazole ring, an imidazole ring, an imidazoline ring, an imidazolidine ring, a pyrazole ring, a pyrazoline ring, a pyrazolidine ring, a triazole ring, a furazan ring, a tetrazole ring, a pyrane ring, a thiine ring, a pyridine ring, a piperidine ring, an oxazine ring, a morpholine ring, a thiazine ring, a pyridazine ring, a pyrimidine ring, a pyrazine ring, a piperazine ring, and a triazine ring.

Examples of the condensed ring include a benzofuran ring, an isobenzofuran ring, a benzothiophene ring, an indole ring, an indoline ring, an isoindole ring, a benzoxazole ring, a benzothiazole ring, an indazole ring, a benzimidazole ring, a quinoline ring, an isoquinoline ring, a cinnoline ring, a phthalazine ring, a quinazoline ring, a quinoxaline ring, a dibenzofuran ring, a carbazole ring, a xanthene ring, an acridine ring, a phenanthridine ring, a phenanthroline ring, a phenazine ring, a phenoxazine ring, a thianthrene ring, a thienothiophene ring, an indolizine ring, a quinolizine ring, a quinuclidine ring, a naphthylidine ring, a purine ring, and a pteridine ring.

The substituent of the substituted heteroaryl group in $Rp_{21}$ and $Rp_{22}$ is preferably an alkyl group (e.g., methyl group, ethyl group, tert-butyl group), an alkoxy group (e.g., methoxy group, ethoxy group, isopropoxy group), an aryl group (e.g., phenyl group, naphthyl group, phenanthryl group, anthryl group), or a heteroaryl group (e.g., thienyl group, furanyl group, pyridyl group, carbazolyl group).

The ring constituting the heteroaryl group or substituted heteroaryl group represented by $Rp_{21}$ and $Rp_{22}$ is preferably a thiophene ring, a substituted thiophene ring, a furan ring, a substituted furan ring, a thienothiophene ring, a substituted thienothiophene ring, or a carbazolyl group.

Each of $Rp_{21}$ and $Rp_{22}$ is independently, preferably a phenyl group, a naphthyl group, a fluorenyl group, a biphenyl group, an anthracenyl group or a phenanthrenyl group, more preferably a phenyl group, a naphthyl group or a fluorenyl group. In the case where each of $Rp_{21}$ and $Rp_{22}$ has a substituent, the substituent is preferably an alkyl group, an alkyl halide group, an alkoxy group, an aryl group or a heteroaryl group, more preferably a methyl group, an isopropyl group, a tert-butyl group, a trifluoromethyl group, a phenyl group or a carbazolyl group.

In the case where $Z_1$ is a group represented by formula (VI) or a group represented by formula (VII), the compound represented by formula (pI) becomes a compound represented by the following formula (pII) or a compound represented by the following formula (pIII), respectively.

The compound represented by formula (pI) is preferably a compound represented by the following formula (pII) or a compound represented by the following formula (pIII).

Formula (pII)

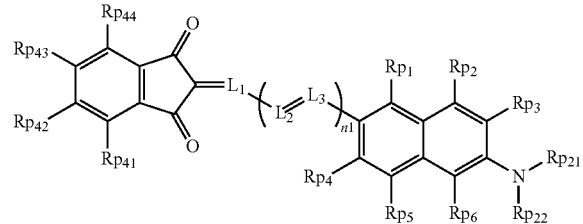

wherein $L_1$, $L_2$, $L_3$, $n_1$, $Rp_1$, $Rp_2$, $Rp_3$, $Rp_4$, $Rp_5$, $Rp_6$, $Rp_{21}$ and $Rp_{22}$ have the same meanings as in formula (pI), and preferred ranges are also the same; $Rp_{41}$, $Rp_{42}$, $Rp_{43}$ and $Rp_{44}$ have the same meanings as $R_{41}$, $R_{42}$, $R_{43}$ and $R_{44}$ in formula (IV), and preferred ranges are also the same.

Formula (pIII)

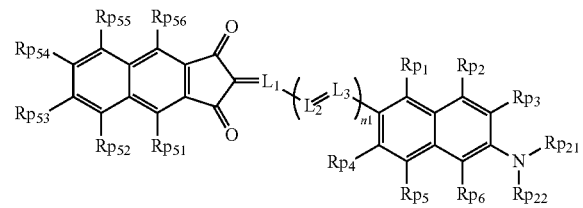

wherein $L_1$, $L_2$, $L_3$, $n_1$, $Rp_1$, $Rp_2$, $Rp_3$, $Rp_4$, $Rp_5$, $Rp_6$, $Rp_{21}$ and $Rp_{22}$ have the same meanings as in formula (pI), and preferred ranges are also the same; $Rp_{51}$, $Rp_{52}$, $R_{P53}$, $Rp_{54}$, $Rp_{55}$ and $Rp_{56}$ have the same meanings as $R_{41}$, $R_{44}$, $R_{45}$, $R_{46}$, $R_{47}$ and $R_{48}$ in formula (V), and preferred ranges are also the same.

The compound represented by formula (pI) is preferably a compound represented by the following formula (pIV).

Formula (pIV)

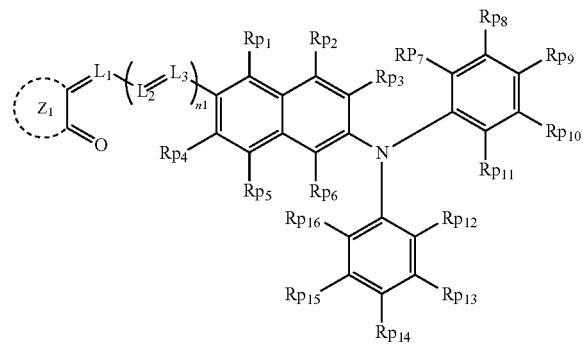

wherein $Z_1$, $L_1$, $L_2$, $L_3$, $n_1$, $Rp_1$, $Rp_2$, $Rp_3$, $Rp_4$, $Rp_5$ and $Rp_6$ have the same meanings as in formula (pI), and preferred ranges are also the same;

each of $Rp_7$ to $Rp_{11}$ and $Rp_{12}$ to $Rp_{16}$ independently represents a hydrogen atom or a substituent, provided that all of $Rp_7$ to $Rp_{11}$ and $Rp_{12}$ to $Rp_{16}$ are not a hydrogen atom at the same time, and adjacent members out of $Rp_7$ to $Rp_{11}$ and $Rp_{12}$ to $Rp_{16}$ may combine with each other to form a ring; and $Rp_3$ and $Rp_7$, or $Rp_6$ and $Rp_{16}$ may be combined with each other.

In formula (pIV), each of $Rp_7$ to $Rp_{11}$ and $Rp_{12}$ to $Rp_{16}$ independently represents a hydrogen atom, provided that all of $Rp_7$ to $Rp_{11}$ and $Rp_{12}$ to $Rp_{16}$ are not a hydrogen atom at the same time. Incidentally, when $Rp_3$ and $Rp_7$, or $Rp_6$ and $Rp_{16}$ are combined, all other members $Rp_8$ to $Rp_{11}$ and $Rp_{12}$ to $Rp_{15}$ may be a hydrogen atom.

In the case where each of $Rp_7$ to $Rp_{11}$ and $Rp_{12}$ to $Rp_{16}$ represents a substituent, examples of the substituent represented by $Rp_7$ to $Rp_{11}$ and $Rp_{12}$ to $Rp_{16}$ include the later-described substituent W, especially, a halogen atom, an alkyl group, an aryl group, a heterocyclic group, a hydroxyl group, a nitro group, an alkoxy group, an aryloxy group, a heterocyclic oxy group, an amino group, an alkylthio group, an arylthio group, an alkenyl group, a cyano group or a heterocyclic thio group are preferable.

Each of $Rp_7$ to $Rp_{11}$ and $Rp_{12}$ to $Rp_{16}$ is independently, preferably a hydrogen atom, a halogen atom, an alkyl group, an aryl group, a heterocyclic group, a hydroxyl group, a nitro group, an alkoxy group, an aryloxy group, a heterocyclic oxy group, an amino group, an alkylthio group, an arylthio group, an alkenyl group, a cyano group or a heterocyclic thio group, more preferably a hydrogen atom, an alkyl group, an alkenyl group, an alkoxy group, an aryl group, an aryloxy group or a heterocyclic group, more preferably a hydrogen atom, an alkyl group having a carbon number of 1 to 20, an alkenyl group having a carbon number of 2 to 20, an alkoxy group having a carbon number of 1 to 20, an aryl group having a carbon number of 6 to 20, an aryloxy group having a carbon number of 6 to 20, or a heterocyclic group composed of a 5-, 6- or 7-membered ring or a condensed ring thereof, still more preferably a hydrogen atom, an alkyl group having a carbon number of 1 to 12, an alkenyl group having a carbon number of 2 to 12, an alkyloxy group having a carbon number of 1 to 12, an aryl group having a carbon number of 6 to 10, an aryloxy group having a carbon number of 6 to 10, or a heterocyclic group composed of a 5- or 6-membered ring or a condensed ring thereof.

In the case of an alkyl group, the alkyl group may be either linear or branched. Examples of the heteroatom contained in the heterocyclic group include an oxygen atom, a sulfur atom and a nitrogen atom.

Specific examples of the alkyl group, alkenyl group and aryl group include the groups illustrated below as the alkyl group, alkenyl group and aryl group of the later-described substituent W.

Also, adjacent members out of $Rp_7$ to $Rp_{11}$ and $Rp_{12}$ to $Rp_{16}$ may combine with each other to form a ring. Examples of the ring formed include the later-described ring R. The ring formed is preferably a benzene ring, a naphthalene ring, an anthracene ring, a pyridine ring, a pyrimidine ring or the like.

Furthermore, $Rp_3$ and $Rp_7$, or $Rp_6$ and $Rp_{16}$ may combine with each other. In the case where $Rp_3$ and $Rp_7$, or $Rp_6$ and $Rp_{16}$ are combined, a fused ring composed of four or more rings containing a naphthylene group and a phenyl group is formed. The linkage between $Rp_3$ and $Rp_7$ or between $Rp_6$ and $Rp_{16}$ may be a single bond.

The compound represented by formula (I) is a compound described in JP-A-2000-297068, and the compounds not described in this patent publication can also be produced in accordance with the synthesis methods described therein.

Specific examples of the compound represented by formula (I) are illustrated below, but the present invention is not limited thereto.

-continued
(1)
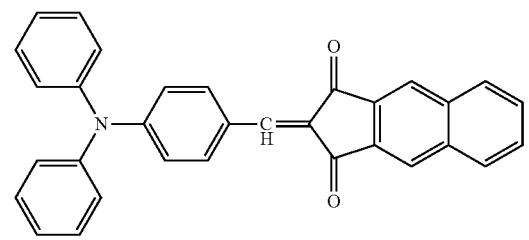
(2)
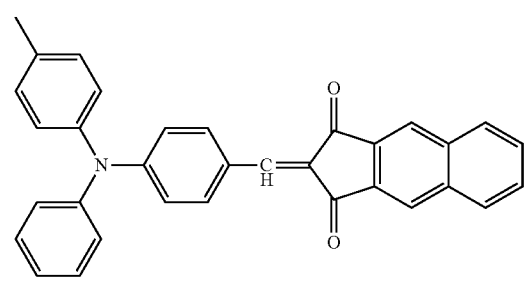
(3)
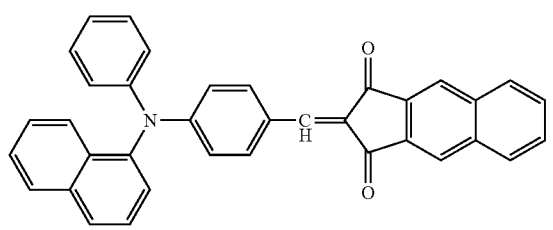
(4)
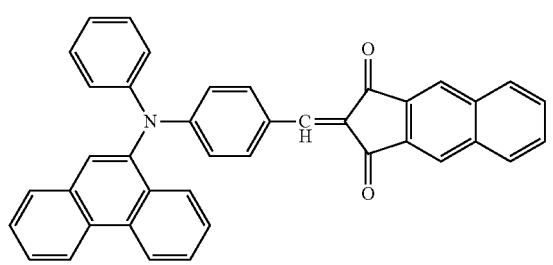
(5)
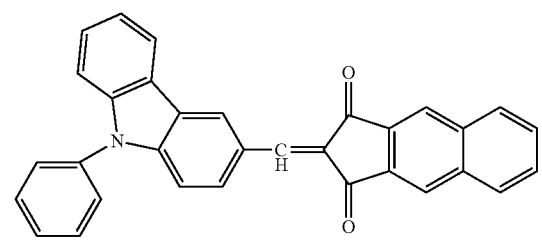
(6)
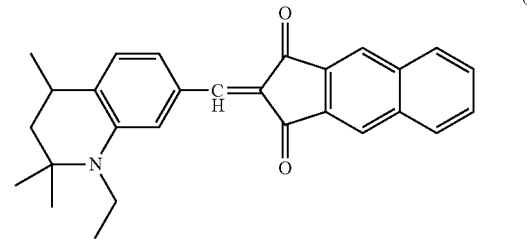
(7)
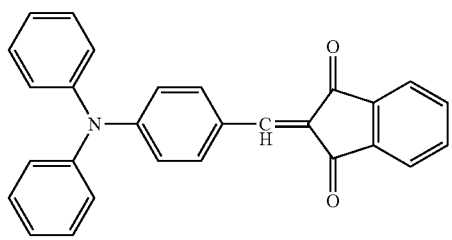
(8)
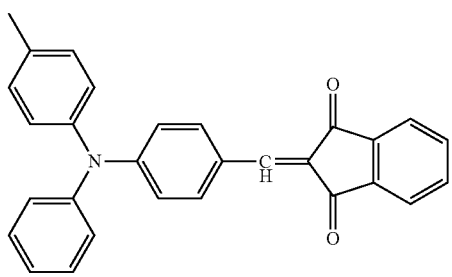
(9)
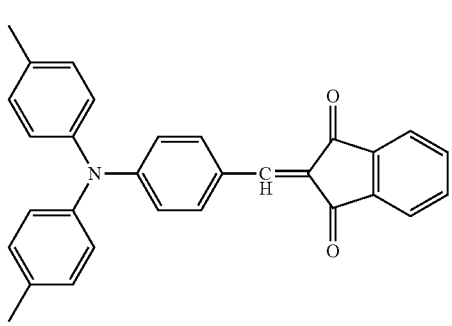
(10)
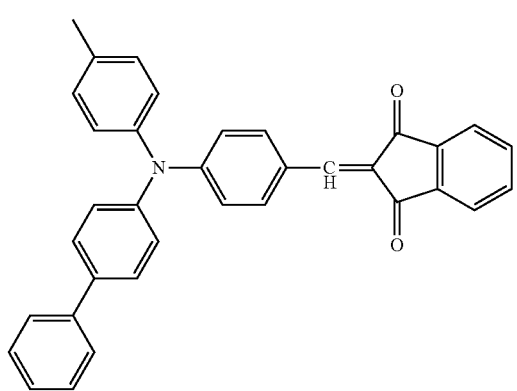
(11)
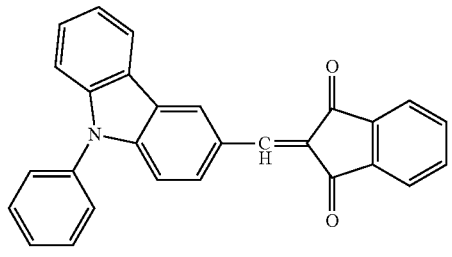

-continued
(12)
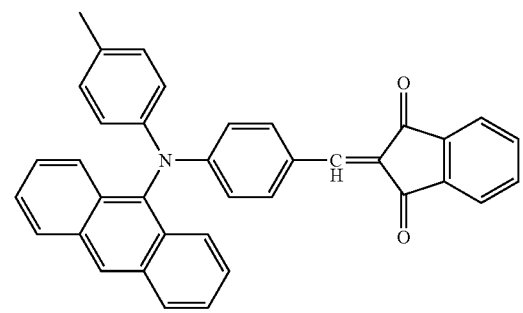
(13)
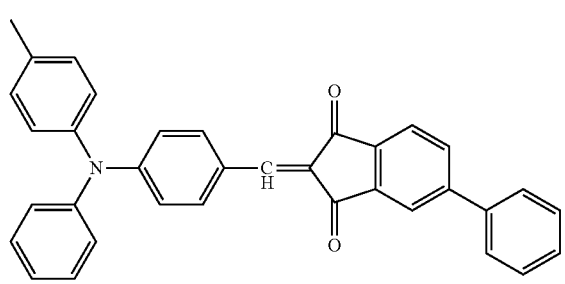
(14)
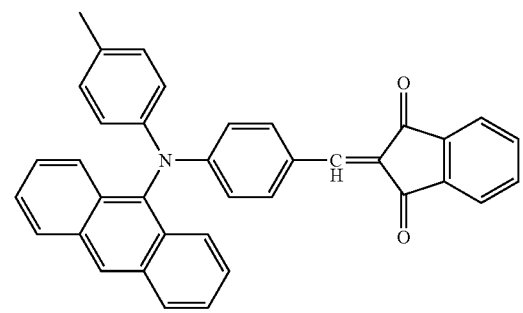
(15)
(16)
(17)
-continued
(18)
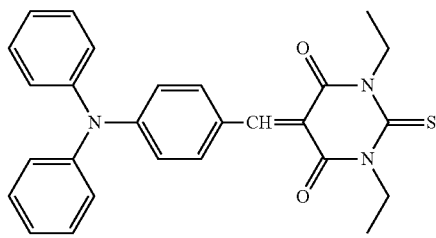
(19)
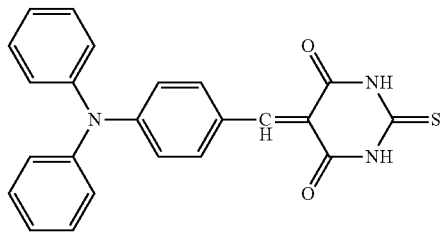
(20)
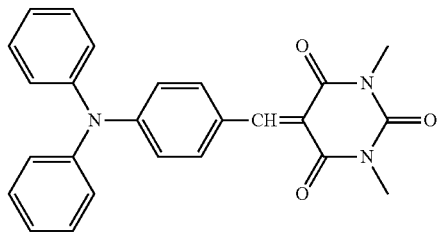
(21)
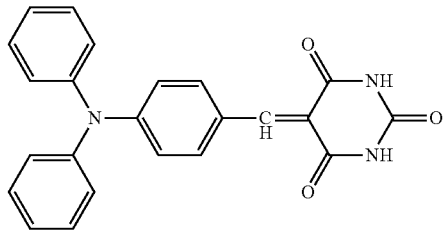
(22)
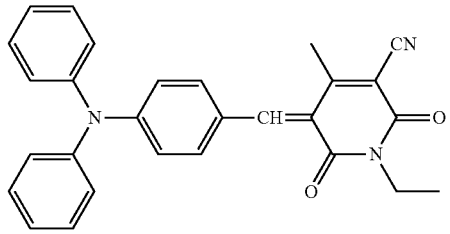
(23)
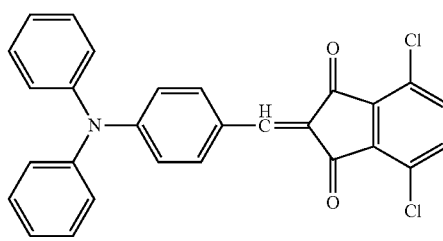

-continued
(24)
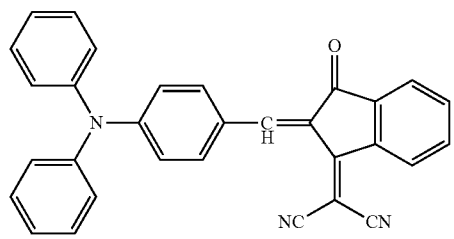
(25)
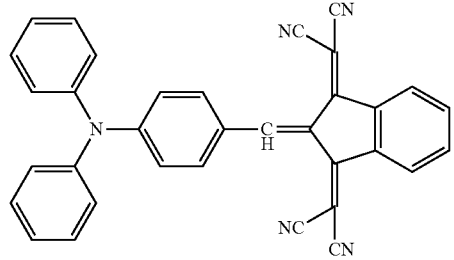
(26)
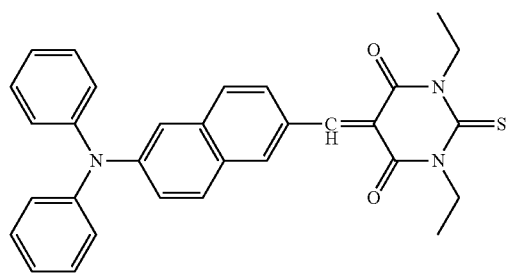
(27)
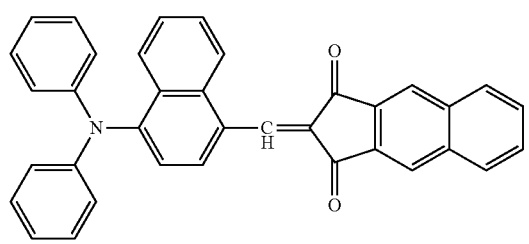
(28)
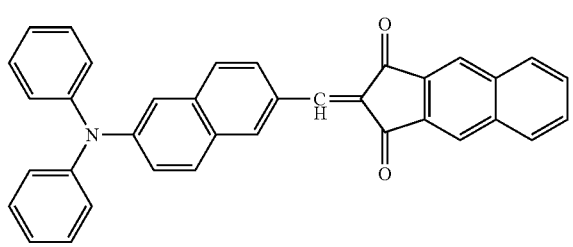
(29)
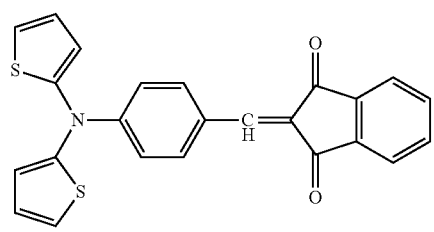
-continued
(30)
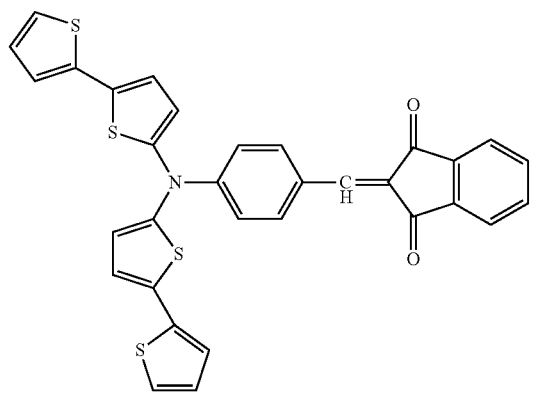
(31)
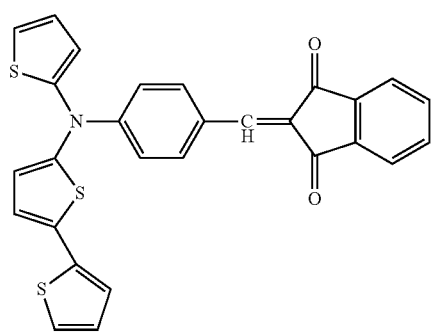
(32)
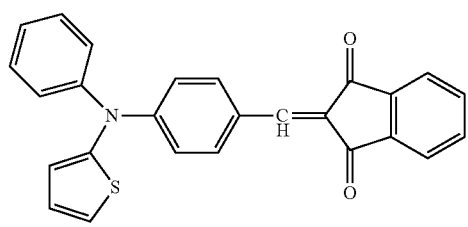
(33)
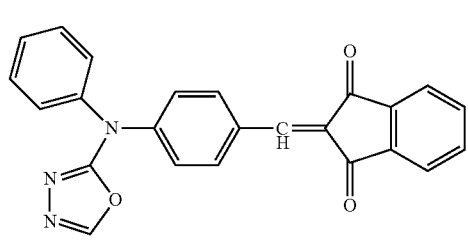
(34)
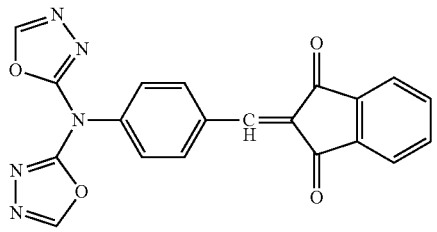

(35)
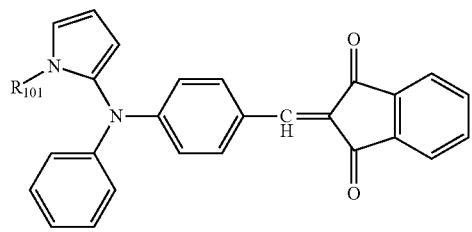
(36)
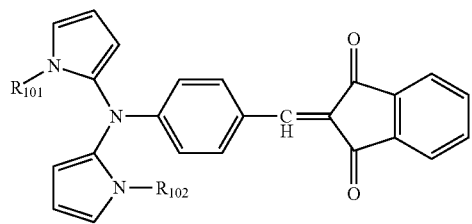
(37)
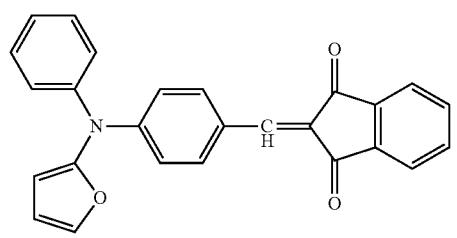
(38)
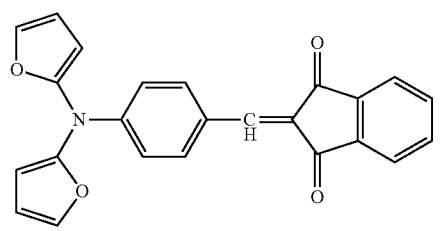
(39)
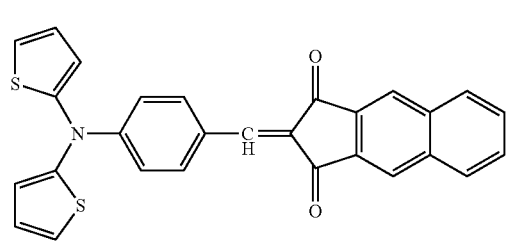
(40)
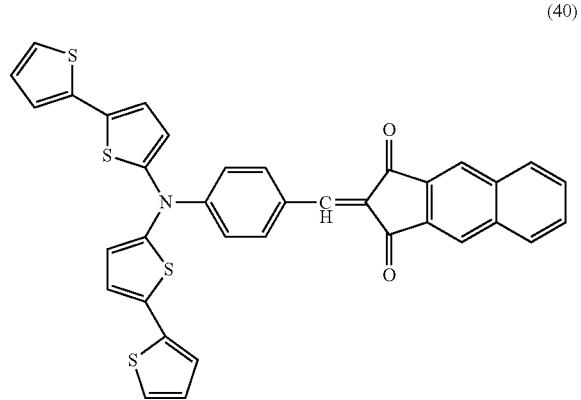
(41)
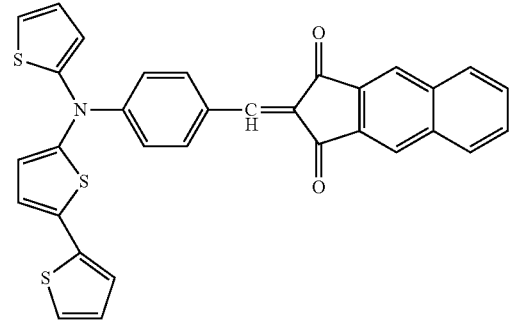
(42)
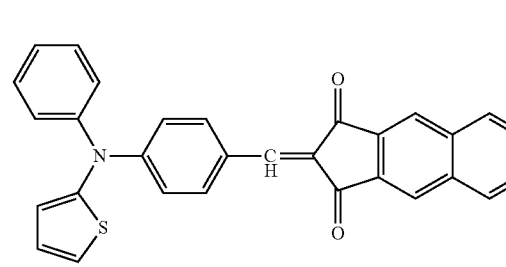
(43)
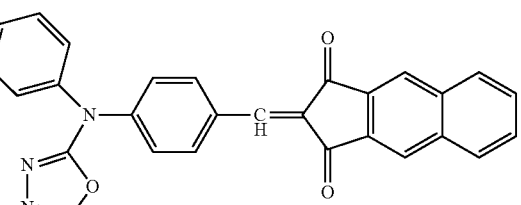
(44)
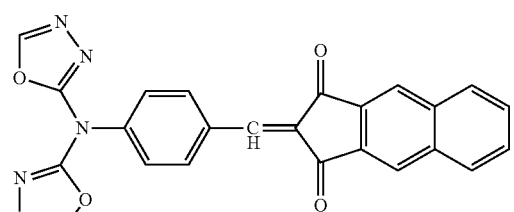
(45)
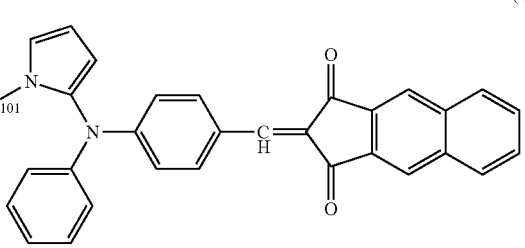
(46)
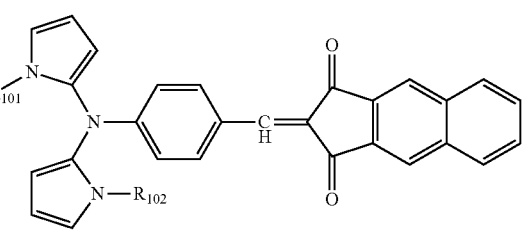

111
-continued
(47)
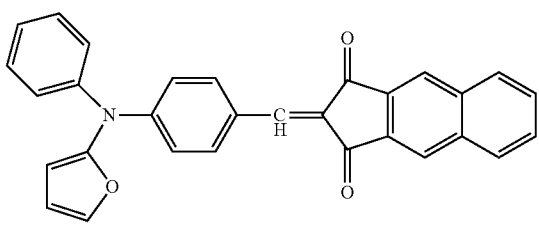
(48)
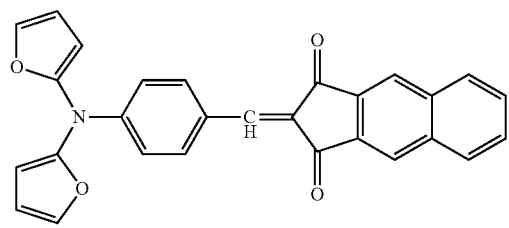
(49)
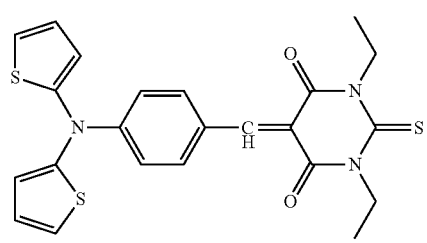
(50)
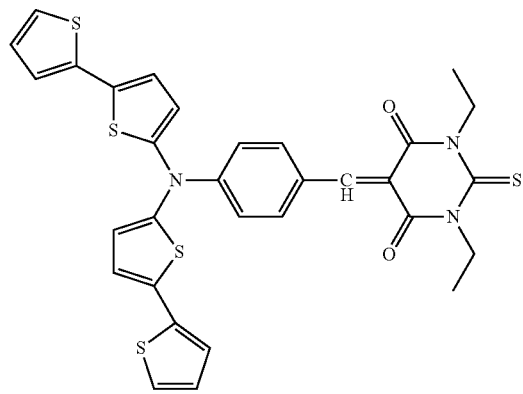
(51)
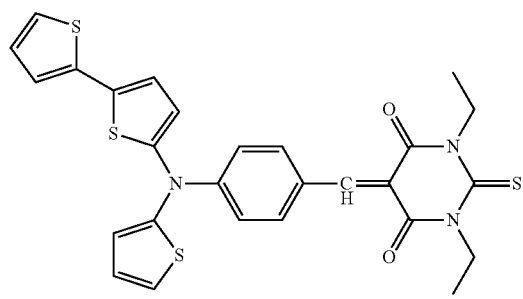
112
-continued
(52)
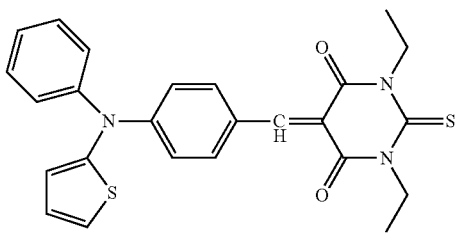
(53)
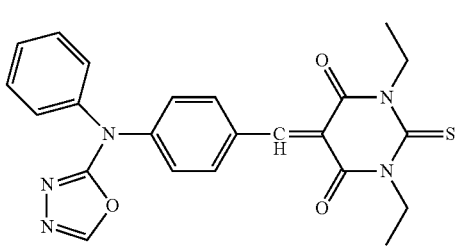
(54)
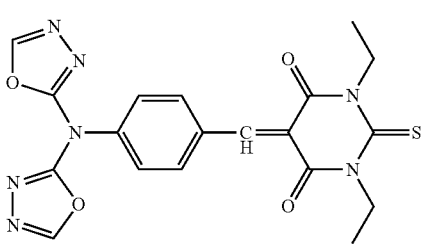
(55)
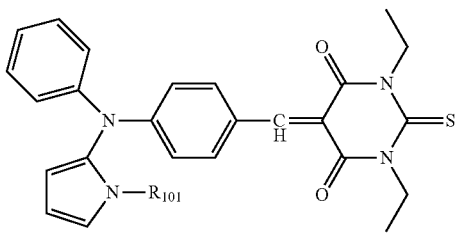
(56)
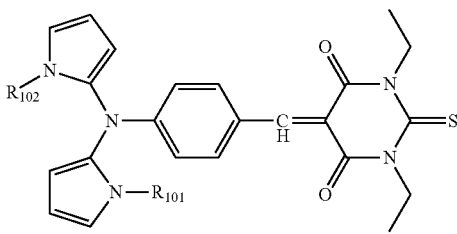
(57)
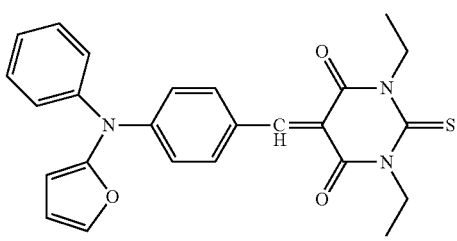

113
-continued
(58)
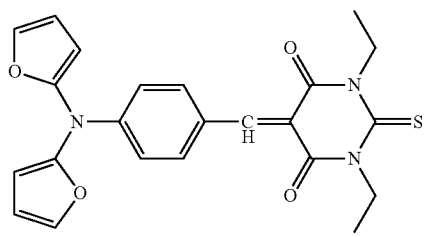
(59)
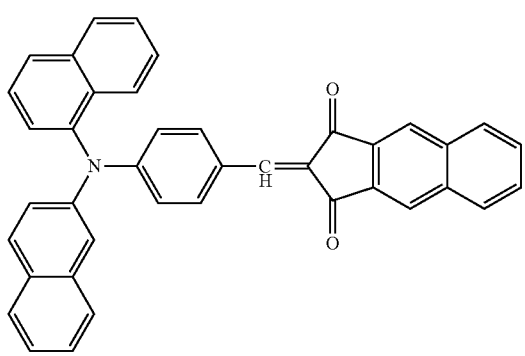
(60)
(61)
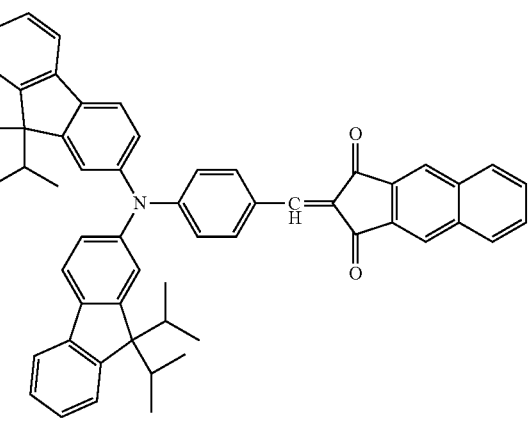
114
-continued
(62)
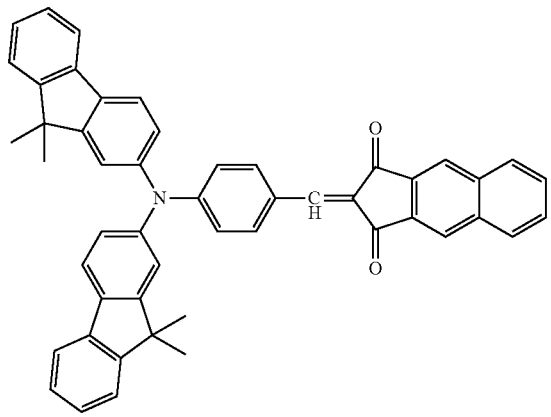
(63)
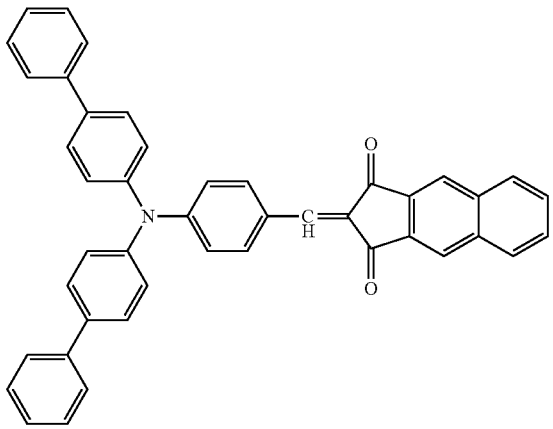
(64)
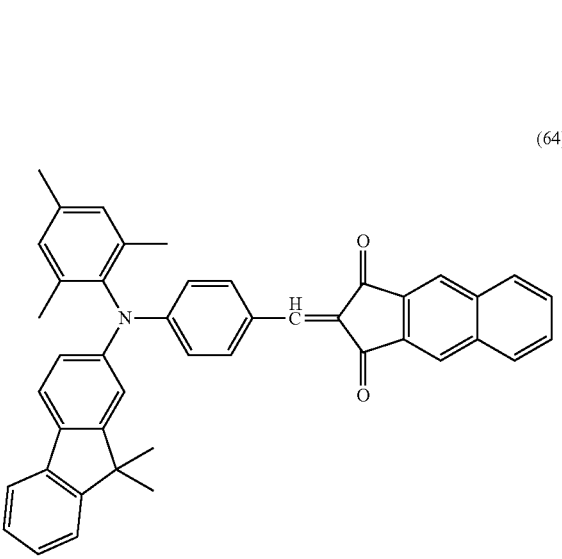

-continued
(65)
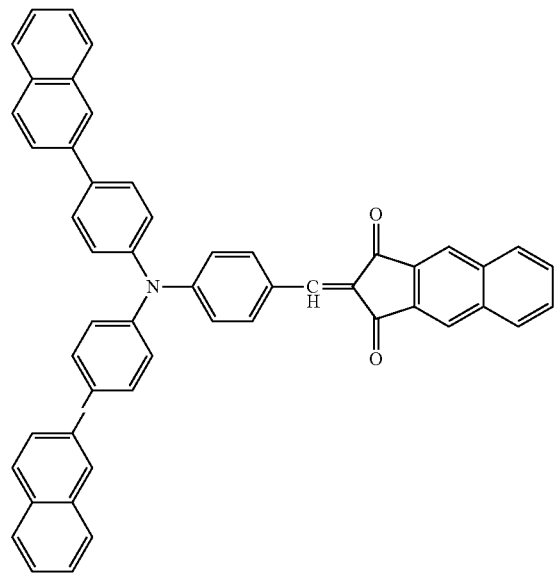
(66)
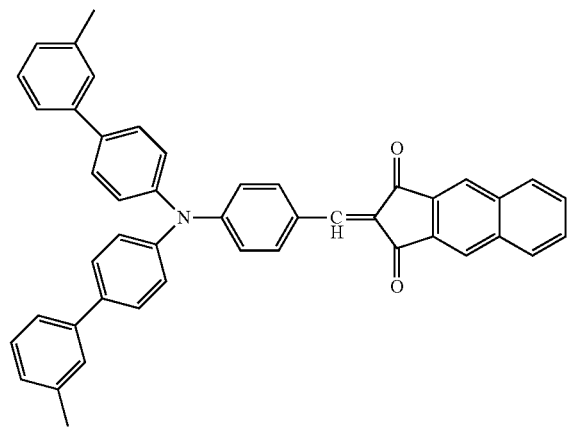
(67)
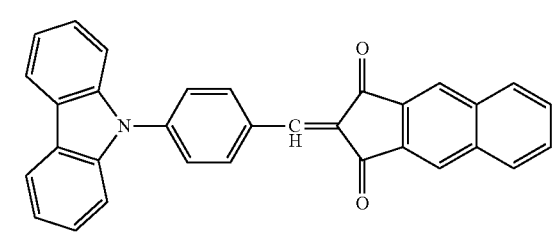
-continued
(68)
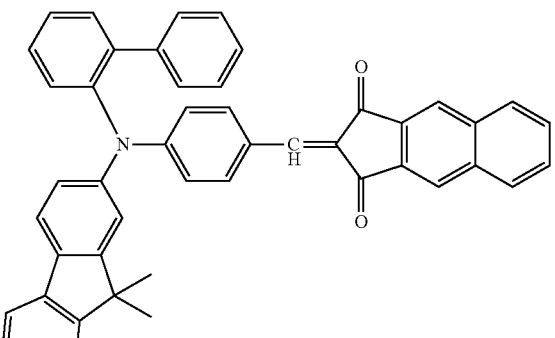
(69)
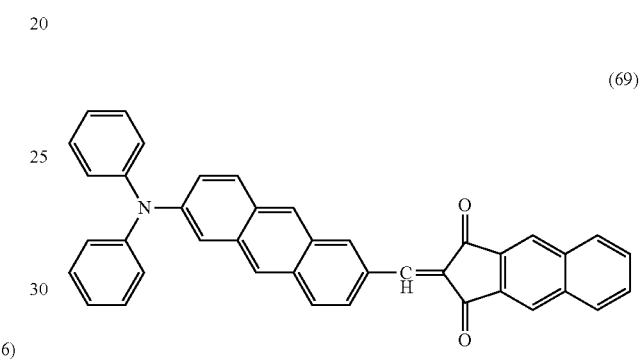
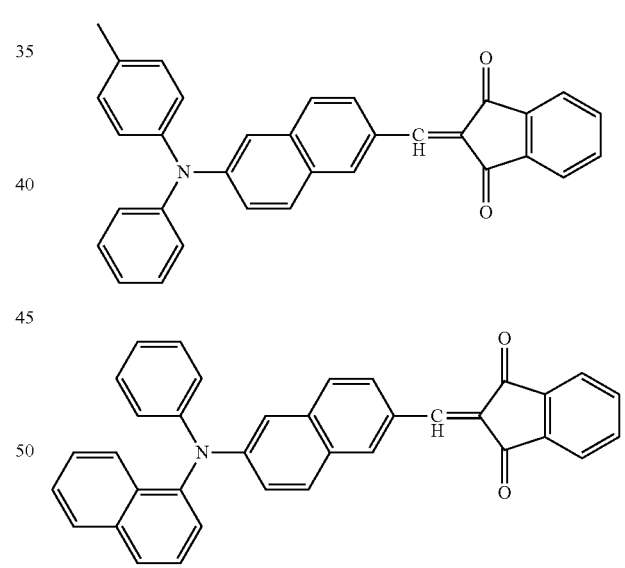
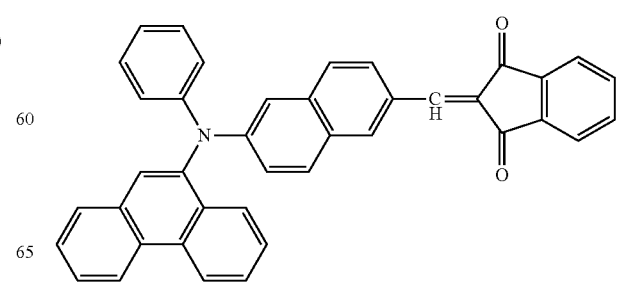

117
-continued
118
-continued
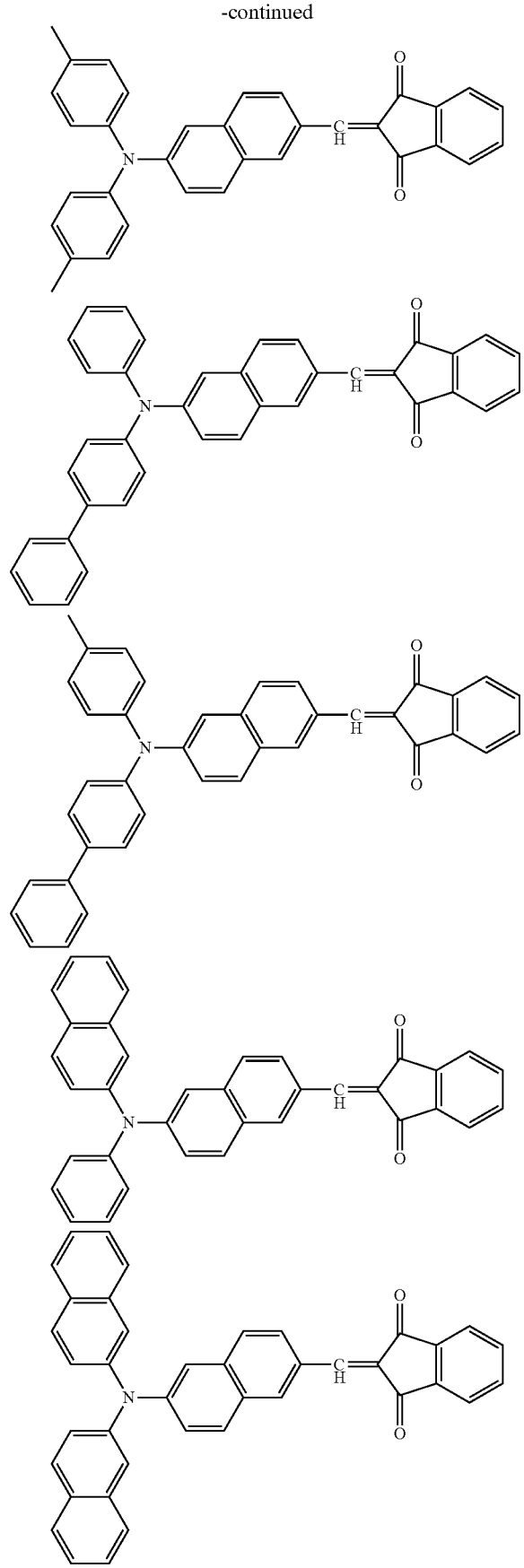
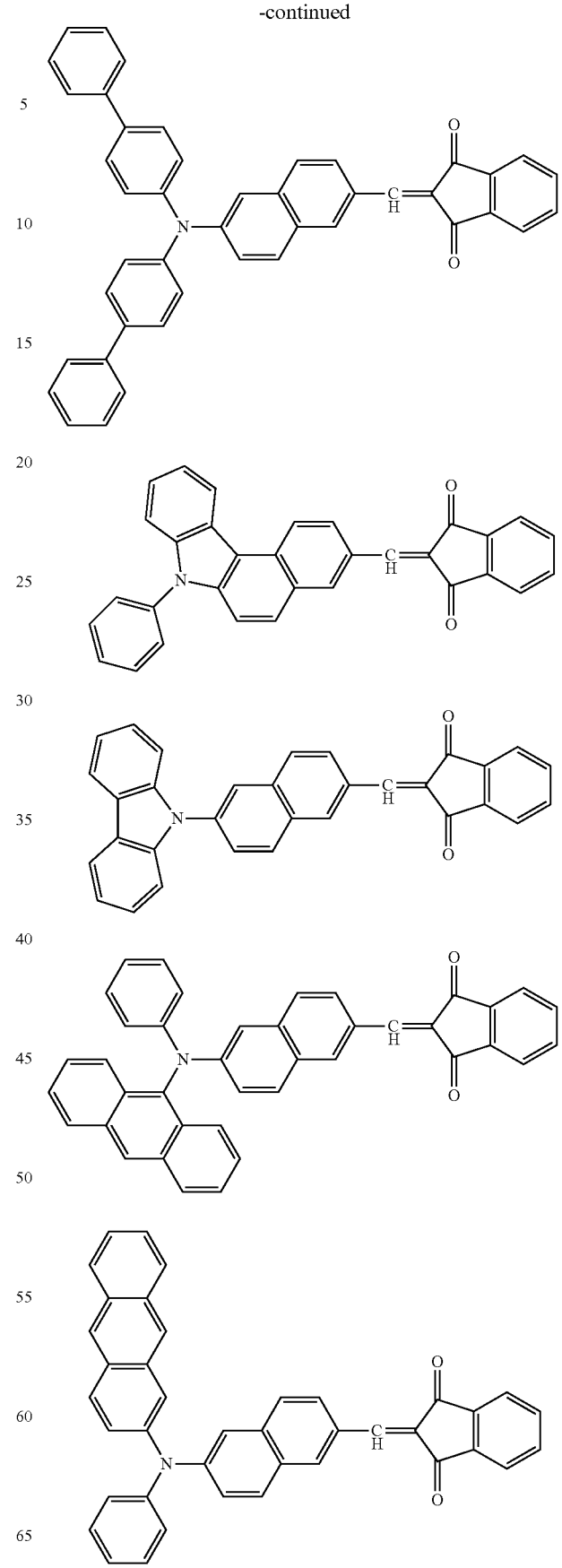

119
-continued
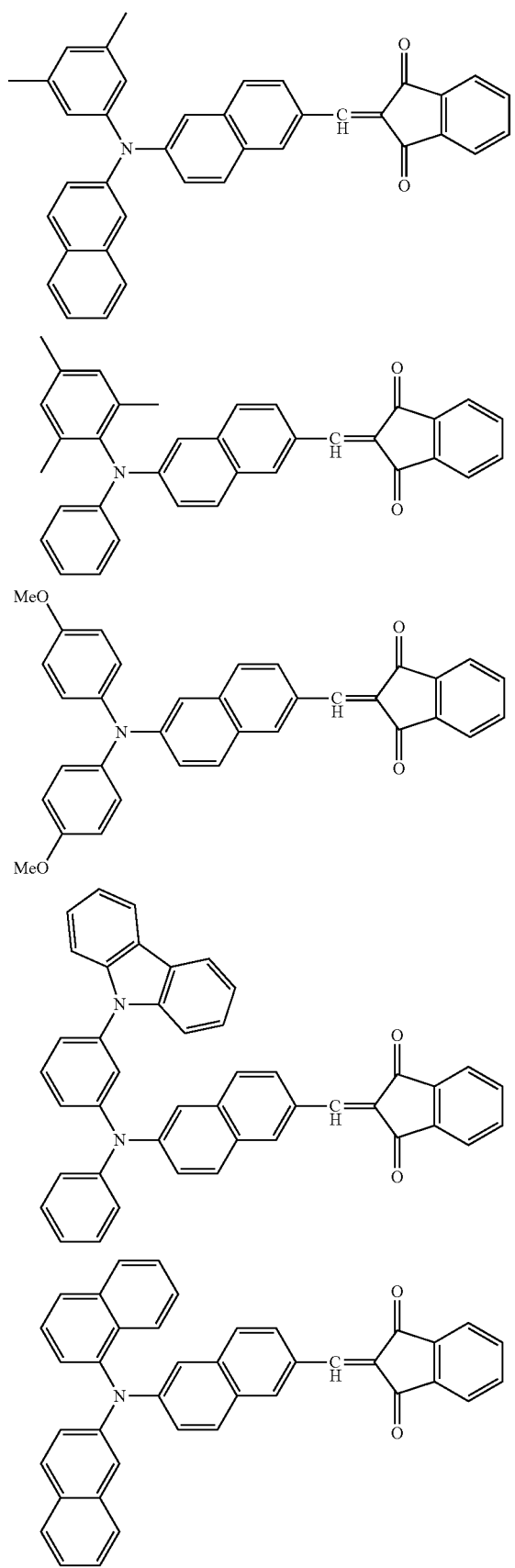
120
-continued
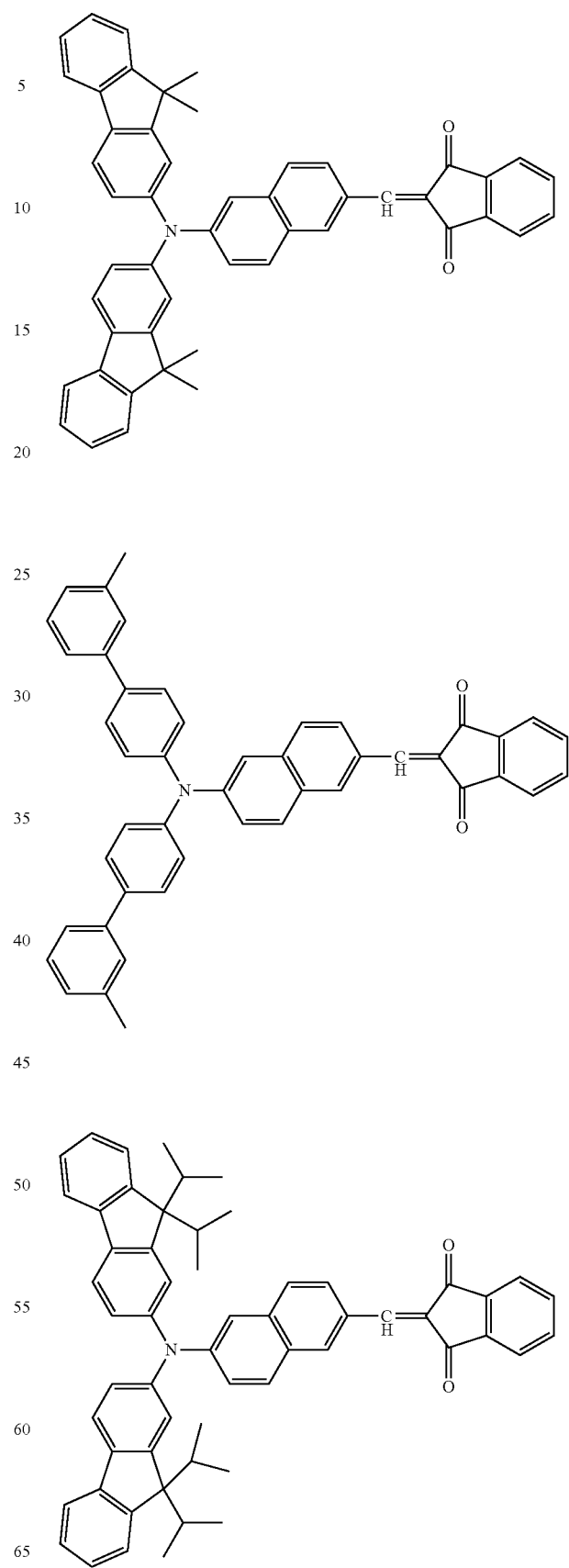

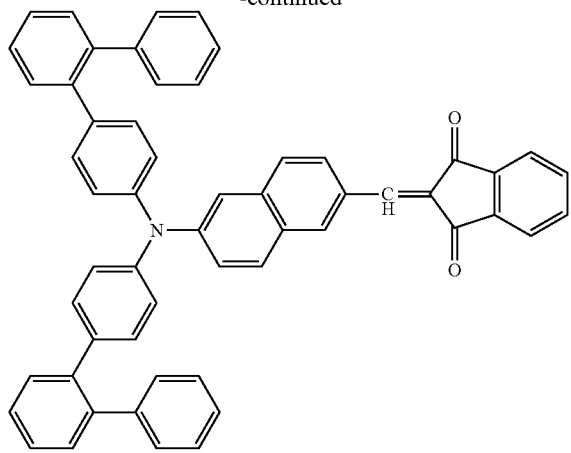
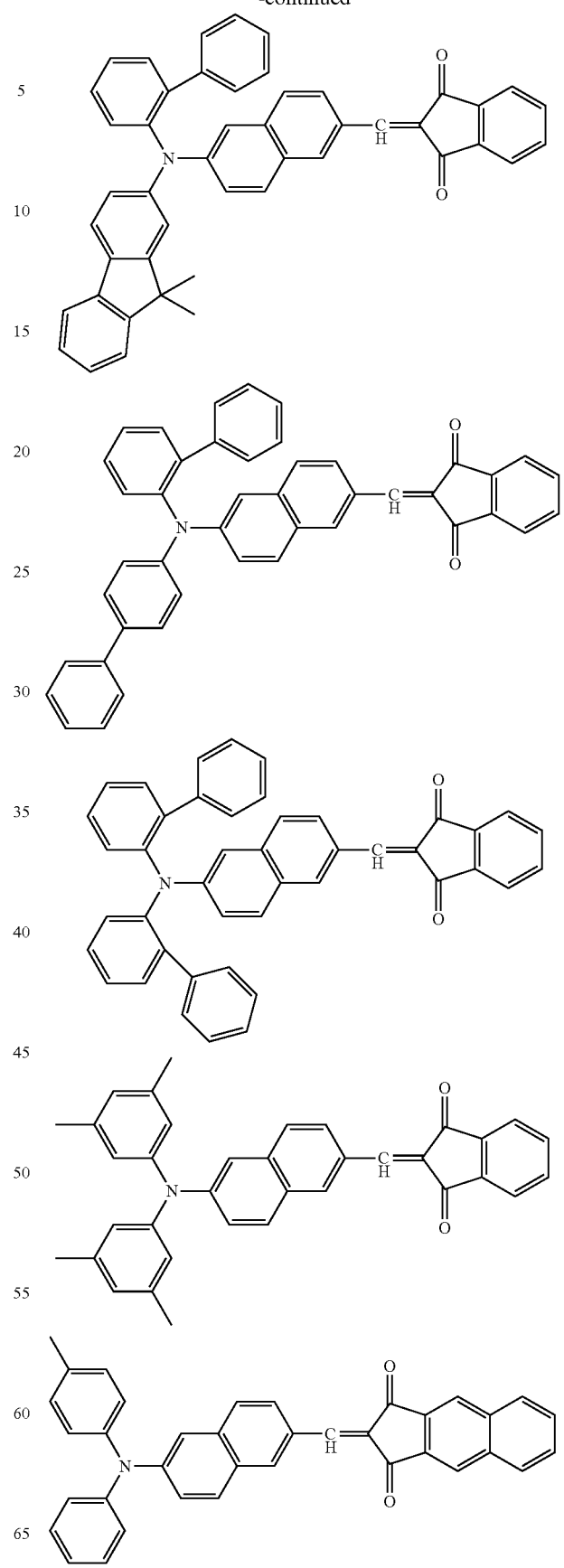

123
-continued
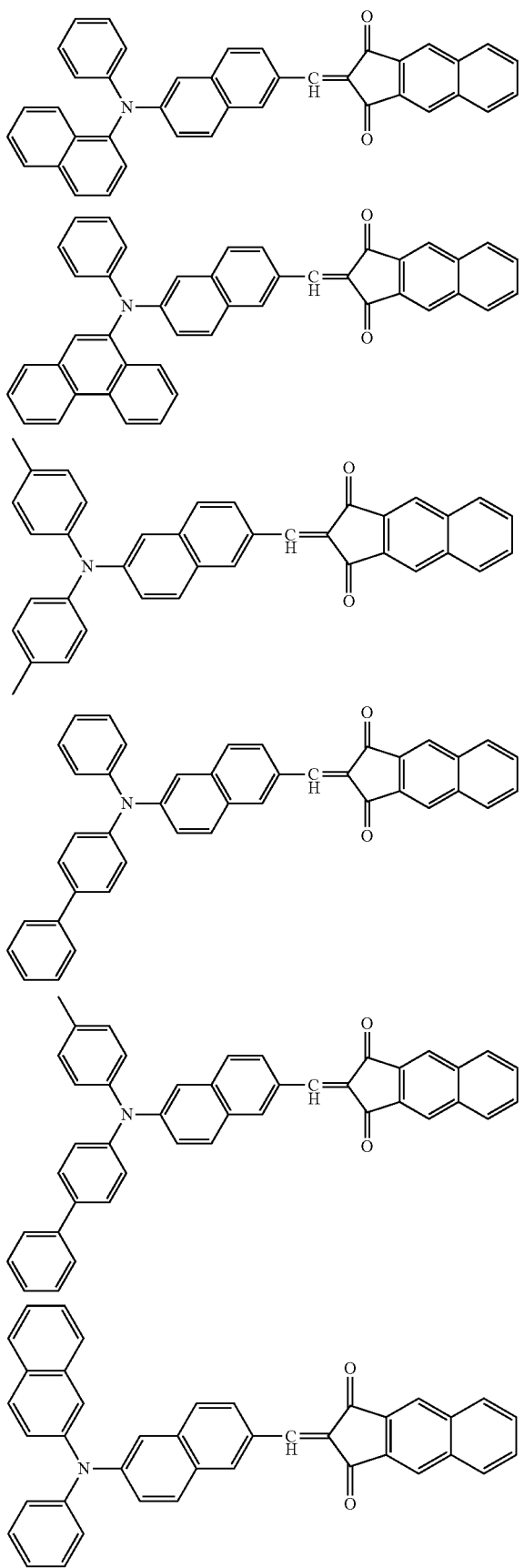
124
-continued
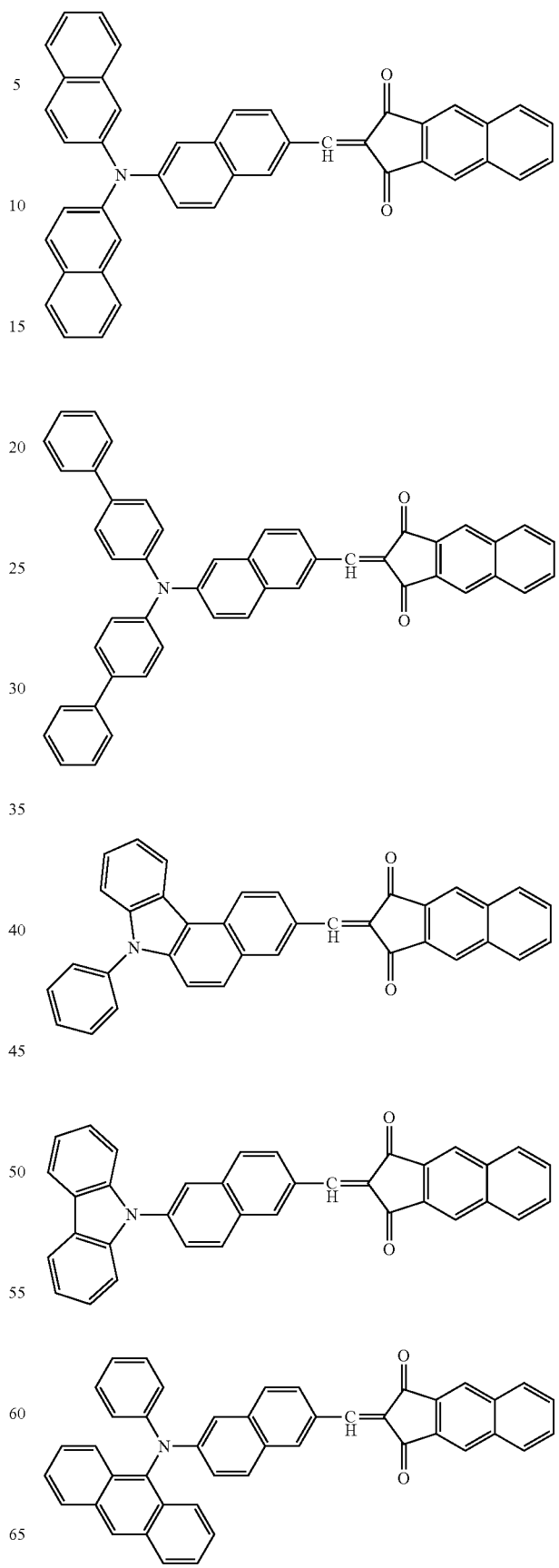

125
-continued
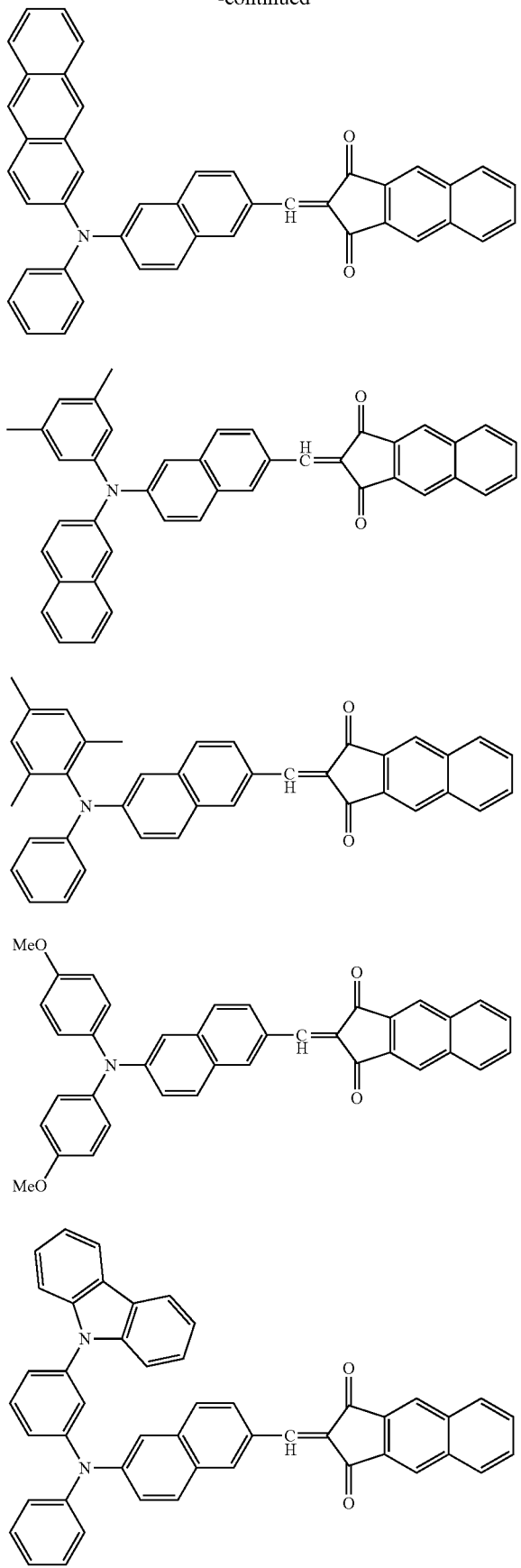
126
-continued
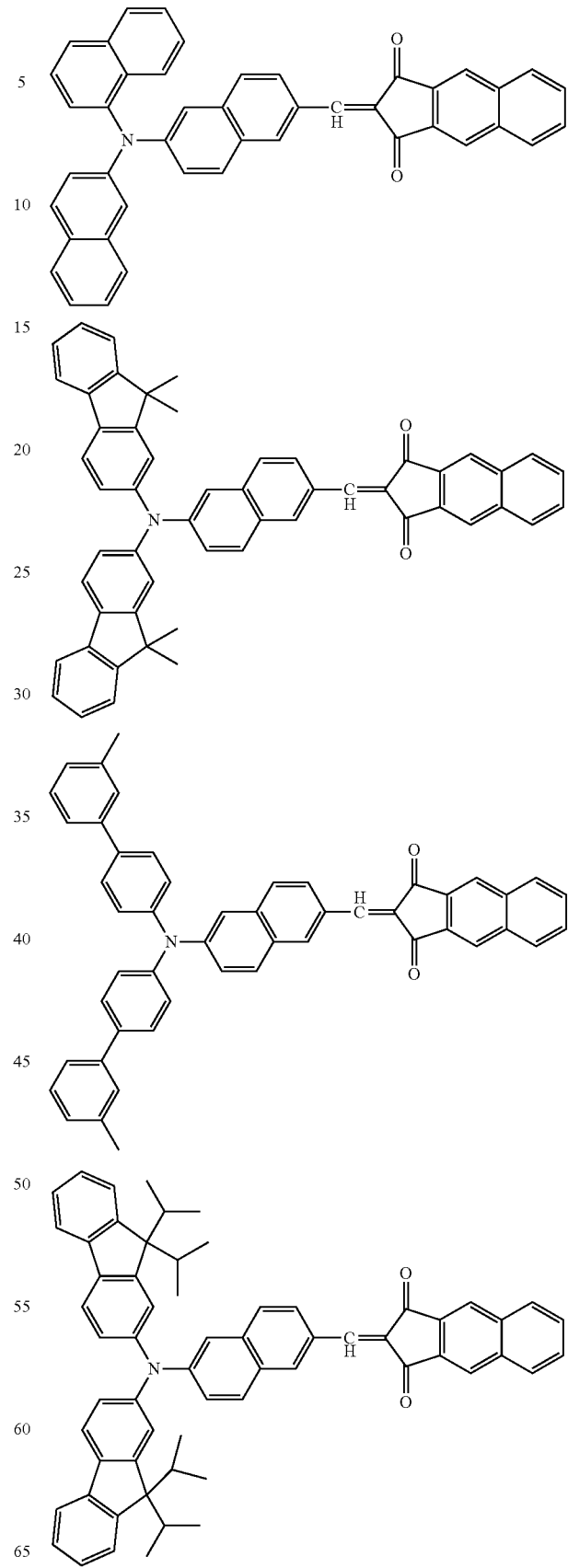

127
-continued
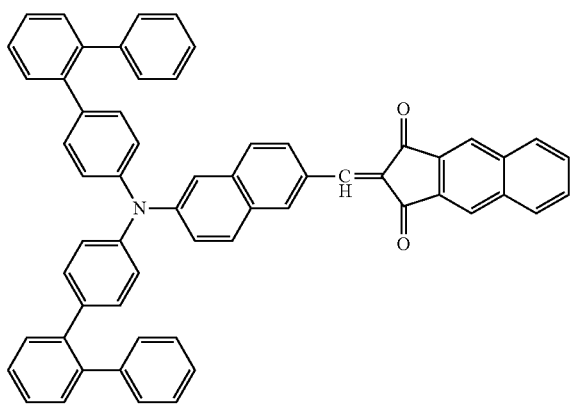
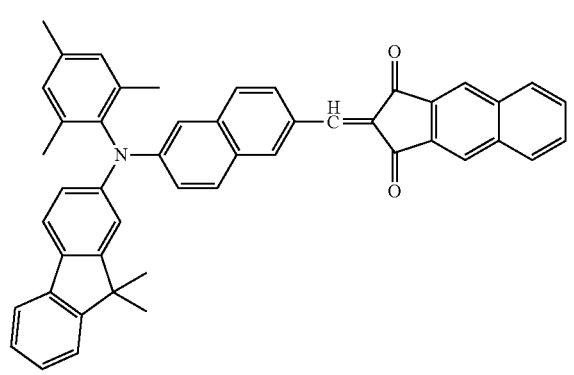
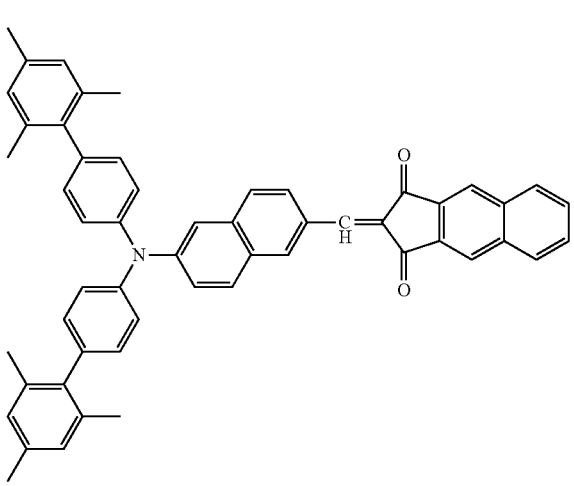
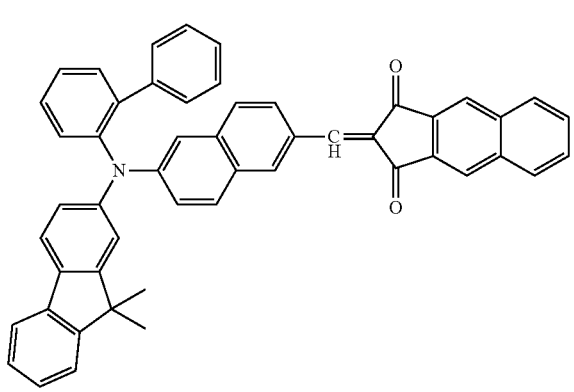
128
-continued
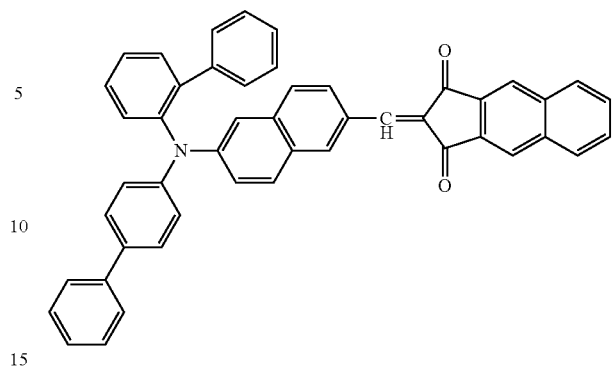
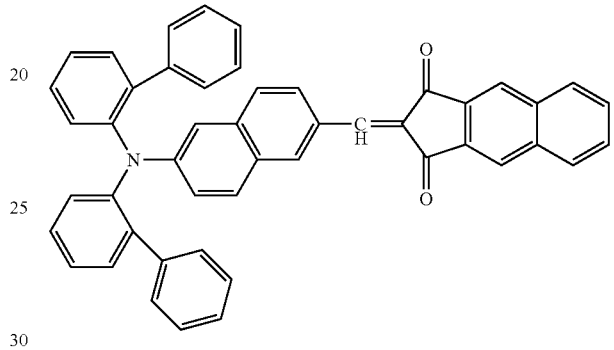
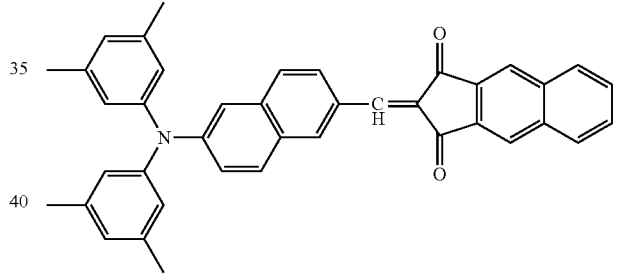
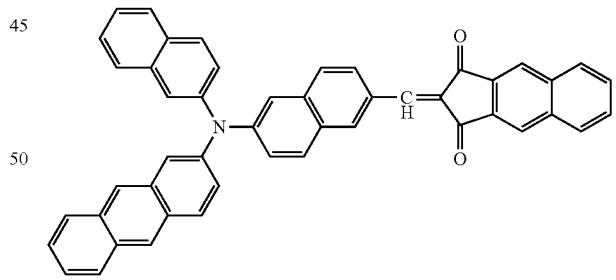
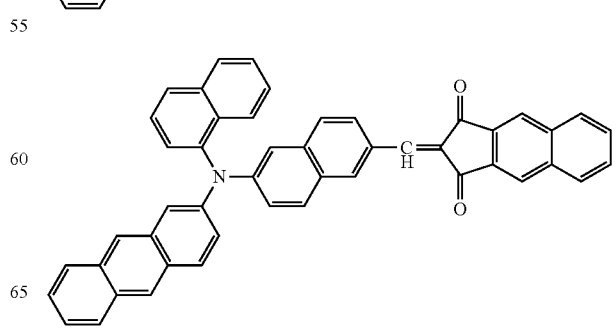

129
-continued
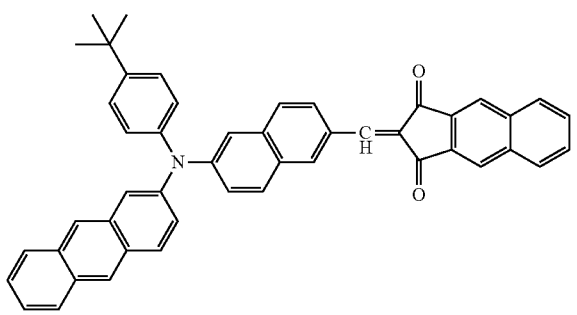
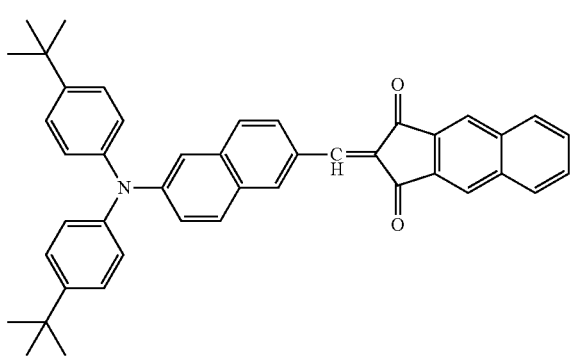
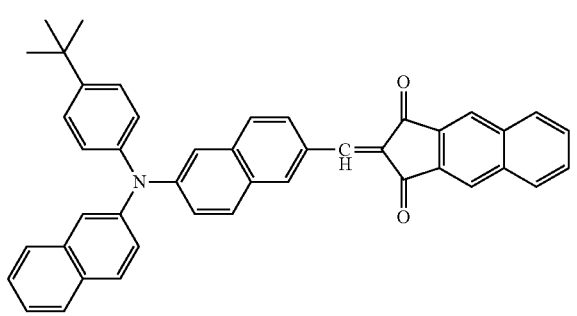
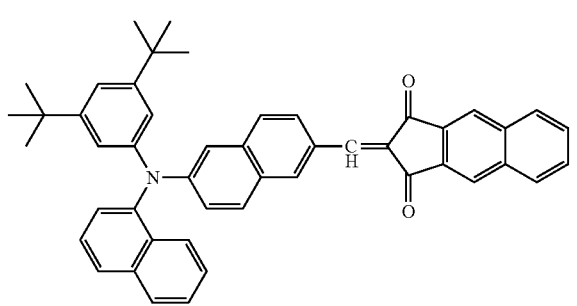
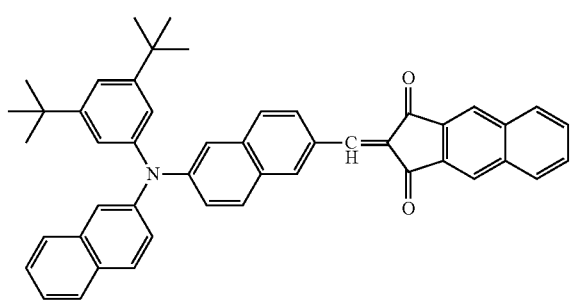
130
-continued
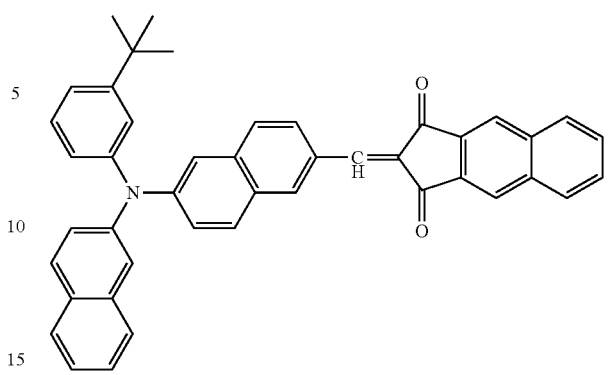
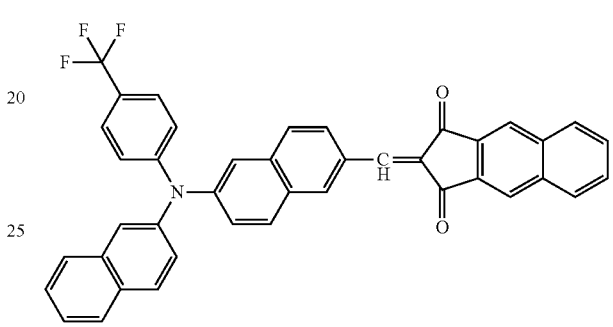
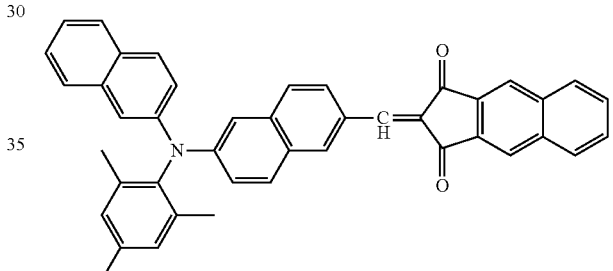
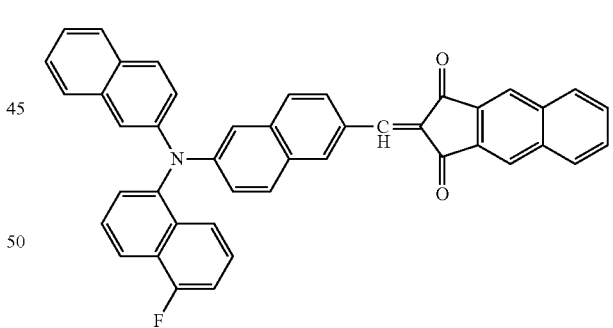
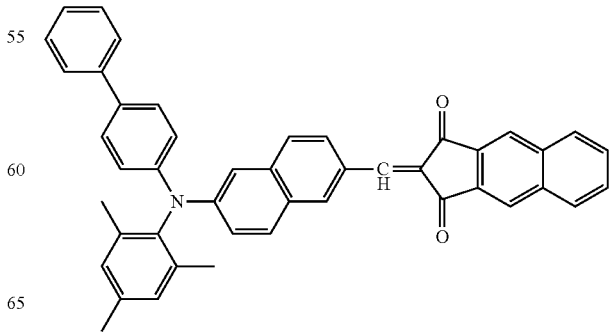

131
-continued
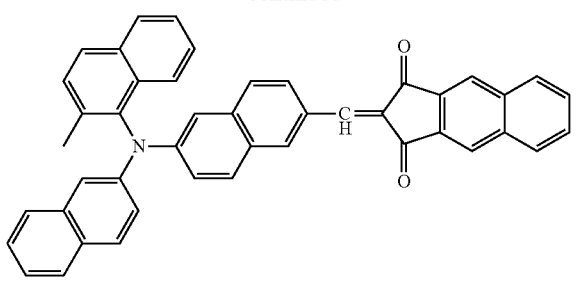
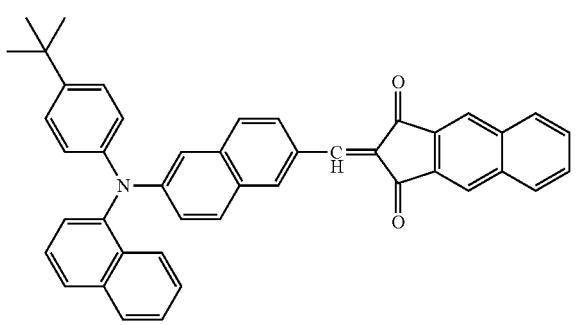
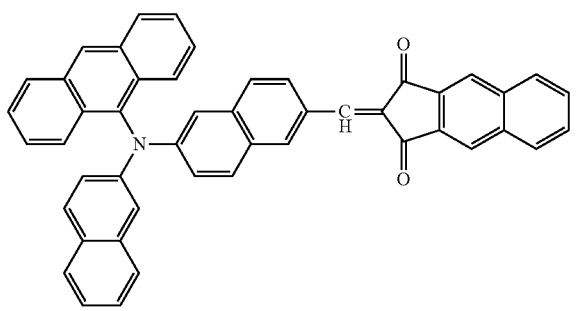
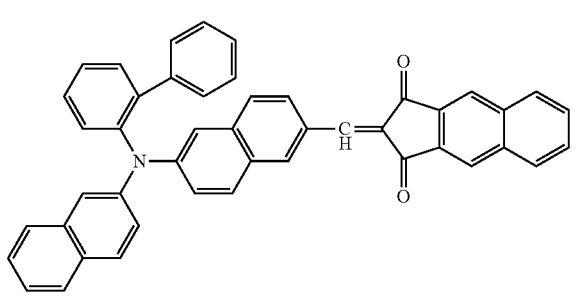
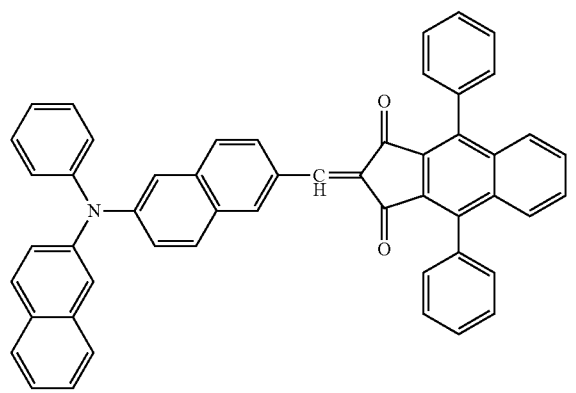
132
-continued
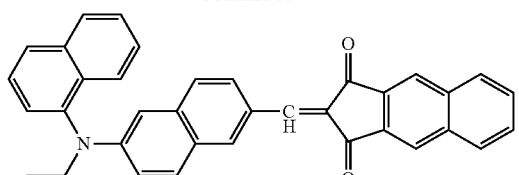
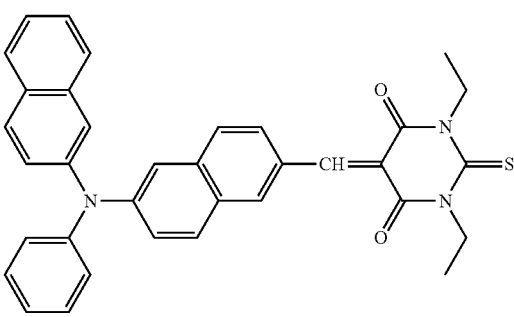
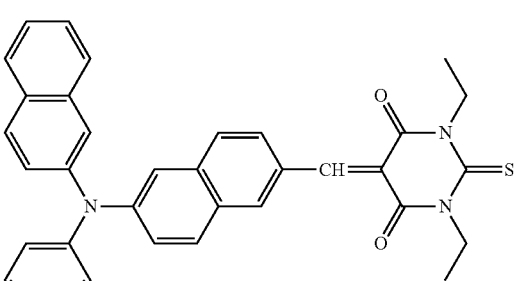
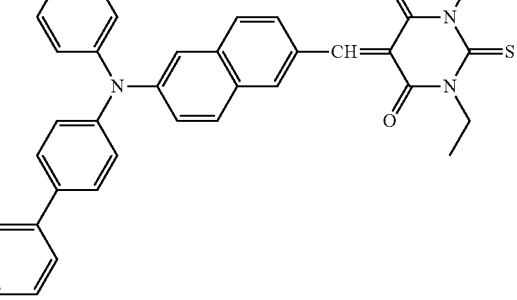

133
-continued
134
-continued
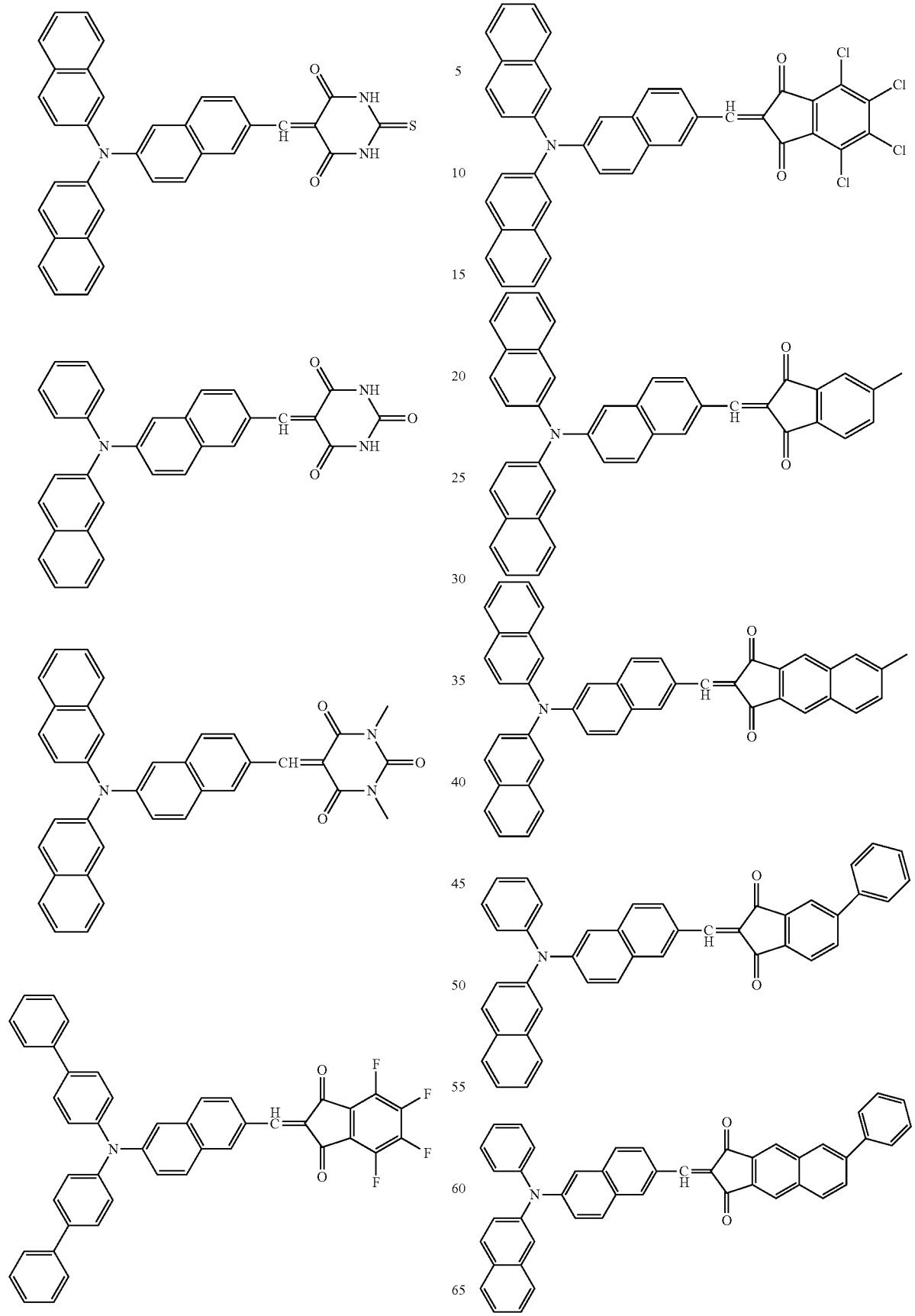

135
-continued
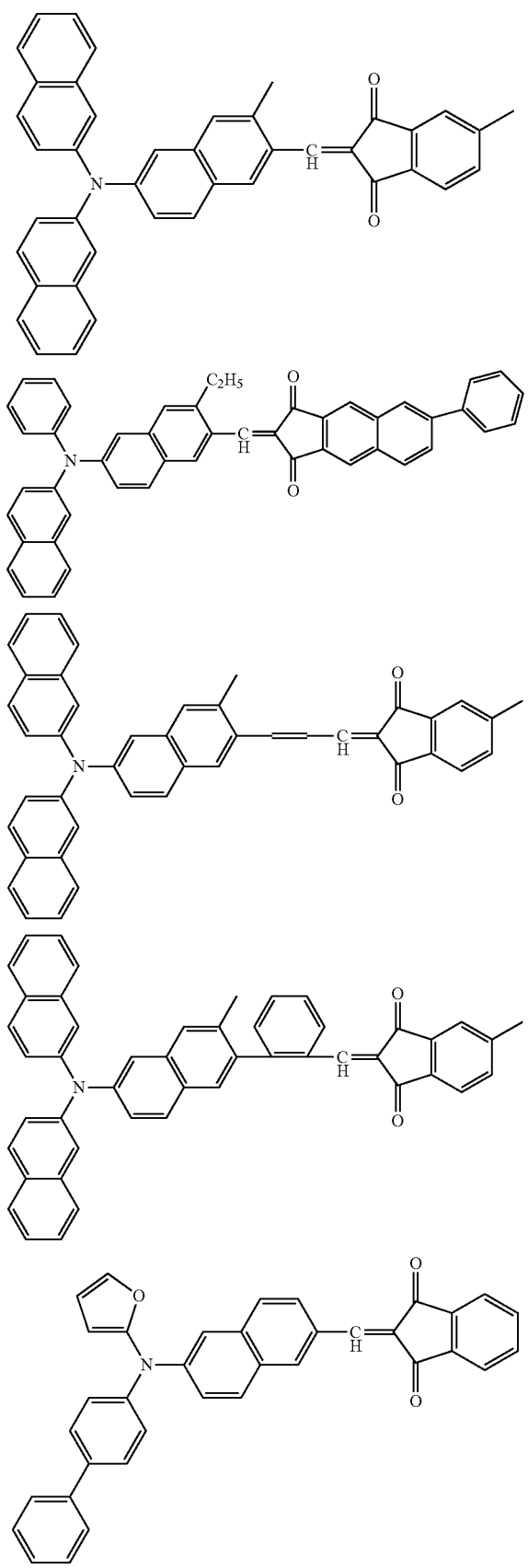
136
-continued
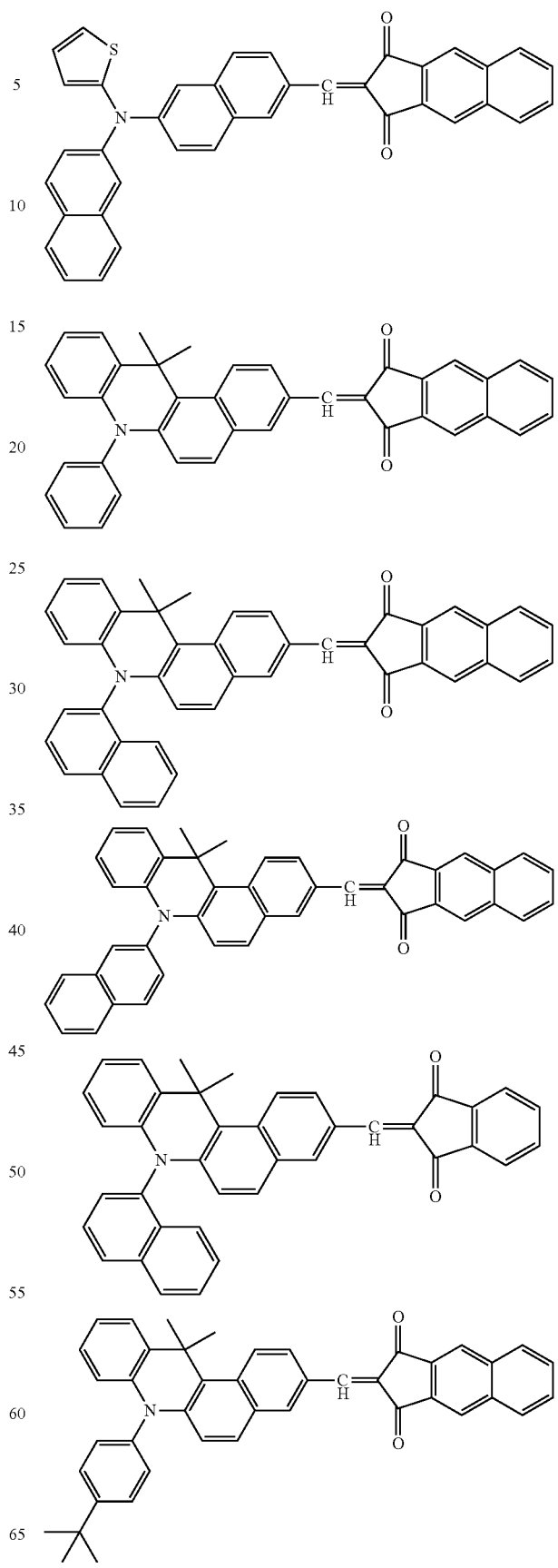

137
-continued
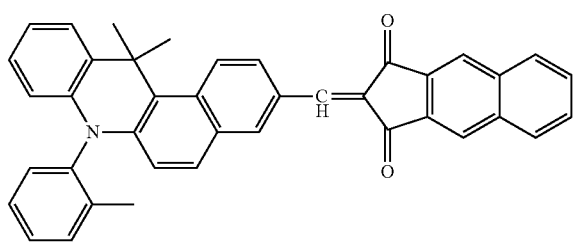
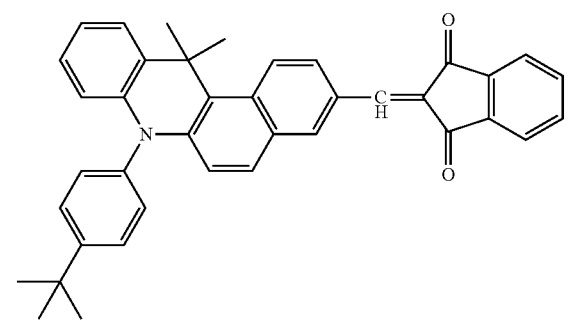
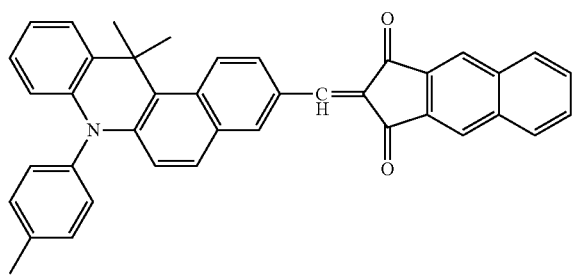
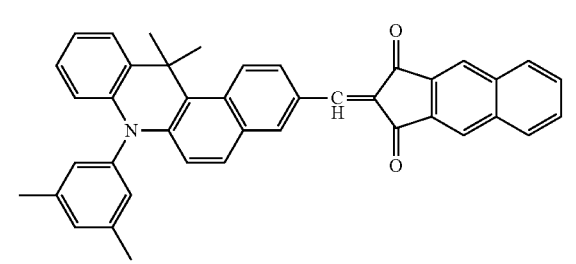
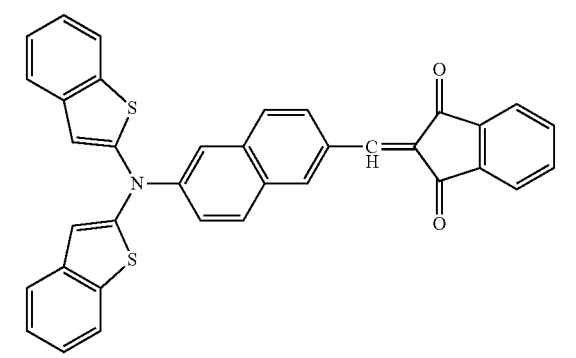
138
-continued
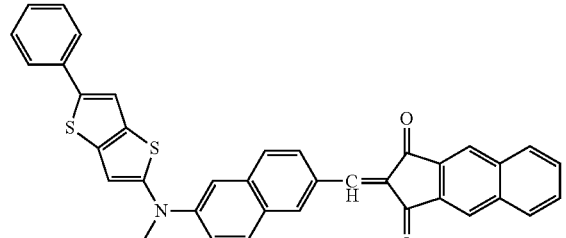
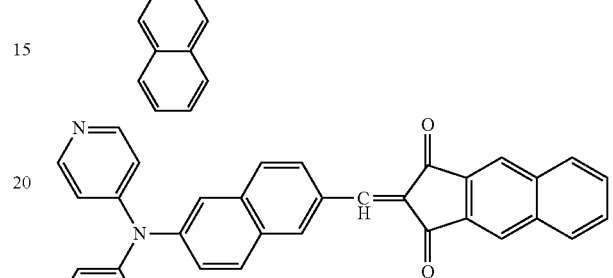
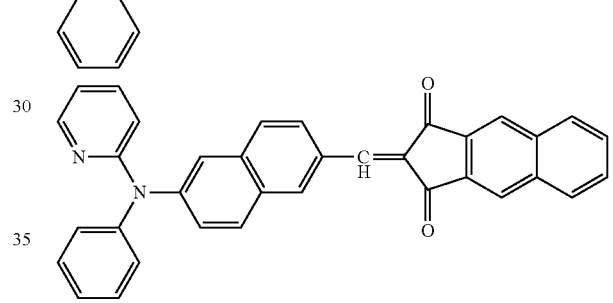
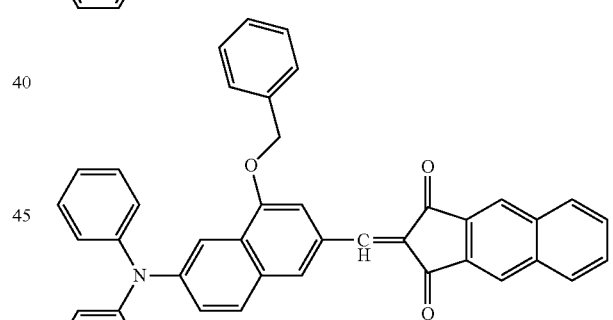
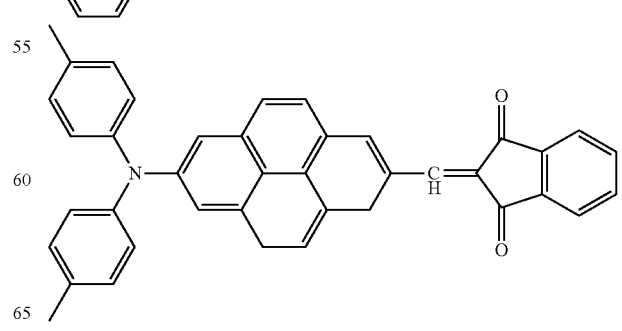

In the compounds illustrated above, each of $R_{101}$ and $R_{102}$ independently represents a hydrogen atom or a substituent. Examples of the substituent include the substituent W, and the substituent is preferably an alkyl group or an aryl group.

Moreover, the compound represented by formula (I), for example, can be synthesized in accordance with the following reaction.

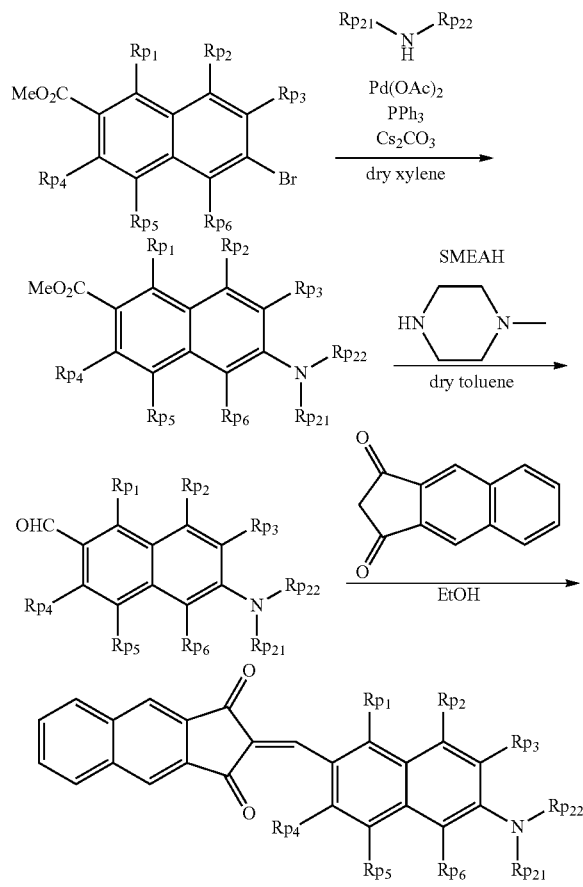

In the above formula, $Rp_1$, $Rp_2$, $Rp_3$, $Rp_4$, $Rp_5$, $Rp_6$, $Rp_{21}$ and $Rp_{22}$ have the same meanings as the above.

In the above synthesis example, the case that $Z_1$ is 1,3-benzoindanedione nucleus, among compounds represented by formula (I), is exemplified. But, when $Z_1$ represents other structure, a compound represented by formula (I) can be also synthesized in the same manner as the above by changing 1,3-benzoindanedione as above to a compound which becomes an acid nucleus in the other merocyanine dye.

The n-type organic semiconductor (compound) is an acceptor-type organic semiconductor (compound) and indicates an organic compound having a property of readily accepting an electron, mainly typified by an electron-transporting organic compound. More specifically, this is an organic compound having a larger electron affinity when two organic compounds are used in contact.

Accordingly, for the acceptor-type organic compound, any organic compound can be used as long as it is an organic compound having an electron accepting property. Examples thereof include a fused aromatic carbocyclic compound (naphthalene, anthracene, fullerene, phenanthrene, tetracene, pyrene, perylene, fluoranthene, and derivatives thereof), a 5- to 7-membered heterocyclic compound containing a nitrogen atom, an oxygen atom or a sulfur atom (e.g., pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyralidine, pyrrolopyridine, thiadiazolopyridine, dibenzazepine, tribenzazepine), a polyarylene compound, a fluorene compound, a cyclopentadiene compound, a silyl compound, and a metal complex having a nitrogen-containing heterocyclic compound as a ligand. The acceptor-type organic semiconductor is not limited to these compounds and, as described above, any organic compound having an electron affinity larger than that of the organic compound used as the donor-type organic compound may be used as the acceptor-type organic semiconductor.

As for the n-type organic semiconductor, a compound having Ea of 3.4 to 5.2 eV is preferred, and a compound having Ea of 3.9 to 4.5 eV is more preferred. Specifically, a fullerene or a fullerene derivative is preferably used.

The fullerene indicates fullerene $C_{60}$, fullerene $C_{70}$, fullerene $C_{76}$, fullerene $C_{78}$, fullerene $C_{80}$, fullerene $C_{82}$, fullerene $C_{84}$, fullerene $C_{90}$, fullerene $C_{96}$, fullerene $C_{240}$, fullerene $C_{540}$, a mixed fullerene or a fullerene nanotube, and the fullerene derivative indicates a compound obtained by adding a substituent to such a fullerene. The substituent is preferably an alkyl group, an aryl group or a heterocyclic group.

The compounds described in Patent Document 1 are preferred as the fullerene derivative.

As for the fullerene and fullerene derivative, the compounds described, for example, in *Kikan Kagaku Sosetsu (Scientific Review Quarterly)*, No. 43, edited by The Chemical Society of Japan (1999), JP-A-10-167994, JP-A-11-255508, JP-A-11-255509, JP-A-2002-241323 and JP-A-2003-196881 may also be used.

The content of the fullerene or fullerene derivative in a mixed layer with a p-type material is preferably 50% or more (by mol), more preferably 200% or more, still more preferably 300% or more, based on the amount of other materials forming the mixed film.

The organic compound constituting the photoelectric conversion layer or charge blocking layer of the present invention preferably has a chemical structure where hydrogen is partially or completely deuterated. Thanks to deuteration, it is expected that reactivity of the hydrogen is suppressed and device durability is improved.

[Material Property Parameters (N/C Ratio, O/C Ratio, Refractive Index, Carrier Concentration)]

(1) N/C Ratio:

The chemical structure of the organic compound constituting the photoelectric conversion layer or charge blocking layer of the present invention controls the electron donating ability and electron accepting ability and therefore, the ratio between the number of nitrogen atoms and the number of carbon atoms (N/C) in the film is important. N/C is preferably from 0 to 0.10, more preferably from 0 to 0.05.

(2) O/C Ratio:

The chemical structure of the organic compound constituting the photoelectric conversion layer or charge blocking layer of the present invention controls the electron donating ability and electron accepting ability and therefore, the ratio between the number of oxygen atoms and the number of carbon atoms (O/C) in the film is important. O/C is preferably from 0 to 0.3, more preferably from 0 to 0.10.

(3) Refractive Index:

The refractive index of the organic compound constituting the photoelectric conversion layer or charge blocking layer of the present invention can be measured by ellipsometry and is preferably from 1.5 to 3.0 at 600 nm. The refractive index increases when a large amount of a fullerene or fullerene derivative is contained in the photoelectric conversion layer and the charge blocking layer.

(4) Carrier Concentration:

The carrier concentration of the organic compound constituting the photoelectric conversion layer or charge blocking layer of the present invention is preferably from $1.0 \times 10^{10}$ to $1.0 \times 10^{20}$ carriers/cm$^3$. Higher mobility leads to higher sensitivity and higher response speed of the device and therefore, is preferred. Under the conditions of room temperature and an electric field intensity of $3 \times 10^5$ V/cm, the mobility is preferably $1 \times 10^{-5}$ cm$^2$/Vs or more, more preferably $1 \times 10^{-4}$ cm$^2$/Vs or more. The mobility can be measured by the TOF (Time Of Flight) method.

[Material Production Method (Storage Method, Particle Diameter)]

(1) Storage Method:

Each organic compound constituting the photoelectric conversion layer or charge blocking layer of the present invention is preferably stored in a hermetic container. The hermetic container is preferably composed of a moisture-proof material, and the water content (percentage of water content) of the organic compound in the hermetic container is preferably set to 0.1 wt % or less. The percentage of water content can also be measured by the Karl Fischer's method (standardized by Japanese Industrial Standards (JIS)) or thermal analysis (differential thermal analysis (DTA), differential scanning calorimetry (DSC)). The moisture-proof material is preferably a glass material, a metal material, a plastic material or a composite material thereof, more preferably a glass ampule. The moisture permeation coefficient of the moisture-proof material is 0.01 g/m$^2$·day or less, preferably 0.005 g/m$^2$·day or less, more preferably 0.001 g/m$^2$·day or less. The moisture-proof material is preferably low in the transmittance of ultraviolet ray (UV light) and visible light, and the transmittance is preferably 50% or less, more preferably 40% or less, still more preferably 30% or less. The oxygen permeability of the moisture-proof material preferably is preferably low and is preferably, at 25° C., 50 ml/atm·m$^2$·day or less, more preferably 10 ml/atm·m$^2$·day or less, yet still more preferably 1.0 ml/atm·m$^2$·day or less. The inside of the hermitic container and the inside of the depository for the hermitic container are preferably replaced with an inert gas (e.g., nitrogen, argon).

(2) Particle Diameter

As for the powder particle diameter of the organic compound constituting the photoelectric conversion layer or charge blocking layer of the present invention, the average particle diameter expressed by D50% above is from 10 to 200 μm, preferably from 20 to 180 μm, more preferably from 40 to 150 μm, still more preferably from 50 to 120 μm. If the average particle diameter is less than 10 μm, a stable deposition rate cannot be maintained due to electrostatic generation or the like resulting from an increase in the aggregation or contact of particles with each other, whereas if it exceeds 200 μm, the variation in droppage of particles per unit area becomes large and a stable deposition rate may not be maintained, either. Incidentally, D50% indicates the average particle diameter when powder particles are divided into two groups by the particle diameter and when the amount of particles on the large particle diameter side and that on the smaller particle diameter side become equal.

[Film Formation Method]

The photoelectric conversion layer and the charge blocking layer of the present invention can be formed by a dry film forming method or a wet film forming method. Examples of the dry film forming method which can be used include a vapor deposition method and a sputtering method. The wet film forming method is an effective film forming method in making a large area organic chemical layer. The vapor deposition may be either physical vapor deposition (PVD) or chemical vapor deposition (CVD), but physical vapor deposition such as vacuum deposition is preferred. In the case of depositing the layer by vacuum deposition, the production conditions such as vacuum degree and deposition temperature can be set according to conventional methods.

Examples of the wet film forming method which can be used include an inkjet method, a spray method, a nozzle printing method, a spin coating method, a dip coating method, a casting method, a die coating method, a roll coating method, a bar coating method and a gravure coating method. In view of high-precision patterning, an inkjet method is preferred.

The thickness of the photoelectric conversion layer is preferably from 10 to 1,000 nm, more preferably from 50 to 800 nm, still more preferably from 100 to 500 nm. With a thickness of 10 nm or more, a suitable dark current-reducing effect is obtained, and with a thickness of 1,000 nm or less, a suitable photoelectric conversion efficiency is obtained.

The photoelectric conversion device of the present invention is preferably fabricated by a production method including a step of depositing each of the photoelectric conversion layer and the electron blocking layer by vacuum heating deposition.

In the present invention, a photoelectric conversion device having a configuration where the photoelectric conversion film is composed of two or more layers containing an electron blocking layer and a photoelectric conversion layer is preferred, and a configuration where the electron blocking layer contains the compound represented by formula (Y1), formula (1) and formula (F-1) for use in the present invention and the photoelectric conversion layer contains the compound of formula (I) and a fullerene or a fullerene derivative is preferred. This configuration example is already shown in FIG. 1A. With respect to the method for applying a voltage in this configuration, the voltage is preferably applied by assigning the cathode to the electron blocking layer side and assigning the anode to the photoelectric conversion layer side. Also in the case of the configuration of FIG. 1B, a method of applying a voltage by assigning the cathode to the electron blocking layer material side is similarly preferred. The applied voltage can be selected from the range of 0 to 100 V but is preferably from 1 to 40 V, more preferably from 3 to 20 V. A higher voltage leads to higher efficiency but brings about an increase of dark current, and a lower voltage ensures low dark current but results in lower efficiency. Therefore, the applied voltage has an appropriate range. Furthermore, also in the case where the photoelectric conversion device of the present invention is used as a photosensor or incorporated into an imaging device, the voltage can be applied by the same method as above.

[Film Density]

The photoelectric conversion layer of the present invention is preferably formed in a state that a fullerene or a fullerene derivative and at least one kind of materials other than it are mixed or stacked. The film density of the photoelectric conversion layer of the present invention is preferably 1.40 g/cm$^3$ or more and 2.00 g/cm$^3$ or less, more preferably 1.50 g/cm$^3$ or more and 1.70 g/cm$^3$ or less

[Photosensor]

The photoelectric conversion device is roughly classified into a photocell and a photosensor, and the photoelectric conversion device of the present invention is suited for a photosensor. The photosensor may be a photosensor using the above-described photoelectric conversion device alone or may be in the mode of a line sensor where the photoelectric conversion devices are linearly arranged, or a two-dimensional sensor where the photoelectric conversion devices are arranged on a plane. The photoelectric conversion device of the present invention functions as an imaging device, in the line sensor, by converting the optical image information into electric signals with use of an optical system and a drive part like a scanner or the like and, in the two-dimensional sensor, by forming an image of optical image information on a sensor by means of an optical system and converting it into electric signals like an imaging module.

The photocell is a power generating unit and therefore, the efficiency of converting light energy into electric energy is an important performance, but the dark current that is a current in a dark place does not become a problem in function. Furthermore, a heating step in the later stage, such as placement of a color filter, is not required. In the photosensor, high-precision conversion of light/dark signals into electric signals is an important performance and in turn, the efficiency of converting light quantity into a current is also an important performance, but a signal when output in a dark place works out to a noise and therefore, a low dark current is required. Furthermore, the resistance to a step in the later sage is also important.

[Imaging Device]

Configuration examples of an imaging device equipped with the photoelectric conversion device 10a are described below. In the following configuration examples, the members and the like having the same configuration/action as the members described above are indicated by the same or like symbols or numerical references in the figure, and their description is simplified or omitted.

The imaging device is a device of converting optical information of an image into electric signals, where a plurality of photoelectric conversion devices are arranged in the same plane on a matrix and where light signals can be converted into electric signals in each photoelectric conversion device (pixel) and each pixel can sequentially output the electric signals to the outside of the imaging device. Therefore, the imaging device has one photoelectric conversion device and one or more transistors per one pixel.

FIG. 2 is a cross-sectional schematic view roughly showing the configuration of the imaging device for explaining one embodiment of the present invention. This imaging device is used by mounting it. for example, in an imaging apparatus such as digital camera and digital video camera, an electronic endoscope, or an imaging module such as cellular phone.

The imaging device has a plurality of photoelectric conversion devices in such a configuration as shown in FIGS. 1A and 1B and a circuit board having formed thereon a read-out circuit for reading out signals according to electric charges generated in the photoelectric conversion film of each photoelectric conversion device, wherein the plurality of photoelectric conversion devices are one-dimensionally or two-dimensionally arrayed on the same plane above the circuit board.

The imaging device 100 shown in FIG. 2 comprises a substrate 101, an insulating layer 102, a connection electrode 103, a pixel electrode (lower electrode) 104, a connection part 105, a connection part 106, a photoelectric conversion film 107, an opposite electrode (upper electrode) 108, a buffer layer 109, a passivation layer 110, a color filter (CF) 111, a partition wall 112, a light-shielding layer 113, a protective layer 114, an opposite electrode voltage supply part 115, and a read-out circuit 116.

The pixel electrode 104 has the same function as the electrode 11 of the photoelectric conversion device 10a shown in FIGS. 1A and 1B, and the opposite electrode 108 has the same function as the electrode 15 of the photoelectric conversion device 10a shown in FIGS. 1A and 1B. The photoelectric conversion film 107 has the same configuration as the layer provided between the electrode 11 and the electrode 15 of the photoelectric conversion device 10a shown in FIGS. 1A and 1B.

The substrate 101 is a glass substrate or a semiconductor substrate such as Si. An insulating layer 102 is formed on the substrate 101, and a plurality of pixel electrodes 104 and a plurality of connection electrodes 103 are formed on the surface of the insulating layer 102.

The photoelectric conversion film 107 is a layer shared in common by all photoelectric conversion devices provided on the plurality of pixel electrodes 104 to cover them.

The opposite electrode 108 is one electrode provided on the photoelectric conversion film 107 and shared in common by all photoelectric conversion devices. The opposite electrode 108 is formed to extend even on the connection electrode 103 disposed outside of the photoelectric conversion film 107 and is electrically connected to the connection electrode 103.

The connection part 106 is buried in the insulating layer 102 and is, for example, a plug for electrically connecting the connection electrode 103 and the opposite electrode voltage supply part 115. The opposite electrode voltage supply part 115 is formed on the substrate 101 and applies a predetermined voltage to the opposite electrode 108 through the connection part 106 and the connection electrode 103. In the case where the voltage applied to the opposite electrode 108 is higher than the source voltage of the imaging device, the predetermined voltage is supplied by raising the source voltage through a voltage raising circuit such as charge pump.

The read-out circuit 116 is provided on the substrate 101 to correspond to each of the plurality of pixel electrodes 104 and read out signals according to electric charges trapped by the corresponding pixel electrode 104. The read-out circuit 116 is composed of, for example, CCD, CMOS circuit or TFT circuit and light-shielded by a light-shielding layer (not shown) disposed in the insulating layer 102. The read-out circuit 116 is electrically connected to the corresponding pixel electrode 104 through the connection part 105.

The buffer layer 109 is formed on the opposite electrode 108 to cover the opposite electrode 108. The passivation layer 110 is formed on the buffer layer 109 to cover the buffer layer 109. The color filter 111 is formed at the position facing each pixel electrode 104 on the passivation layer 110. The partition wall 112 is provided between color filters 111 for enhancing the light transmission efficiency of the color filter 111.

The light-shielding layer 113 is formed on the passivation layer 110 in the area other than the region where the color filter 111 and the partition wall 112 are provided, and prevents light from entering the photoelectric conversion film 107 formed in the area other than the effective pixel region. The protective layer 114 is formed on the color filter 111, the partition wall 112 and the light-shielding layer 113 and protects the entire imaging device 100.

In the thus-configured imaging device 100, upon incidence of light, the light enters the photoelectric conversion film 107, and electric charges are generated there. Out of electric charges generated, holes are trapped by the pixel electrode 104, and voltage signals according to the amount of holes trapped are output by the read-out circuit 116 to the outside of the imaging device 100.

The production method of the imaging device 100 is as follows.

Connection parts 105 and 106, a plurality of connection electrodes 103, a plurality of pixel electrodes 104, and an insulating layer 102 are formed on a circuit board where an opposite electrode voltage supply part 115 and a read-out circuit 116 are formed. The plurality of pixel electrodes 104 are disposed, for example, in a square grid pattern on the insulating layer 102.

Subsequently, a photoelectric conversion film 107 is formed on the plurality of pixel electrode 104, for example, by vacuum heating deposition. Then, an opposite electrode 108 is formed on the photoelectric conversion film 107, for example, by sputtering in vacuum, and a buffer layer 109 and a passivation layer 110 are sequentially formed on the opposite electrode 108, for example, by vacuum heating deposition. Furthermore, a color filter 111, a partition wall 112 and a light-shielding layer 113 are formed, and a protective layer 114 is then formed, whereby an imaging device 100 is completed.

Also in the production method of the imaging device 100, even when a step of placing the imaging device 100 in a non-vacuum atmosphere on the way to fabrication is added between the step of forming a photoelectric conversion layer contained in the photoelectric conversion film 107 and the step of forming the passivation layer 110, the plurality of photoelectric conversion devices can be prevented from performance deterioration. Thanks to the addition of this step, the production cost can be reduced while preventing performance deterioration of the imaging device 100.

The passivation layer 110 as a constituent element of the above-described imaging device 100 is described in detail below.

Passivation Layer

The passivation layer 110 is required to satisfy the following conditions:

first, must block the intrusion of a factor that is contained in the solution, plasma and the like in each device production step and deteriorates an organic photoelectric conversion material, so as to protect the photoelectric conversion layer, secondly, must block the intrusion of a factor that deteriorates the organic photoelectric conversion material, such as water molecule, after the device production, so as to prevent deterioration of the photoelectric conversion film 107 over long-term storage/use, thirdly, must keep the already formed photoelectric conversion layer from deterioration when forming the passivation layer 110, and fourth, since incident light reaches the photoelectric conversion film 107 through the passivation layer 110, the passivation layer 110 must be transparent to light at the wavelength that is detected by the photoelectric conversion film 107.

The passivation layer 110 may have a thin-film configuration composed of a single material, but by having a multilayer configuration and imparting different functions to respective layers, an effect of, for example, relieving the stress of the entire passivation layer 110, suppressing the formation of a defect such as crack and pinhole due to dust generation or like in the production process, or facilitating the optimization of material development can be expected. For example, the passivation layer 110 can be formed in a two-layer configuration where a layer fulfilling its original purpose of preventing penetration of a deterioration factor such as water molecule is formed and a "passivation auxiliary layer" imparted with a function that is hard to achieve by the layer above is stacked thereon. A configuration composed of three or more layers may also be formed, but in view of the production cost, the number of layers is preferably smaller.

[Formation of Passivation Layer 110 by Atomic Layer Deposition Method (ALD Method)]

The performance of the photoelectric conversion material is significantly deteriorated due to the presence of a deterioration factor such as water molecule. Accordingly, the entire photoelectric conversion film needs to be encapsulated by covering it, for example, with a ceramic such as water molecule-impermeable dense metal oxide, metal nitride or metal nitride oxide or a diamond-like carbon (DLC). Conventionally, aluminum oxide, silicon oxide, silicon nitride, silicon nitride oxide, a stacked configuration thereof, or a stacked configuration of such a ceramic and an organic polymer is formed as a passivation layer by various vacuum deposition techniques. In the case of such a conventional passivation layer, a thin film can hardly grow in a bump that is formed due to a structured material on the substrate surface, a micro defect on the substrate surface, a particle adhering to the substrate surface, or the like (because the bump forms a shadow), and the film thickness becomes significantly thin as compared with the flat part. Therefore, the bump portion works out to a penetration route of a deterioration factor. In order to completely cover the bump with a passivation layer, the entire passivation layer is preferably made thick by forming it to have a film thickness of 1 µm or more in the flat part.

In an imaging device 100 having a pixel dimension of less than 2 µm, particularly about 1 µm, when the distance between the color filter 111 and the photoelectric conversion layer, that this, the film thickness of the passivation layer 110, is large, the incident light is diffracted/diffused within the passivation layer 110 to cause color mixing. To avoid this, the imaging device 100 having a pixel dimension of about 1 µm is preferably fabricated using a passivation layer material/a production method capable of causing no deterioration of the device performance even when the film thickness of the entire passivation layer 110 is decreased.

The atomic layer deposition (ALD) method is a kind of CVD method, and this is a technique of forming a thin film by alternately repeating the adsorption/reaction of an organic metal compound molecule, a metal halide molecule and a metal hydride molecule as thin film materials to the substrate surface and the decomposition of an unreacted group contained therein. The thin film material on reaching the substrate surface is in the state of the above-described low molecule and when a very small space allowing intrusion of a low molecule is present, a thin film can be grown. Therefore, a bump portion that is difficult to cover by the conventional thin film formation method can be completely covered (the thickness of the thin film grown in the bump portion is the same as the thickness of a thin film grown in the flat portion), that is, the bump covering property is very excellent. A bump formed due to a structured material on the substrate surface, a micro defect on the substrate surface, a particle adhering to the substrate surface, or the like can be completely covered and therefore, such a bump portion does not provide a penetration route to a deterioration factor for the photoelectric conversion material. When the passivation layer 110 is formed by the atomic layer deposition method, the required film thickness of the passivation layer can be more effectively reduced than in conventional techniques.

In the case of forming the passivation layer 110 by the atomic layer deposition method, a material corresponding to the above-described ceramic preferred for the passivation layer 110 can be appropriately selected. However, the material is limited to a material capable of undergoing thin film growth at a relatively low temperature, because the photoelectric conversion film of the present invention uses a photoelectric conversion material. According to the atomic layer deposition method using an alkyl aluminum or an aluminum halide as the material, a dense aluminum oxide thin film can be formed at a temperature of less than 200° C. at which the photoelectric conversion material is not deteriorated. In particular, when trimethyl aluminum is used, an aluminum oxide thin film can be advantageously formed even at about 100° C. Also in the case of silicon oxide or titanium oxide, similarly to the aluminum oxide, a dense thin film can be advantageously formed at less than 200° C. by appropriately selecting the material.

The organic photoelectric conversion device and the imaging device of the present invention each preferably contains a getter material so as to reduce the effect of moisture and/or oxygen. The getter material may be present in the passivation layer. The getter material may be any material as long as it can absorb moisture and/or oxygen. Examples of the material include, as a substance capable of absorbing moisture, an alkali metal, an alkaline earth metal, an oxide of alkaline earth metal, a hydroxide of alkali metal or alkaline earth metal, silica gel, a zeolite-based compound, a sulfate such as magnesium sulfate, sodium sulfate and nickel sulfate, an aluminum metal complex, and an organic metal compound such as aluminum oxide octylate. Specifically, examples of the alkaline earth metal include Ca, Sr and Ba; examples of the oxide of alkaline earth metal include CaO, SrO and BaO; and other examples include Zr—Al—BaO and an aluminum metal complex. Examples of the substance capable of absorbing oxygen include activated carbon, silica gel, activated alumina, molecular sieve, magnesium oxide and iron oxide and further include Fe, Mn, Zn, Ti and an inorganic salt such as sulfate, chloride salt and nitrate of such a metal.

[Substituent W]

The substituent W is described below.

The substituent W includes a halogen atom, an alkyl group (including a cycloalkyl group, a bicycloalkyl group and a tricycloalkyl group), an alkenyl group (including a cycloalkenyl group and a bicycloalkenyl group), an alkynyl group, an aryl group, a heterocyclic group (may also be called a hetero-ring group), a cyano group, a hydroxy group, a nitro group, a carboxy group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group (—B(OH)$_2$), a phosphato group (—OPO(OH)$_2$), a sulfato group (—OSO$_3$H) and other known substituents.

More preferably, W represents, for example, the following (1) to (17):
(1) a halogen atom,
such as fluorine atom, chlorine atom, bromine atom and iodine atom;
(2) an alkyl group,
a linear, branched or cyclic alkyl group:
(2-a) an alkyl group,
preferably an alkyl group having a carbon number of 1 to 30 (e.g., methyl, ethyl, n-propyl, isopropyl, tert-butyl, n-octyl, eicosyl, 2-chloroethyl, 2-cyanoethyl, 2-ethylhexyl), and
(2-b) a cycloalkyl group,
preferably a substituted or unsubstituted cycloalkyl group having a carbon number of 3 to 30 (e.g., cyclohexyl, cyclopentyl, 4-n-dodecylcyclohexyl);
(3) an alkenyl group,
a linear, branched or cyclic alkenyl group having a carbon number of 2 to 30 (e.g., vinyl, allyl, styryl);
(4) an alkynyl group,
preferably an alkynyl group having a carbon number of 2 to 30 (e.g., ethynyl, propargyl, trimethylsilylethynyl);
(5) an aryl group,
preferably an aryl group having a carbon number of 6 to 30 (e.g., phenyl, p-tolyl, naphthyl, m-chlorophenyl, o-hexadecanoylaminophenyl, ferrocenyl);
(6) a heterocyclic group,
preferably a monovalent group obtained by removing one hydrogen atom from a 5- or 6-membered aromatic or non-aromatic heterocyclic compound, more preferably a 5- or 6-membered aromatic heterocyclic group having a carbon number of 2 to 50 (e.g., 2-furyl, 2-thienyl, 2-pyrimidinyl, 2-benzothiazolyl; the heterocyclic group may also be a cationic heterocyclic group such as 1-methyl-2-pyridinio and 1-methyl-2-quinolinio);
(7) an alkoxy group,
preferably an alkoxy group having a carbon number of 1 to 30 (e.g., methoxy, ethoxy, isopropoxy, tert-butoxy, n-octyloxy, 2-methoxyethoxy);
(8) an aryloxy group,
preferably an aryloxy group having a carbon number of 6 to 30 (e.g., phenoxy, 2-methylphenoxy, 4-tert-butylphenoxy, 3-nitrophenoxy, 2-tetradecanoylaminophenoxy);
(9) an amino group,
preferably an amino group, an alkylamino group having a carbon number of 1 to 30, or an anilino group having a carbon number of 6 to 30, such as amino, methylamino, dimethylamino, anilino, N-methyl-anilino and diphenylamino;
(10) an alkylthio group,
preferably an alkylthio group having a carbon number of 1 to 30 (e.g., methylthio, ethylthio, n-hexadecylthio);
(11) an arylthio group,
preferably an arylthio group having a carbon number of 6 to 30 (e.g., phenylthio, p-chlorophenylthio, m-methoxyphenylthio);
(12) a heterocyclic thio group,
preferably a substituted or unsubstituted heterocyclic thio group having a carbon number of 2 to 30 (e.g., 2-benzothiazolylthio, 1-phenyltetrazol-5-ylthio);
(13) an alkyl- or aryl-sulfinyl group,
preferably a substituted or unsubstituted alkylsulfinyl group having a carbon number of 1 to 30, or a substituted or unsubstituted arylsulfinyl group having a carbon number of 6 to 30, such as methylsulfinyl, ethylsulfinyl, phenylsulfinyl and p-methylphenylsulfinyl;
(14) an alkyl- or aryl-sulfonyl group,
preferably an alkylsulfonyl group having a carbon number of 1 to 30, or an arylsulfonyl group having a carbon number of 6 to 30, such as methylsulfonyl, ethylsulfonyl, phenylsulfonyl and p-methylphenylsulfonyl;

(15) an acyl group, preferably a formyl group, an alkylcarbonyl group having a carbon number of 2 to 30, an arylcarbonyl group having a carbon number of 7 to 30, or a heterocyclic carbonyl group having a carbon number of 4 to 30 and being bonded to a carbonyl group through a carbon atom, such as acetyl, pivaloyl, 2-chloroacetyl, stearoyl, benzoyl, p-n-octyloxyphenylcarbonyl, 2-pyridylcarbonyl and 2-furylcarbonyl;

(16) a phosphino group, preferably a phosphino group having a carbon number of 2 to 30 (e.g., dimethylphosphino, diphenylphosphino, methylphenoxyphosphino); and

(17) a silyl group, preferably a silyl group having a carbon number of 3 to 30 (e.g., trimethylsilyl, triethylsilyl, triisopropylsilyl, tert-butyldimethylsilyl, phenyldimethylsilyl).

[Ring R]

The ring R includes an aromatic or non-aromatic hydrocarbon ring, a heterocyclic ring, and a polycyclic condensed ring formed by further combining these rings. Examples thereof include a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolidine ring, a quinoline ring, a phthalazine ring, a naphthylidine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiine ring, a phenothiazine ring and a phenazine ring.

EXAMPLES

Synthesis Example of Each Compound (Synthesis of Compound (a-2))

Under nitrogen, 2.6 g of 2,7-dibromo-9,9-dimethylfluorene, 4.0 g of tribenzazepine, 1.7 g of tert-butoxysodium, 60 ml of xylene and 0.25 g of Pd[P(t-Bu)$_3$]2 (bis(tri-tert-butylphosphine)palladium(0)) were heated at 95° C. for 4 hours. After cooling to room temperature, 300 ml of methanol was added, and the obtained crystal was filtered and washed with acetonitrile, water and isopropanol to obtain 5.0 g of Compound (a-2).

(Synthesis of Compound (a-6))

4.5 g of Compound (a-6) was obtained in the same manner as in Synthesis of Compound (a-2) except for replacing tribenzazepine with equimolar 9,10-diphenyl acridane (9,10-diphenyl acridane was synthesized by referred to *Chemische Berichte*, Vol. 37, paragraph 3202 (1904)).

(Synthesis of Compound (a-7))

3.3 g of Compound (a-7) was obtained in the same manner as in Synthesis of Compound (a-20) hereinafter described except for replacing tribenzazepine with equimolar carbazole.

(Synthesis of Compound (a-8))

3.7 g of Compound (a-8) was obtained in the same manner as in Synthesis of Compound (a-20) hereinafter described except for replacing tribenzazepine with equimolar 7H-dibenzo[a,g]carbazol (7H-dibenzo[a,g]carbazol was synthesized by referred to Journal of the Chemical Society, paragraph 1668 (1952)).

(Synthesis of Compound (a-11))

4.3 g of Compound (a-11) was obtained in the same manner as in Synthesis of Compound (a-2) except for replacing tribenzazepine with equimolar 3,6-diphenyl carbazole.

(Synthesis of Compound (a-20))

Under nitrogen, 0.46 g of tert-butoxysodium, 15 ml of xylene, 24 mg of palladium acetate and 0.11 g of tri(tert-butyl)phosphonium hexafluoroborate were heated with stirring at 65° C. for 20 minutes. Thereto, 1.0 g of 2-bromo-7-(7-bromo-9,9-dimethylfluoren-2-yl)-9,9-dimethylfluorene and 1.0 g of tribenzazepine were added, and the mixture was heated at 110° C. for 5 hours under nitrogen. After cooling to room temperature, 15 ml of methanol was added, and the obtained crystal was filtered and washed with acetonitrile, water, acetone and isopropanol to obtain 1.5 g of Compound (a-20) (2-bromo-7-(7-bromo-9,9-dimethylfluoren-2-yl)-9,9-dimethylfluorene was synthesized by referring to *Macromolecules*, Vol. 35, page 3474 (2002)).

(Synthesis of Compound (a-21))

2,7-Bis(9,9-dimethylfluoren-2-yl)-9,9-dimethylfluorene was synthesized by referring to *Journal of the American Chemical Society*, Vol. 125, paragraph 7796 (2003). Subsequently, 2 g of this compound, 1.35 g of N-bromosuccinimide and 50 ml of propylene carbonate were heated at 70° C. for 6 hours under nitrogen. After cooling to room temperature, the obtained crystal was filtered and recrystallized from chloroform to obtain 1.7 g of 2,7-bis(7-bromo-9,9-dimethylfluoren-2-yl)-9,9-dimethylfluorene. 1.3 Gram of Compound (a-21) was obtained by replacing 2-bromo-7-(7-bromo-9,9-dimethylfluoren-2-yl)-9,9-dimethylfluorene with equimolar 2,7-bis(7-bromo-9,9-dimethylfluorene-2-yl)-9,9-dimethylfluorene in Synthesis of Compound (a-20).

(Synthesis of Compound (b-2))

A waxy material obtained by replacing tribenzazepine with equimolar bis(9,10-dimethylfluoren-2-yl)amine in Synthesis of Compound (a-20) was purified by column chromatography (using silica gel, toluene and hexane) to obtain 0.5 g of Compound (b-2).

(Synthesis of Compound (b-5))

0.8 g of Compound (b-5) was obtained in the same manner as in Synthesis of Compound (a-2) except for replacing tribenzazepine with equimolar 2,2'-dinaphthylamine.

(Synthesis of Compound (b-7))

Under nitrogen, 0.8 g of 2,7-dibromo-9,9-dimethylfluorene, 2.0 g of bis(9,10-dimethylfluoren-2-yl)amine, 0.54 g of tert-butoxysodium, 25 ml of xylene and 0.12 g of Pd[P(t-Bu)$_3$]2 were heated at 95° C. for 4 hours. After cooling to room temperature, 100 ml of acetonitrile was added, and the obtained a waxy material was purified by column chromatography 'using silica gel, toluene and hexane) to obtain 1.3 g of Compound (b-7).

The obtained synthetic compounds were, if desired, purified by sublimation or distillation by using TRS-160 manufactured by ULVAC-RIKO, Inc. At this time, the degree of vacuum was set to 0.07 Pa.

Structural formulae of the compounds obtained in Synthesis Examples above are shown below.

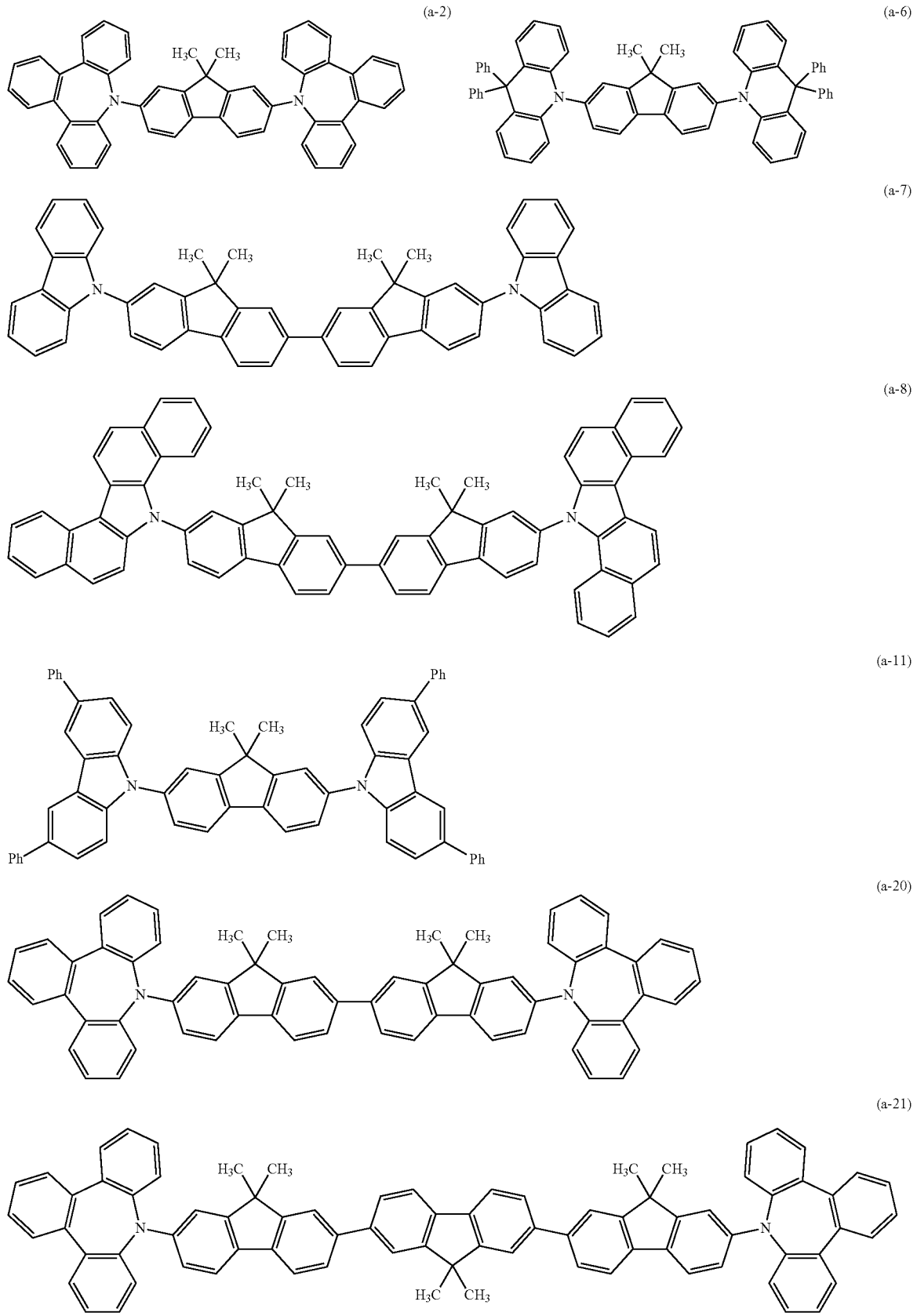

(b-2)

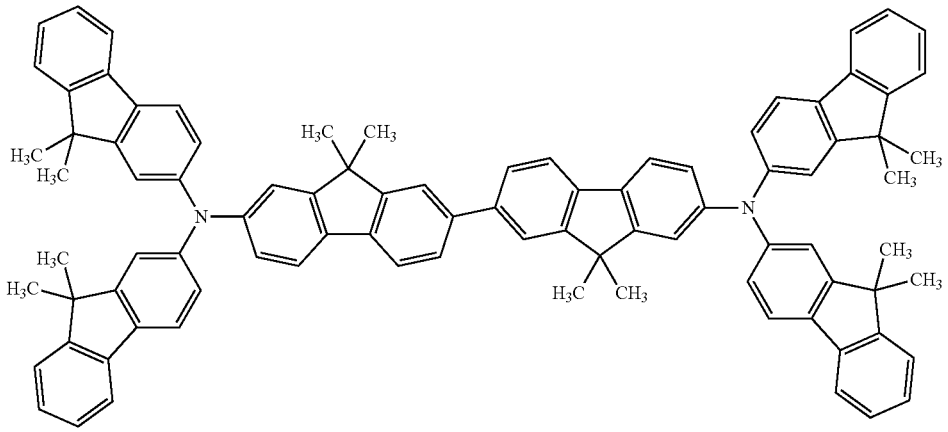

(b-5)

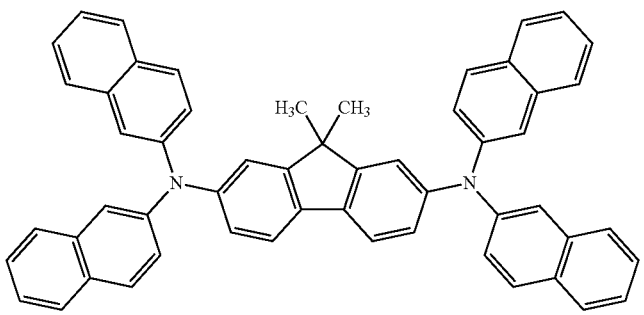

(b-7)

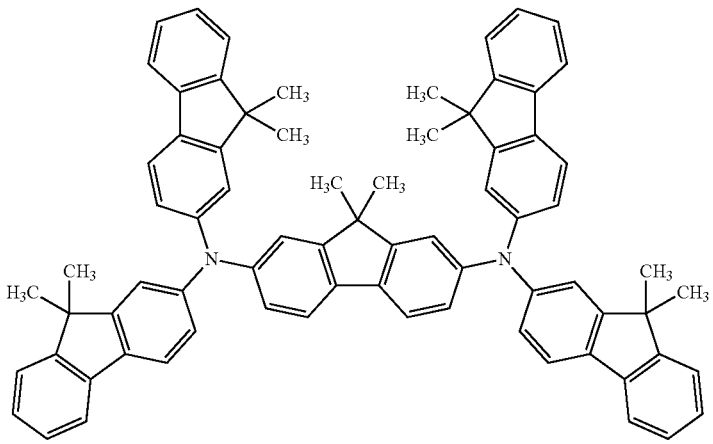

Example 1

A photoelectric conversion device of the embodiment shown in FIG. 1A was fabricated. That is, amorphous ITO was deposited on a glass substrate by sputtering to a thickness of 30 nm, thereby forming a lower electrode, and Compound (a-2) was deposited thereon by using a mask by vacuum heating deposition to a thickness of 100 nm to form an electron blocking layer. Thereafter, a layer formed by co-depositing Compound (1) and fullerene ($C_{60}$) to a thickness of 100 nm and 300 nm by using a mask, respectively, in terms of a single layer was deposited thereon by vacuum heating deposition in a state of the substrate temperature being controlled to 25° C. to form a photoelectric conversion layer. Here, the vacuum deposition of the photoelectric conversion layer was performed at a vacuum degree of $4 \times 10^{-4}$ Pa or less.

Furthermore, amorphous ITO was deposited thereon as an upper electrode by sputtering to a thickness of 10 nm by using a mask to form a transparent electrode. In this way, a photoelectric conversion device was fabricated.

Compound (1), Compound (28) and Compound (70) are shown below. Compounds (1) and (28) can be synthesized by referring to JP-A-2000-297068, and Compound (70) can be synthesized by referring to JP-A-2001-081451.

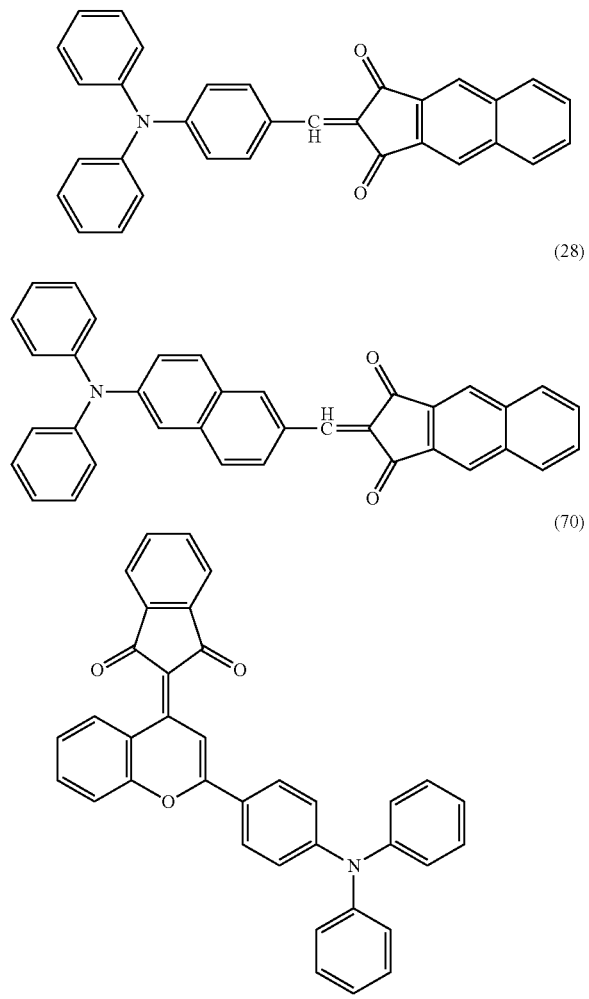

Example 2

A photoelectric conversion device was fabricated in the same manner except that in Example 1, the film thickness of Compound (1) was changed to 30 nm.

Examples 3 to 13 and Comparative Examples 1 to 3

Photoelectric conversion devices were fabricated in the same manner as in Example 1 except that Compound (a-2) used for the photoelectric conversion layer and the electron blocking layer were changed as shown in Table 1.

[Evaluation]

With respect to the devices obtained, whether each device functions as a photoelectric conversion device was confirmed. A voltage of 12 V was applied by using the electrode 11 in FIG. 1A as the cathode and the electrode 15 as the anode in each device obtained, and the value of dark current flowing when light was not irradiated and the value of photocurrent flowing when light was irradiated were measured using a constant-energy quantum efficiency measuring apparatus (using Keithley 6430 for the source meter) manufactured by OPTEL. The external quantum efficiency at a wavelength of 550 nm was determined from these values. The signal current value obtained by subtracting the dark current value from the photocurrent value was converted into an electron number, and the electron number was divided by the photon number per unit time of irradiation light, whereby the external quantum efficiency was calculated. The quantity of light irradiated was 50 $\mu W/cm^2$. In all devices, the dark current was 10 $nA/cm^2$ or less and the external quantum efficiency was as high as 50 to 70%, revealing that the device functions as a photoelectric conversion device.

The dark current value (relative value) of each of the devices obtained and the increment rate of the dark current measured after holding each device in an environment of 180° C. for 30 minutes and returning it to room temperature, based on the dark current before heating, are shown in Table 1. Incidentally, the Ip of each material was determined by depositing each material as a single layer film and measuring it by means of AC-2 manufactured by Riken Keiki Co., Ltd., and the Ea was determined by subtracting the energy corresponding to the energy gap from the Ip. Here, an energy-equivalent value of the wavelength at the long-wave end of spectral absorption spectrum of the single layer film above was used as the energy corresponding to the energy gap.

Moreover, external quantum efficiency after heating was measured, and the results were shown in Table 1. The thing which is in a range of 50% to 70% which is a value before heating was evaluated as "A", and the thing which is in a range of less than 50% was evaluated as "B"

Compounds used in Comparative Examples are shown below.

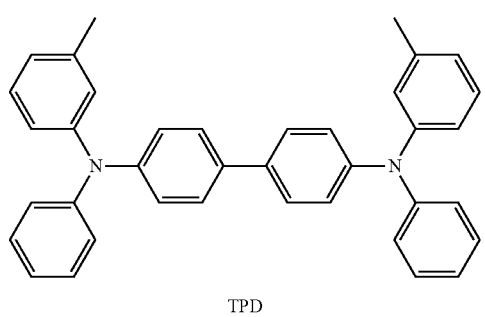

TPD

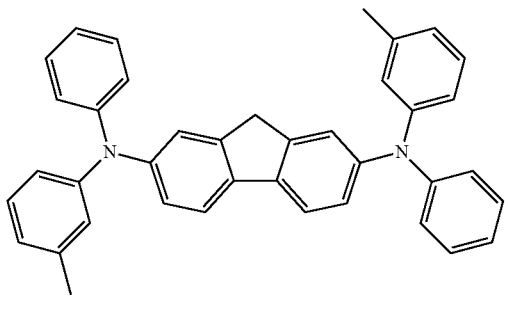

TPF

-continued

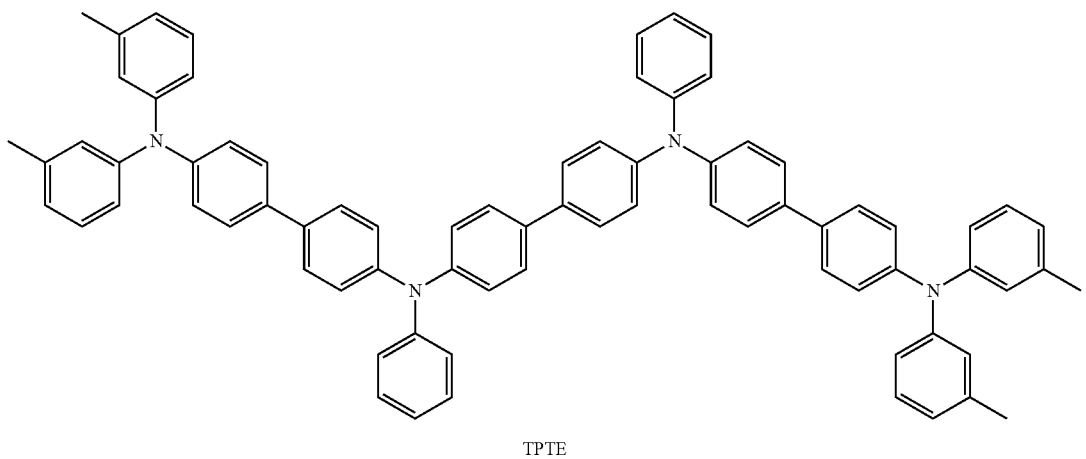

TPTE

TABLE 1

| | Photoelectric Conversion Material | Electron Blocking Material Compound Species | Dark Current (relative value) | Increment of Dark Current after Heating (times) | Evaluation result of external quantum efficiency after heating |
|---|---|---|---|---|---|
| Example 1 | $C_{60}$/compound (1) | a-2 | 20 | 1 | A |
| Example 2 | $C_{60}$/compound (1) | a-2 | 30 | 2 | A |
| Example 3 | $C_{60}$/compound (1) | a-6 | 2 | 15 | A |
| Example 4 | $C_{60}$/compound (1) | a-7 | 10 | 0.3 | A |
| Example 5 | $C_{60}$/compound (1) | a-8 | 5 | 0.4 | A |
| Example 6 | $C_{60}$/compound (1) | a-11 | 7 | 6 | A |
| Example 7 | $C_{60}$/compound (1) | a-20 | 15 | 0.4 | A |
| Example 8 | $C_{60}$/compound (1) | a-21 | 20 | 0.3 | A |
| Example 9 | $C_{60}$/compound (1) | b-2 | 25 | 0.2 | A |
| Example 10 | $C_{60}$/compound (1) | b-5 | 15 | 4 | A |
| Example 11 | $C_{60}$/compound (1) | b-7 | 15 | 2 | A |
| Example 12 | $C_{60}$/compound (28) | a-20 | 10 | 0.3 | A |
| Example 13 | $C_{60}$/compound (70) | a-20 | 40 | 5 | A |
| Comparative Example 1 | $C_{60}$/compound (1) | TPD | 10 | 10000 | B |
| Comparative Example 2 | $C_{60}$/compound (1) | TPF | 70 | 200 | B |
| Comparative Example 3 | $C_{60}$/compound (1) | TPTE | 20 | 400 | B |

It is seen that as compared with Comparative Examples 1 to 3, in Examples 1 to 13, the increment of dark current after heating is small and the heat resistance is high. In Comparative Examples 1 to 3, the increment of dark current after heating is from 200 to 10,000 times and is very large, but in Examples 1 to 13, the increment of dark current after heating is very small. In particular, in Examples 4, 5, 7-9 and 12, the increment of dark current after heating is less than 1, that is, further reduction in the dark current is rather achieved by the heating, and the compound of the present invention is verified to have a remarkable effect of suppressing the dark current. At the same time, the deterioration of external quantum efficiency due to heating is suppressed, revealing that the device using the material of the present invention is excellent in the heat resistance.

Furthermore, the same imaging device as the embodiment shown in FIG. 2 was fabricated. That is, amorphous ITO was deposited on a substrate by sputtering to a thickness of 30 nm and patterned by photolithography so that one pixel could be present for each photodiode (PD) on the substrate, thereby forming a lower electrode. Deposition of the electron blocking material and subsequent operations were performed in the same manner as in Examples 1 to 13 and Comparative Examples 1 to 3 to fabricate imaging devices. Evaluations thereof were also performed in the same manner, and the same results as in Table 1 were obtained. It is verified that even in an imaging device, the device based on Examples of the present invention exhibits low increment of dark current after heating and high heat resistance.

The entire disclosure of Japanese Patent Application No. 2009-211138 filed on Sep. 11, 2009, and Japanese Patent Application No. 2010-084412 filed on Mar. 31, 2010, from which the benefit of foreign priority has been claimed in the present application, and the entire disclosure of Japanese Patent Application No. 2010-200509 filed on Sep. 8, 2010 are incorporated herein by reference, as if fully set forth.

What is claimed is:

1. A compound represented by the following formula (F-10):

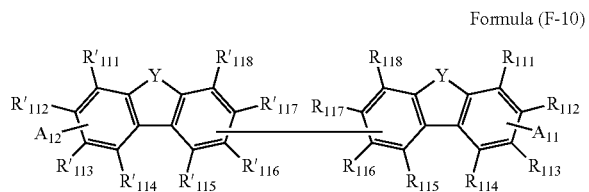

Formula (F-10)

wherein each of $R_{111}$ to $R_{118}$, $R'_{111}$ to $R'_{118}$ independently represents a hydrogen atom, a halogen atom, an alkyl group, an aryl group, a heterocyclic group, a hydroxyl group, an amino group or a mercapto group, which may further have a substituent; any one of $R_{115}$ to $R_{118}$ is linked with any one of $R'_{115}$ to $R'_{118}$ to form a single bond; each of $A_{11}$ and $A_{12}$ independently represents a substituent represented by the following formula (A-1); $A_{11}$ is substituted as any one of $R_{111}$ to $R_{114}$, and $A_{12}$ is substituted as any one of $R'_{111}$ to $R'_{114}$; Y each independently represents a carbon atom, a nitrogen atom, an oxygen atom, a sulfur atom or a silicon atom, which may further have a substituent having a carbon number of 2 or less:

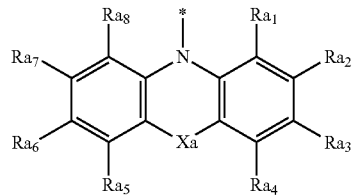

Formula (A-1)

wherein each of $Ra_1$ to $Ra_8$ independently represents a hydrogen atom, a halogen atom, an alkyl group, an aryl group or a heterocyclic group, which may further have a substituent; * represents the bonding position; and Xa represents a single bond, an oxygen atom, a sulfur atom, or an alkylene group, an alkenylene group, a cycloalkylene group, a cycloalkenylene group, an arylene group, a divalent heterocyclic group or an imino group, which may further have a substituent.

2. An electron blocking material comprising the compound according to claim 1.

3. A film comprising the compound according to claim 1, wherein the film has a thickness of 1 to 1,000 nm.

4. The compound according to claim 1, wherein $R_{112}$ and $R'_{112}$ in formula (F-10) are the same.

5. The compound according to claim 1, wherein $A_{11}$ and $A_{12}$ in formula (F-10) are the same.

6. The compound according to claim 1, wherein Xa in formula (A-1) represents a single bond.

7. The compound according to claim 1, wherein the compound represented by formula (F-10) has a molecular weight of 500 to 2000.

8. The compound according to claim 1, wherein the compound represented by formula (F-10) has an ionization potential of 5.8 eV or less.

* * * * *